(12) United States Patent
Yoshihara et al.

(10) Patent No.: US 9,728,443 B2
(45) Date of Patent: Aug. 8, 2017

(54) SUBSTRATE PROCESSING APPARATUS AND SUBSTRATE PROCESSING METHOD

(71) Applicant: SCREEN Holdings Co., Ltd., Kyoto (JP)

(72) Inventors: Naohiko Yoshihara, Kyoto (JP); Kenji Kobayashi, Kyoto (JP); Manabu Okutani, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/632,500

(22) Filed: Feb. 26, 2015

(65) Prior Publication Data

US 2015/0243542 A1    Aug. 27, 2015

(30) Foreign Application Priority Data

| Feb. 27, 2014 | (JP) | 2014-037293 |
| Mar. 26, 2014 | (JP) | 2014-063694 |
| Mar. 26, 2014 | (JP) | 2014-063695 |
| Mar. 26, 2014 | (JP) | 2014-063696 |

(51) Int. Cl.

| *B05C 13/02* | (2006.01) |
| *B05C 11/02* | (2006.01) |
| *B05C 11/00* | (2006.01) |
| *H01L 21/687* | (2006.01) |
| *H01L 21/67* | (2006.01) |
| *B05C 11/08* | (2006.01) |

(52) U.S. Cl.
CPC ........ *H01L 21/68764* (2013.01); *B05C 11/08* (2013.01); *H01L 21/6708* (2013.01); *H01L 21/67028* (2013.01); *H01L 21/67051* (2013.01); *H01L 21/68728* (2013.01); *H01L 21/68742* (2013.01)

(58) Field of Classification Search
CPC ...................................................... B05C 11/08
USPC ... 118/52, 612, 56, 58, 62, 63, 72, 500, 319, 118/320, 663, 666; 156/345.15, 345.16, 156/345.17; 134/105, 19, 902
See application file for complete search history.

(56) References Cited

U.S. PATENT DOCUMENTS

| 5,882,433 A | 3/1999 | Ueno .............................. 134/31 |
| 2006/0102289 A1* | 5/2006 | Fukatsu ............ H01L 21/67051 156/345.55 |
| 2007/0144563 A1* | 6/2007 | Araki .................. H01L 21/6708 134/84 |
| 2008/0006302 A1 | 1/2008 | Araki et al. .................... 134/26 |

(Continued)

FOREIGN PATENT DOCUMENTS

| CN | 101101858 A | 1/2008 |
| CN | 101738069 A | 6/2010 |

(Continued)

*Primary Examiner* — Yewebdar Tadesse
(74) *Attorney, Agent, or Firm* — Ostrolenk Faber LLP

(57) ABSTRACT

A substrate processing apparatus includes a substrate heating unit arranged to heat the underside of a substrate while supporting the substrate thereon and an attitude changing unit arranged to cause the substrate heating unit to undergo an attitude change between a horizontal attitude and a tilted attitude. In an organic solvent removing step to be performed following a substrate heating step of heating the substrate, the substrate heating unit undergoes an attitude change to the tilted attitude so that the upper surface of the substrate becomes tilted with respect to the horizontal surface.

30 Claims, 36 Drawing Sheets

(56) References Cited

U.S. PATENT DOCUMENTS

| | | |
|---|---|---|
| 2009/0220687 A1 | 9/2009 | Marks et al. .............. 427/207.1 |
| 2009/0235866 A1* | 9/2009 | Kataigi ............. C23C 16/45521 |
| | | 118/725 |
| 2011/0155177 A1 | 6/2011 | Tamura et al. ................. 134/18 |
| 2014/0127908 A1 | 5/2014 | Okutani ........................ 438/694 |

FOREIGN PATENT DOCUMENTS

| | | |
|---|---|---|
| JP | 9-038595 | 2/1997 |
| JP | 2010-056534 | 3/2010 |
| JP | 4488780 | 6/2010 |

\* cited by examiner

OPENING STATE

CHUCK CLOSED

CHUCK OPENED

CLOSED POSITION

OPEN POSITION

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method which process a substrate. Examples of the substrate to be processed include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of the Related Art

In semiconductor device manufacturing processes, the front surface of substrates such as semiconductor wafers is processed with processing liquid. Substrate processing apparatuses of a single substrate processing type, in which substrates are processed one by one, include a spin chuck arranged to rotate a substrate while holding the substrate thereon approximately horizontally and a nozzle arranged to supply processing liquid therethrough onto the front surface of the substrate rotated by the spin chuck.

In such substrate processing apparatuses of a single substrate processing type, chemical solution is supplied onto the substrate held on the spin chuck. Thereafter, rinse liquid is supplied onto the substrate. The chemical solution on the substrate is thus replaced with the rinse liquid. Thereafter, a spin drying step is performed to remove the rinse liquid on the substrate. In the spin drying step, the substrate undergoes a high-speed rotation so that the rinse liquid adhering to the substrate is spun off and removed (for drying).

In such a spin drying step, it may not be possible to sufficiently remove rinse liquid getting into a pattern formed on the substrate, which may result in poor drying. To resolve this problem, there has been proposed a technique in which organic solvent solution such as isopropyl alcohol (IPA) liquid is supplied onto the front surface of a substrate after rinse processing to replace rinse liquid getting into a pattern with the organic solvent solution and thereby to dry the front surface of the substrate, as described in Japanese Patent Application Publication No. 9-38595, for example.

In such a conventional spin drying step, two adjacent patterns may be attracted to each other to result in a pattern collapse. This is believed to be attributed in part to the surface tension of liquid existing between the two adjacent patterns. It is believed that since organic solvent such as IPA, if supplied onto the substrate before the spin drying step, having a lower surface tension, exists between the two adjacent patterns, the force attracting the patterns to each other is reduced and thus the patterns can be prevented from being collapsed.

Recently, however, fine and high-aspect-ratio patterns (convex patterns, linear patterns, etc.) are formed on the front surface of semiconductor substrates for higher integration. Such fine patterns are likely to be collapsed and, even if organic solvent may be supplied onto the substrate before the spin drying step, the fine patterns may not be sufficiently prevented from being collapsed.

SUMMARY OF THE INVENTION

The inventors have considered smoothly and completely removing a film of organic solvent solution from over the front surface of a substrate without spin drying (spin drying step). As a technique therefor, the inventors have considered tilting the upper surface of a substrate with respect to the horizontal surface while heating the substrate.

An object of the present invention is thus to tilt the upper surface of a substrate with respect to the horizontal surface while heating the substrate. Another object of the present invention is to smoothly and completely remove a film of processing liquid such as organic solvent from over a substrate.

A preferred embodiment of the present invention provides a substrate processing apparatus including a processing liquid supplying unit arranged to supply processing liquid onto the upper surface of a substrate to form a liquid film of the processing liquid, a substrate heating unit arranged to heat the substrate from below the substrate to heat the liquid film on the substrate, and an attitude changing unit arranged to cause the substrate and the substrate heating unit to undergo an attitude change between a horizontal attitude in which the upper surface of the substrate is the horizontal surface so that the liquid film of the processing liquid is held on the substrate and a tilted attitude in which the upper surface of the substrate is tilted with respect to the horizontal so that the liquid film of the processing liquid heated by the substrate heating unit is removed from the substrate, while keeping constant the relative attitude between the substrate and the substrate heating unit.

In accordance with the arrangement above, the substrate and the substrate heating unit undergo an attitude change between the horizontal attitude and the tilted attitude while the relative attitude between the substrate and the substrate heating unit arranged to heat the substrate is kept constant. This allows for tilting the upper surface of the substrate with respect to the horizontal surface while heating the substrate. As a result, the heated liquid film of the processing liquid can be removed smoothly from the substrate. Since the relative attitude between the substrate and the substrate heating unit is kept constant during the attitude change of the substrate and the substrate heating unit between the horizontal attitude and the tilted attitude, the state where the substrate heating unit heats the substrate can also be kept constant even if the substrate and the substrate heating unit undergo an attitude change.

The substrate heating unit may be in contact with the lower surface of the substrate to support the substrate thereon. The attitude changing unit may be arranged to cause the substrate heating unit supporting the substrate thereon to undergo an attitude change between the horizontal attitude and the tilted attitude.

In accordance with the arrangement above, the substrate heating unit is in contact with the underside of the substrate to support the substrate thereon while heating the underside of the substrate. An attitude change of the substrate heating unit from the horizontal attitude to the tilted attitude allows the upper surface of the substrate to be tilted with respect to the horizontal while the substrate is held successfully on the substrate heating unit. This allows for tilting the upper surface of the substrate with respect to the horizontal while heating the substrate with the substrate heating unit.

The attitude changing unit may include a support member having a horizontal support surface, multiple extensible units disposed on the support surface of the support member and provided in a manner extensible in a direction crossing the support surface to support peripheral portions of the substrate heating unit thereon, and an extension/contraction driving unit arranged to cause the multiple extensible units to undergo extension/contraction so that the multiple extensible means have different lengths.

In accordance with the arrangement above, the multiple extensible units support the peripheral portions of the substrate heating unit thereon. When the multiple extensible units have the same length, the substrate heating unit is kept in the horizontal attitude. When the multiple extensible units have different lengths, the substrate heating unit is kept at the tilted attitude. This allows the substrate heating unit to undergo an attitude change between the horizontal attitude and the tilted attitude with a simple structure.

The substrate processing apparatus may further include a sliding preventing member arranged to come into contact with a lower portion of a peripheral portion of the substrate tilted at the tilted attitude to prevent the substrate from sliding off the substrate heating unit.

A frictional force generated between the substrate heating unit and the lower surface of the substrate causes the substrate to be supported on the substrate heating unit. When the substrate and the substrate heating unit are in the horizontal attitude, the frictional force causes the substrate to stay at rest. On the other hand, the substrate, when at the tilted attitude, may slide on the substrate heating unit under its own weight.

In accordance with the arrangement above, when the substrate and the substrate heating unit are at the tilted attitude, the sliding preventing member comes into contact with the lower portion of the peripheral portion of the tilted substrate to thereby prevent the substrate from moving in a direction along the substrate heating unit and thus sliding off the substrate heating unit. It is therefore possible to keep both the substrate and the substrate heating unit at the tilted attitude while reliably preventing the substrate from sliding off the substrate heating unit.

The substrate holding unit may have a support pin arranged to come into contact with the peripheral portion of the substrate to support the substrate. The substrate holding unit may be arranged to receive the substrate on the substrate heating unit by the support pin and to put the substrate supported by the support pin on the substrate heating unit. The support pin may serve as the sliding preventing member.

In accordance with the arrangement above, the support pin of the substrate holding unit prevents the substrate from sliding off the substrate heating unit. This can lead to a reduction in the number of parts and cost compared to the case of providing the sliding preventing member separately from the support pin.

The substrate heating unit may include a substrate opposing surface opposed to the lower surface of the substrate and multiple embosses provided on the substrate opposing surface. The multiple embosses may be in contact with the lower surface of the substrate to support the substrate thereon with the lower surface of the substrate and the substrate opposing surface being spaced and opposed to each other.

In accordance with the arrangement above, the multiple embosses come into contact with the lower surface of the substrate, and thus the substrate is supported on the substrate heating unit in a manner spaced from the substrate opposing surface. In this state, a heat generated by the substrate heating unit is transmitted to the substrate from below the substrate through the substrate opposing surface.

Since the substrate is supported on the substrate heating unit in a manner spaced from the substrate opposing surface, it is possible to suppress or prevent the substrate from being attracted and sticking to the substrate opposing surface. In addition, even if contaminants may exist on the substrate opposing surface, it is possible to suppress or prevent the contaminants from being transferred to (the lower surface of) the substrate.

The multiple embosses may serve as the sliding preventing member.

The multiple embosses may be disposed in a manner distributed across the substrate opposing surface. In this case, since the substrate is supported by the multiple embosses disposed in a distributed manner on the substrate opposing surface, it is possible to keep the likelihood of heat transfer from the substrate opposing surface to the substrate uniform in the plane of the substrate and to suppress or prevent the substrate from bending.

The multiple embosses may be disposed only in a peripheral portion of the substrate opposing surface.

The attitude changing unit may be arranged to tilt the substrate heating unit from the horizontal attitude to the tilted attitude after a gaseous phase of the processing liquid is formed in a space over the upper surface of the substrate due to heating of the substrate by the substrate heating unit. This allows the liquid film of the processing liquid separated from the substrate as a gaseous phase of the processing liquid to be removed from the upper surface of the substrate directly as a liquid mass without being split.

Another preferred embodiment of the present invention provides a substrate processing method including a rinsing step of supplying rinse liquid onto the upper surface of a substrate held horizontally, an organic solvent replacing step of supplying organic solvent solution with a surface tension lower than that of the rinse liquid onto the upper surface of the substrate to replace the rinse liquid with the organic solvent and form a film of the organic solvent solution covering the upper surface of the substrate, a substrate heating step of, after the start of the organic solvent replacing step, heating the substrate from below the substrate with a substrate heating unit to cause the upper surface of the substrate to reach a first temperature higher than the boiling point of the organic solvent to thereby form a gaseous phase of the organic solvent across the upper surface between the film of the organic solvent solution covering the upper surface of the substrate and the upper surface of the substrate and raise the film of the organic solvent solution over the gaseous phase of the organic solvent, and an organic solvent removing step of causing the substrate and the substrate heating unit to undergo an attitude change to a tilted attitude in which the upper surface of the substrate is tilted with respect to the horizontal surface, while keeping constant the relative attitude between the substrate and the substrate heating unit, to remove the raised film of the organic solvent solution from over the upper surface of the substrate.

In accordance with the method above, organic solvent solution is supplied onto the upper surface of the substrate to form on the substrate a film of the organic solvent solution covering the upper surface of the substrate and thereby to replace the rinse liquid adhering to the upper surface of the substrate with the organic solvent solution. Since the film of the organic solvent solution covers the entire upper surface of the substrate, the rinse liquid can be replaced successfully across the upper surface of the substrate. After thus forming the film of the organic solvent solution, the upper surface of the substrate is caused to reach a first temperature. This causes a gaseous phase of the organic solvent to be formed across the upper surface of the substrate between the film of the organic solvent solution and the upper surface of the substrate and causes the film of the organic solvent solution to be raised over the gaseous phase of the organic solvent. In this state, a frictional force of approximately zero is generated between the upper surface of the substrate and the film of the organic solvent solution, and thus the film of the organic solvent solution is easily movable along the upper surface of the substrate.

In the organic solvent removing step, the substrate and the substrate heating unit are caused to undergo an attitude change to the tilted attitude so that the upper surface of the substrate is tilted with respect to the horizontal surface, while keeping constant the relative attitude between the substrate and the substrate heating unit. This causes the raised film of the organic solvent solution to move under its own weight toward the lowest portion of a peripheral portion of the tilted substrate along the upper surface of the substrate to be removed through the peripheral portion of the substrate. The film of the organic solvent solution moves while remaining in a liquid mass, that is, without being split into a number of small droplets, and thus can be removed smoothly and completely from over the substrate.

Accordingly, no droplet of the organic solvent remains on the upper surface of the substrate after the removal of the film of the organic solvent solution. That is, no organic solvent solution remains in gaps between fine patterns. It is therefore possible, even in the case of processing a substrate with fine patterns formed on the upper surface thereof, to dry the upper surface of the substrate successfully while suppressing or preventing the patterns from being collapsed.

Still another preferred embodiment of the present invention provides a substrate processing apparatus including a substrate holding unit arranged to hold a substrate horizontally, a processing liquid supplying unit arranged to supply processing liquid onto the upper surface of the substrate held on the substrate holding unit to form a liquid film of the processing liquid covering the entire upper surface of the substrate, a substrate heating unit arranged to heat the substrate held on the substrate holding unit at a temperature equal to or higher than the boiling point of the processing liquid, with the entire upper surface of the substrate being covered with the liquid film of the processing liquid, to vaporize the processing liquid and form a gaseous phase between the liquid film of the processing liquid and the upper surface of the substrate, and a guiding member including an outward guiding surface arranged to come into contact with a peripheral portion of the liquid film of the processing liquid on the substrate held on the substrate holding unit with the gaseous phase existing between the liquid film of the processing liquid and the upper surface of the substrate, the guiding member arranged to guide the processing liquid from the upper surface of the substrate to around the substrate through contact between the outward guiding surface and the liquid film of the processing liquid. If a pattern is formed on the upper surface of the substrate, the upper surface of the substrate includes the upper surface of the base material (silicon, for example) and the surface of the pattern.

In accordance with the arrangement above, processing liquid is supplied onto the upper surface of the substrate that is held horizontally and a liquid film of the processing liquid covering the entire upper surface of the substrate is formed. Thereafter, the substrate is heated at a temperature equal to or higher than the boiling point of the processing liquid, so that the substrate reaches a temperature equal to or higher than the boiling point of the processing liquid. This causes the processing liquid to be vaporized at the interface with the upper surface of the substrate and a gaseous phase to be formed between the liquid film of the processing liquid and the upper surface of the substrate. In this case, since the liquid film of the processing liquid is raised over the upper surface of the substrate, only a small frictional resistance, which may be considered zero, acts on the liquid film of the processing liquid on the substrate. Accordingly, the liquid film of the processing liquid is easily slidable along the upper surface of the substrate.

The outward guiding surface of the guiding member comes into contact with the peripheral portion of the liquid film of the processing liquid on the substrate with the gaseous phase existing between the liquid film of the processing liquid and the upper surface of the substrate. The processing liquid in contact with the outward guiding surface is removed through the guiding member to around the substrate. With this contact between the guiding member and the liquid film, an outward flow toward the peripheral portion of the substrate is formed in the liquid film of the processing liquid, so that the liquid film of the processing liquid on the substrate is removed from the substrate directly as a mass without being split into a number of small droplets. This allows the liquid film of the processing liquid to be removed quickly from the substrate in a short time.

In a spin drying step of causing a substrate to undergo a high-speed rotation for drying, a liquid surface (gas-liquid interface) is formed across two adjacent structures. A surface tension that may destroy a pattern acts at the position of contact between the liquid surface and the pattern (gas-liquid-solid interface). On the other hand, in the present invention, since the substrate has a temperature equal to or higher than the boiling point of the processing liquid, even if the processing liquid may come into contact with the upper surface of the substrate, the liquid is vaporized immediately. For this reason, a liquid surface such as in the spin drying step is not formed, so that surface tension does not act on and destroys the pattern. It is therefore possible to reduce the occurrence of pattern collapse.

Further, vaporization of liquid film on a substrate may cause defects such as watermarks and/or particles. On the other hand, in the present invention, the liquid film is moved and removed with respect to the substrate. It is therefore possible to reduce the occurrence of watermarks and/or particles. In particular, since the gaseous phase exists between the liquid film of the processing liquid and the upper surface of the substrate and the liquid film of the processing liquid is easily slidable along the upper surface of the substrate, the liquid film can be removed quickly in a short time. This allows the time for which the upper surface of the substrate is exposed partially to the air to be reduced and thereby the substrate may be processed more uniformly.

The guiding member may include multiple outward guiding surfaces arranged in an equally spaced manner in the circumferential direction of the substrate.

When the outward guiding surface comes into contact with the liquid film of the processing liquid on the substrate, a force guiding outward the processing liquid on the substrate acts on the liquid film of the processing liquid on the substrate. The multiple outward guiding surfaces, which are thus arranged in an equally spaced manner in the circumferential direction of the substrate, come into contact with the liquid film of the processing liquid on the substrate at multiple positions separated in an equally spaced manner in the circumferential direction of the substrate. Thus, the liquid film of the processing liquid on the substrate is guided uniformly outward by the multiple outward guiding surfaces. It is therefore possible to uniformly remove the liquid film of the processing liquid from the substrate.

The outward guiding surface may be annular or arc-shape extending along a peripheral portion of the substrate.

In accordance with the arrangement above, since the outward guiding surface extends along the peripheral portion of the substrate, the area of contact between the outward guiding surface and the liquid film can be increased. It is thus possible to increase the force guiding outward the processing liquid on the substrate.

The outward guiding surface may be annular continuing over the entire circumference of the substrate.

In accordance with the arrangement above, since the outward guiding surface continues over the entire circumference of the substrate, the area of contact between the outward guiding surface and the liquid film can be further increased. It is thus possible to further increase the force guiding outward the processing liquid on the substrate. Further, since the annular outward guiding surface comes into contact with the entire circumference of the peripheral portion of the liquid film, the liquid film of the processing liquid on the substrate is guided uniformly outward by the annular outward guiding surface. It is therefore possible to uniformly remove the liquid film of the processing liquid from the substrate.

The substrate processing apparatus may further include an opposing member having an opposing surface opposed to the upper surface of the substrate held on the substrate holding unit. The guiding member may protrude downward from the opposing surface. If the substrate has a disk shape, the opposing surface preferably has an outer diameter greater than that of the substrate. Also, the opposing surface is preferably in parallel with the upper surface of the substrate.

In accordance with the arrangement above, the upper surface of the substrate is covered with the opposing surface of the opposing member. In this state, the liquid film of the processing liquid on the substrate is guided outward by the guiding member. It is therefore possible to remove the liquid film of the processing liquid from the substrate while protecting the exposed portion of the upper surface of the substrate with the opposing member.

The substrate holding unit may include a movable pin including a movable gripping portion to be pressed against a peripheral portion of the substrate and a chuck opening/closing unit arranged to move the movable pin between a closed position at which the movable gripping portion is pressed against the peripheral portion of the substrate and an open position at which the movable gripping portion is set away from the peripheral portion of the substrate. The substrate processing apparatus may further include a controller arranged to control the chuck opening/closing unit and the substrate heating unit such that a gaseous phase is formed between the liquid film of the processing liquid and the upper surface of the substrate with the movable pin being at the open position.

In accordance with the arrangement above, a gaseous phase is formed between the liquid film of the processing liquid and the upper surface of the substrate with the movable gripping portion being set away from the peripheral portion of the substrate. The liquid film of the processing liquid raised over the upper surface of the substrate is easily slidable along the upper surface of the substrate. Since the movable gripping portion is set away from the peripheral portion of the substrate when the liquid film of the processing liquid is raised, it is possible to prevent the liquid film of the processing liquid from being removed unintentionally from the substrate through contact with the movable gripping portion.

The substrate holding unit may include a movable pin including a movable gripping portion to be pressed against a peripheral portion of the substrate and a chuck opening/closing unit arranged to move the movable pin. The guiding member may be provided on the movable pin. The chuck opening/closing unit may be arranged to move the movable pin between a closed position at which the movable gripping portion is pressed against the peripheral portion of the substrate and the outward guiding surface is set away from the liquid film of the processing liquid on the substrate and an open position at which the movable gripping portion is set away from the peripheral portion of the substrate and the outward guiding surface is in contact with the liquid film of the processing liquid on the substrate.

In accordance with the arrangement above, the movable gripping portion and the outward guiding surface are provided on the movable pin. The movable gripping portion and the outward guiding surface are disposed at different positions of the movable pin. It is therefore possible to selectively use the movable gripping portion and the outward guiding surface by changing the position of the movable pin. Further, since the movable gripping portion and the outward guiding surface are provided on the common member, it is possible to reduce the number of parts. In addition, it is possible to commonalize the unit to move the movable gripping portion and the unit to move the outward guiding surface.

The substrate holding unit may include a movable pin including a movable gripping portion to be pressed against a peripheral portion of the substrate and a chuck opening/closing unit arranged to move the movable pin. The outward guiding surface may be provided on the movable gripping portion. The chuck opening/closing unit may be arranged to move the movable pin between a closed position at which the movable gripping portion is pressed against the peripheral portion of the substrate and the outward guiding surface is in contact with the liquid film of the processing liquid on the substrate and an open position at which the movable gripping portion is set away from the peripheral portion of the substrate and the outward guiding surface is set away from the liquid film of the processing liquid on the substrate.

In accordance with the arrangement above, the outward guiding surface constitutes a portion of the movable gripping portion. When the movable pin is located at the closed position, the movable gripping portion is pressed against the peripheral portion of the substrate, and the outward guiding surface is in contact with the liquid film of the processing liquid on the substrate. There is thus no need to provide a guide position at which the outward guiding surface is in contact with the liquid film of the processing liquid on the substrate separately from the closed position. It is therefore possible to simplify the structure of the movable pin and the unit to move the movable pin (chuck opening/closing unit).

The substrate processing apparatus may further include a gas discharging unit arranged to discharge gas toward the upper surface of the substrate held on the substrate holding unit, with a gaseous phase being formed between the liquid film of the processing liquid and the upper surface of the substrate, to form a dried region from which the processing liquid is removed in a region of the upper surface of the substrate.

In accordance with the arrangement above, gas is blown to a blow position which is a region of the upper surface of the substrate, in state in which a gaseous phase of the processing liquid exists between the liquid film of the processing liquid and the upper surface of the substrate. Therefore, the processing liquid at the blow position is moved toward the periphery of the blow position by the gas. This causes a dried region to be formed at the blow position.

Further, since the processing liquid moves from the blow position to the periphery, an outward flow toward the peripheral portion of the substrate is formed in the liquid film of the processing liquid. It is therefore possible to remove the liquid film of the processing liquid quickly from the substrate in a short time by utilizing both the supply of gas and the guiding member.

The gas discharging unit may be arranged to form a flow of gas flowing toward the guiding member along the upper surface of the substrate held on the substrate holding unit.

In accordance with the arrangement above, gas is discharged toward the upper surface of the substrate. This causes the processing liquid in a portion of the upper surface of the substrate to be removed and a dried region to be formed on the upper surface of the substrate. As a result, a flow toward the guiding member is formed in the liquid film of the processing liquid. Further, since the gas flows toward the guiding member along the upper surface of the substrate, the flow of the processing liquid toward the guiding member is facilitated by the flow of gas flowing toward the guiding member along the upper surface of the substrate. It is therefore possible to remove the liquid film of the processing liquid on the substrate efficiently and thereby to reduce the time required for the removal of the liquid film.

The substrate processing apparatus may further include a liquid residue preventing unit arranged to discharge gas toward the guiding member.

In accordance with the arrangement above, liquid adhering to the guiding member is blown off by the gas discharged toward the guiding member. It is therefore possible to reduce the occurrence of particles caused by the liquid adhering to the guiding member.

The substrate heating unit may include multiple heaters arranged to heat the entire upper surface of the substrate held on the substrate holding unit. The substrate processing apparatus may further include a controller arranged to control the substrate heating unit. The controller may be arranged to perform a uniform heating step of uniformly heating the substrate held on the substrate holding unit at a temperature equal to or higher than the boiling point of the processing liquid, with the entire upper surface of the substrate being covered with the liquid film of the processing liquid, to vaporize the processing liquid and form a gaseous phase between the liquid film of the processing liquid and the upper surface of the substrate and a temperature difference generating step of, after the uniform heating step, forming a low-temperature region with a temperature equal to or higher than the boiling point of the processing liquid and a high-temperature region with a temperature higher than that of the low-temperature region in the upper surface of the substrate with a gaseous phase being formed between the liquid film of the processing liquid and the upper surface of the substrate.

In accordance with the arrangement above, the substrate is heated uniformly at a temperature equal to or higher than the boiling point of the processing liquid. This causes a gaseous phase to be formed between the liquid film of the processing liquid and the upper surface of the substrate. Thereafter, a high-temperature region and a low-temperature region having their respective different temperatures are formed in the upper surface of the substrate. This generates a temperature difference in the liquid film of the processing liquid, and a flow toward the lower temperature is formed in the liquid film of the processing liquid. It is therefore possible to remove the liquid film of the processing liquid quickly from the substrate in a short time by utilizing both the generation of temperature difference and the guiding member.

A further preferred embodiment of the present invention provides a substrate processing apparatus including a substrate holding unit arranged to hold the substrate horizontally, a processing liquid supplying unit arranged to supply processing liquid onto the upper surface of the substrate held on the substrate holding unit to form a liquid film of the processing liquid covering the entire upper surface of the substrate, a substrate heating unit arranged to heat the substrate held on the substrate holding unit at a temperature equal to or higher than the boiling point of the processing liquid, with the entire upper surface of the substrate being covered with the liquid film of the processing liquid, to vaporize the processing liquid and form a gaseous phase between the liquid film of the processing liquid and the upper surface of the substrate, and a gas discharging unit arranged to discharge gas toward the upper surface of the substrate held on the substrate holding unit, with the gaseous phase being formed between the liquid film of the processing liquid and the upper surface of the substrate, to form a dried region from which the processing liquid is removed in a region of the upper surface of the substrate. If a pattern is formed on the upper surface of the substrate, the upper surface of the substrate includes the upper surface of the base material (silicon, for example) and the surface of the pattern.

In accordance with the arrangement above, processing liquid is supplied onto the upper surface of the substrate that is held horizontally and a liquid film of the processing liquid covering the entire upper surface of the substrate is formed. Thereafter, the substrate is heated at a temperature equal to or higher than the boiling point of the processing liquid, so that the substrate reaches a temperature equal to or higher than the boiling point of the processing liquid. This causes the processing liquid to be vaporized at the interface with the upper surface of the substrate and a gaseous phase to be formed between the liquid film of the processing liquid and the upper surface of the substrate. In this case, since the liquid film of the processing liquid is raised over the upper surface of the substrate, only a small frictional resistance, which may be considered zero, acts on the liquid film of the processing liquid on the substrate. Accordingly, the liquid film of the processing liquid is easily slidable along the upper surface of the substrate.

The gas discharging unit discharges gas therethrough to a blow position, a region of the upper surface of the substrate, with a gaseous phase being formed between the liquid film of the processing liquid and the upper surface of the substrate. The processing liquid at the blow position is moved toward the periphery of the blow position by the gas. This makes a dried region at the blow position. Further, the processing liquid pushed by the gas moves from the blow position to the periphery and, with this supply of gas, an outward flow toward the peripheral portion of the substrate is formed in the liquid film of the processing liquid, so that the liquid film of the processing liquid on the substrate is removed from the substrate directly as a mass without being split into a number of small droplets. This allows the liquid film of the processing liquid to be removed quickly from the substrate in a short time.

In a spin drying step of causing a substrate to undergo a high-speed rotation for drying, a liquid surface (gas-liquid interface) is formed across two adjacent structures. A surface tension that may destroy a pattern acts at the position of contact between the liquid surface and the pattern (gasliquid-solid interface). On the other hand, in the present invention, since the substrate has a temperature equal to or higher than the boiling point of the processing liquid, even if the processing liquid may come into contact with the upper surface of the substrate, the liquid is vaporized immediately. For this reason, a liquid surface such as in the spin drying step is not formed, so that surface tension does no act on and destroys the pattern. It is therefore possible to reduce the occurrence of pattern collapse.

Further, vaporization of liquid film on a substrate may cause defects such as watermarks and/or particles. On the other hand, in the present invention, the liquid film is moved and removed with respect to the substrate. It is therefore possible to reduce the occurrence of watermarks and/or particles. In particular, since the gaseous phase exists between the liquid film of the processing liquid and the upper surface of the substrate and the liquid film of the processing liquid is easily slidable along the upper surface of the substrate, the liquid film can be removed quickly in a short time. This allows the time for which the upper surface of the substrate is exposed partially to the air to be reduced and thereby the substrate may be processed more uniformly.

The position to start supplying the gas from the gas discharging unit to the substrate may be in a central portion of the upper surface of the substrate.

In accordance with the arrangement above, gas is discharged toward the central portion of the upper surface of the substrate covered with the liquid film of the processing liquid. This causes the processing liquid to be removed from the central portion of the upper surface of the substrate and a hole is formed in the central portion of the liquid film. Further, the processing liquid moves from the central portion of the upper surface of the substrate to the periphery, so that a radial flow toward the peripheral portion of the liquid film is formed in the liquid film of the processing liquid. It is therefore possible to uniformly remove the liquid film of the processing liquid from the substrate.

The position to start supplying the gas from the gas discharging unit to the substrate may be in a peripheral portion of the upper surface of the substrate.

In accordance with the arrangement above, gas is discharged toward the peripheral portion of the upper surface of the substrate covered with the liquid film of the processing liquid. This causes the processing liquid to be removed from the peripheral portion of the upper surface of the substrate and a dried region is formed in the peripheral portion of the upper surface of the substrate. Further, the processing liquid moves from the peripheral portion of the upper surface of the substrate toward the central portion of the upper surface of the substrate, so that a flow toward the peripheral portion of the liquid film is formed in the liquid film of the processing liquid. It is therefore possible to remove the liquid film of the processing liquid quickly from the substrate in a short time.

The substrate processing apparatus may further include an attitude changing unit arranged to tilt the substrate held horizontally on the substrate holding unit while keeping constant the space between the substrate heating unit and the substrate. The gas discharging unit may be arranged to discharge the gas toward an upper end portion of the upper surface of the substrate tilted by the attitude changing unit with a gaseous phase being formed between the liquid film of the processing liquid and the upper surface of the substrate.

In accordance with the arrangement above, gas is discharged toward the upper end portion of the upper surface of the tilted substrate with a gaseous phase being formed between the liquid film of the processing liquid and the upper surface of the substrate. Since the substrate is thus tilted, the liquid film of the processing liquid on the substrate flows downward along the upper surface of the substrate. The downward flow of the processing liquid is further facilitated by the supply of gas. It is therefore possible to remove the liquid film of the processing liquid quickly from the substrate in a short time. In addition, since the gap between the substrate heating unit and the substrate in a direction perpendicular to the upper surface of the substrate is kept constant, uneven heating is less likely to occur compared to the case where only the substrate is tilted, whereby it is possible to continuously heat the substrate stably.

The gas discharged from the gas discharging unit may have a temperature equal to or higher than the boiling point of the processing liquid. The gas discharged from the gas discharging unit preferably has a temperature equal to or higher than that of the substrate heating unit.

In accordance with the arrangement above, high-temperature gas with a temperature equal to or higher than the boiling point of the processing liquid is discharged toward the upper surface of the substrate covered with the liquid film of the processing liquid. Since the gas has a high temperature, it is possible to prevent the temperature of the liquid film of the processing liquid from decreasing. Alternatively, it is possible to heat the liquid film of the processing liquid.

A still further preferred embodiment of the present invention provides a substrate processing apparatus including a substrate holding unit arranged to hold the substrate horizontally, a processing liquid supplying unit arranged to supply processing liquid onto the upper surface of the substrate held on the substrate holding unit to form a liquid film of the processing liquid covering the entire upper surface of the substrate, a substrate heating unit including multiple heaters arranged to heat the entire upper surface of the substrate held on the substrate holding unit at their respective independent temperatures and arranged to heat the substrate held on the substrate holding unit at a temperature equal to or higher than the boiling point of the processing liquid, with the entire upper surface of the substrate being covered with the liquid film of the processing liquid, to vaporize the processing liquid and form a gaseous phase between the liquid film of the processing liquid and the upper surface of the substrate, and a controller arranged to control the substrate heating unit. If a pattern is formed on the upper surface of the substrate, the upper surface of the substrate includes the upper surface of the base material (silicon, for example) and the surface of the pattern.

The controller is arranged to perform a uniform heating step of uniformly heating the substrate held on the substrate holding unit at a temperature equal to or higher than the boiling point of the processing liquid, with the entire upper surface of the substrate being covered with the liquid film of the processing liquid, to vaporize the processing liquid and form a gaseous phase between the liquid film of the processing liquid and the upper surface of the substrate and a temperature difference generating step of, after the uniform heating step, forming a low-temperature region with a temperature equal to or higher than the boiling point of the processing liquid and a high-temperature region with a temperature higher than that of the low-temperature region in the upper surface of the substrate with a gaseous phase being formed between the liquid film of the processing liquid and the upper surface of the substrate.

In accordance with the arrangement above, processing liquid is supplied onto the upper surface of the substrate that is held horizontally and a liquid film of the processing liquid covering the entire upper surface of the substrate is formed. Thereafter, the substrate is heated at a temperature equal to or higher than the boiling point of the processing liquid, so that the substrate reaches a temperature equal to or higher than the boiling point of the processing liquid. This causes the processing liquid to be vaporized at the interface with the upper surface of the substrate and a gaseous phase to be formed between the liquid film of the processing liquid and the upper surface of the substrate. In this case, since the liquid film of the processing liquid is raised over the upper surface of the substrate, only a small frictional resistance, which may be considered zero, acts on the liquid film of the processing liquid on the substrate. Accordingly, the liquid film of the processing liquid is easily slidable along the upper surface of the substrate.

The controller performs the uniform heating step and the temperature difference generating step. In the uniform heating step, the substrate is heated uniformly at a temperature equal to or higher than the boiling point of the processing liquid. This causes a gaseous phase to be formed between the liquid film, of the processing liquid and the upper surface of the substrate. In the temperature difference generating step, a high-temperature region and a low-temperature region having their respective different temperatures are formed in the upper surface of the substrate. This generates a temperature difference in the liquid film of the processing liquid, and a flow toward the lower temperature is formed in the liquid film of the processing liquid. With this generation of temperature difference, an outward flow toward the peripheral portion of the substrate is formed in the liquid film of the processing liquid, so that the liquid film of the processing liquid on the substrate is removed from the substrate directly as a mass without being split into a number of small droplets. This allows the liquid film of the processing liquid to be removed quickly from the substrate in a short time.

In a spin drying step of causing a substrate to undergo a high-speed rotation for drying, a liquid surface (gas-liquid interface) is formed across two adjacent structures. A surface tension that may destroy a pattern acts at the position of contact between the liquid surface and the pattern (gas-liquid-solid interface). On the other hand, in the present invention, since the substrate has a temperature equal to or higher than the boiling point of the processing liquid, even if the processing liquid may come into contact with the upper surface of the substrate, the liquid is vaporized immediately. For this reason, a liquid surface such as in the spin drying step is formed, so that surface tension does not act on and destroys the pattern. It is therefore possible to reduce the occurrence of pattern collapse.

Further, vaporization of liquid film on a substrate may cause defects such as watermarks and/or particles. On the other hand, in the present invention, the liquid film is moved and removed with respect to the substrate. It is therefore possible to reduce the occurrence of watermarks and/or particles. In particular, since the gaseous phase exists between the liquid film of the processing liquid and the upper surface of the substrate and the liquid film of the processing liquid is easily slidable along the upper surface of the substrate, the liquid film can be removed quickly in a short time. This allows the time for which the upper surface of the substrate is exposed partially to the air to be reduced and thereby the substrate may be processed more uniformly.

The controller may be arranged to form the high-temperature region in a central portion of the upper surface of the substrate in the temperature difference generating step.

In accordance with the arrangement above, the central portion of the liquid film of the processing liquid covering the central portion of the upper surface of the substrate has a temperature higher than that of the portion surrounding the central portion. Accordingly, a radial flow toward the peripheral portion of the liquid film is formed in the liquid film of the processing liquid. It is therefore possible to uniformly remove the liquid film of the processing liquid from the substrate. Further, the time for removal of the liquid film of the processing liquid can be reduced compared to the case where the position of initial formation of the high-temperature region is in a peripheral portion of the upper surface of the substrate.

The controller may be arranged to form the high-temperature region in a peripheral portion of the upper surface of the substrate in the temperature difference generating step.

In accordance with the arrangement above, the peripheral portion of the liquid film of the processing liquid covering the peripheral portion of the upper surface of the substrate has a temperature higher than that of the other portion of the liquid film. Accordingly, a flow toward the peripheral portion of the liquid film is formed in the liquid film of the processing liquid. It is therefore possible to remove the liquid film of the processing liquid quickly from the substrate in a short time.

The controller may be arranged to further perform a boundary moving step of, after the temperature difference generating step, moving the boundary between the low-temperature region and the high-temperature region toward the low-temperature region.

In accordance with the arrangement above, a temperature difference is generated in the liquid film of the processing liquid, so that a flow toward the lower temperature is formed in the liquid film of the processing liquid. Further, since the boundary between the low-temperature region and the high-temperature region is moved toward the low-temperature region, the flow toward the lower temperature is facilitated in the liquid film. This allows the liquid film of the processing liquid on the substrate to be removed efficiently.

The substrate processing apparatus may further include a gas discharging unit arranged to discharge gas toward the high-temperature region with a gaseous phase being formed between the liquid film of the processing liquid and the upper surface of the substrate.

In accordance with the arrangement above, gas is discharged toward the high-temperature region, a region of the upper surface of the substrate, with a gaseous phase being formed between the liquid film of the processing liquid and the upper surface of the substrate. The gas supplied to the high-temperature region flows in a direction away from the high-temperature region along the upper surface of the substrate. Accordingly, the flow toward the lower temperature is facilitated in the liquid film. This allows the liquid film of the processing liquid on the substrate to be removed efficiently.

The processing liquid to be supplied by the processing liquid supplying unit onto the substrate may have a surface tension lower than that of water and a boiling point lower than that of water.

In accordance with the arrangement above, since the liquid to be supplied onto the substrate has a lower surface tension, even if a liquid surface across two adjacent structures may be formed temporarily, only a low surface tension on the pattern is applied. It is therefore possible to reduce the occurrence of pattern collapse. Further, since the volatile liquid is supplied onto the substrate, it is possible to form a gaseous phase between the liquid film of the processing liquid and the upper surface of the substrate while avoiding a rise in the temperature of the substrate heating unit.

The substrate processing apparatus may further include an openable/closable inner chamber to house the substrate holding unit therein, and an outer chamber to house the inner chamber therein.

In accordance with the arrangement above, the inner chamber to house the substrate holding unit therein is disposed within the outer chamber. Since the inner chamber is openable/closable, the interior of the outer chamber excluding the inner chamber and the interior of the inner chamber can be isolated as needed. It is therefore possible to form a space with a high degree of sealing with a double enclosure provided by the inner chamber and the outer chamber as needed. It is thus possible to perform processing such as heating of the substrate within the space of such a high degree of sealing. Further, when the inner chamber is open, a nozzle arranged to discharge gas or liquid therethrough can be transferred between the inside and outside of the inner chamber, so that there is no need to dispose such a nozzle within the inner chamber. It is therefore possible to suppress or prevent the inner chamber from growing in size.

The substrate processing apparatus may further include an inert gas supplying unit arranged to supply inert gas into the inner chamber.

In accordance with the arrangement above, since inert gas is supplied into the inner chamber housing the substrate holding unit, the air inside the inner chamber can be replaced with the inert gas and the concentration of oxygen within the inner chamber can be lowered. It is therefore possible to prevent the occurrence of problems caused by oxygen, such as watermarks.

The above and yet other objects, features, and effects of the present invention shall be made clear by the following description of preferred embodiments in reference to the attached drawings.

DETAILED DESCRIPTION OF PREFERRED EMBODIMENTS

First Preferred Embodiment

Figure 1:
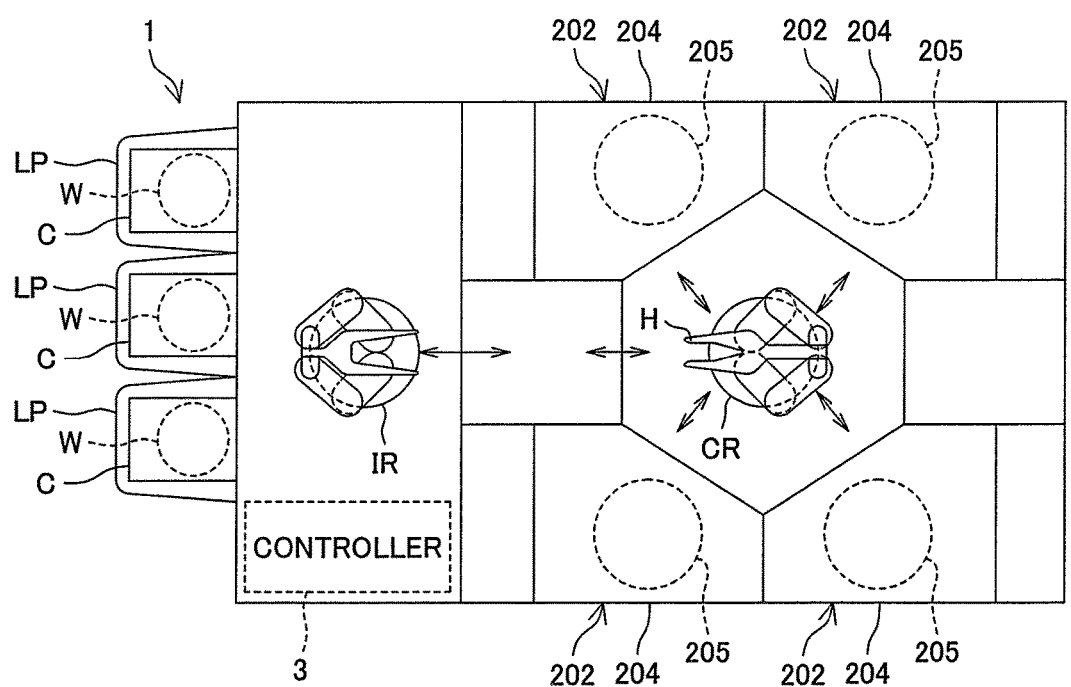
FIG. 1 is a schematic plan view of a substrate processing apparatus according to a first preferred embodiment of the present invention.
Figure 2:
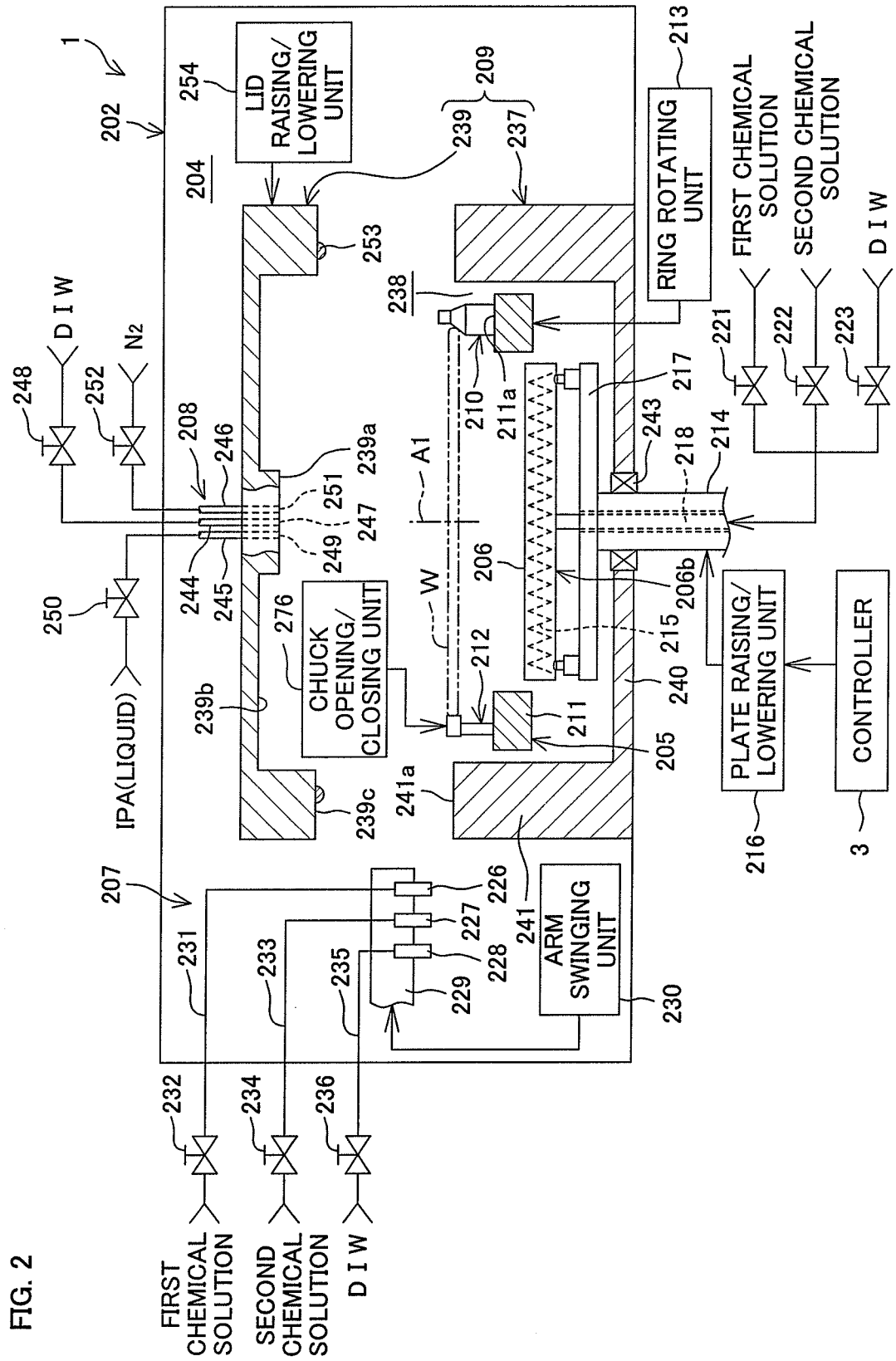
FIG. 2 is a schematic vertical cross-sectional view of a processing unit included in the substrate processing apparatus shown in FIG. 1.

FIG. 1 is a schematic plan view of a substrate processing apparatus 1 according to a first preferred embodiment of the present invention. FIG. 2 is a schematic vertical cross-sectional view of a processing unit 202 included in the substrate processing apparatus 1 shown in FIG. 1.

The substrate processing apparatus 1 is a single substrate processing type in which disk-shaped substrates W such as silicon wafers are processed one by one. As shown in FIG. 1, the substrate processing apparatus 1 includes multiple processing units 202 arranged to process the substrates W with processing liquid, load ports LP on which carriers C are placed to house the respective multiple substrates W to be processed in the processing units 202 therein, delivery robot IR and delivery robot CR arranged to deliver the substrates W between the load ports LP and the processing units 202, and a controller 3 arranged to control the substrate processing apparatus 1.

The processing units 202 are single substrate processing type in which chemical solution processing (washing processing, etching processing, etc.) using first chemical solution and second chemical solution is performed on the front surface (pattern formed surface) and the rear surface of the disk-shaped substrates W. Each of the processing units 202 includes a box-shaped outer chamber 204 having an interior space, a first substrate holding unit 205 serving as a substrate holding and rotating unit arranged to rotate one of the substrates W about a vertical axis of rotation A1 passing through the center of the substrate W while keeping the substrate W in a horizontal attitude within the outer chamber 204, a second substrate holding unit 206b including a hot plate (substrate heating unit) 206 arranged to heat the substrate W, an attitude changing unit 290 arranged to cause the substrate W and the hot plate 206 to undergo an attitude change between a horizontal attitude in which the upper surface of the substrate W is horizontal and a tilted attitude in which the upper surface of the substrate W is tilted with respect to the horizontal surface (see FIG. 4), and an openable/closable inner chamber 209 to house the first substrate holding unit 205 and the second substrate holding unit 206b therein.

The processing unit 202 further includes a processing liquid supplying unit 207 arranged to supply processing liquid such as the first chemical solution, second chemical solution, and rinse liquid onto the substrate W held on the first substrate holding unit 205 and an organic solvent supplying unit (processing liquid supplying unit) 208 arranged to supply IPA liquid (an example of processing liquid), an example of organic solvent solution having a surface tension lower than that of water, onto the upper surface of the substrate W held on the first substrate holding unit 205 or the second substrate holding unit 206b.

Figure 3:
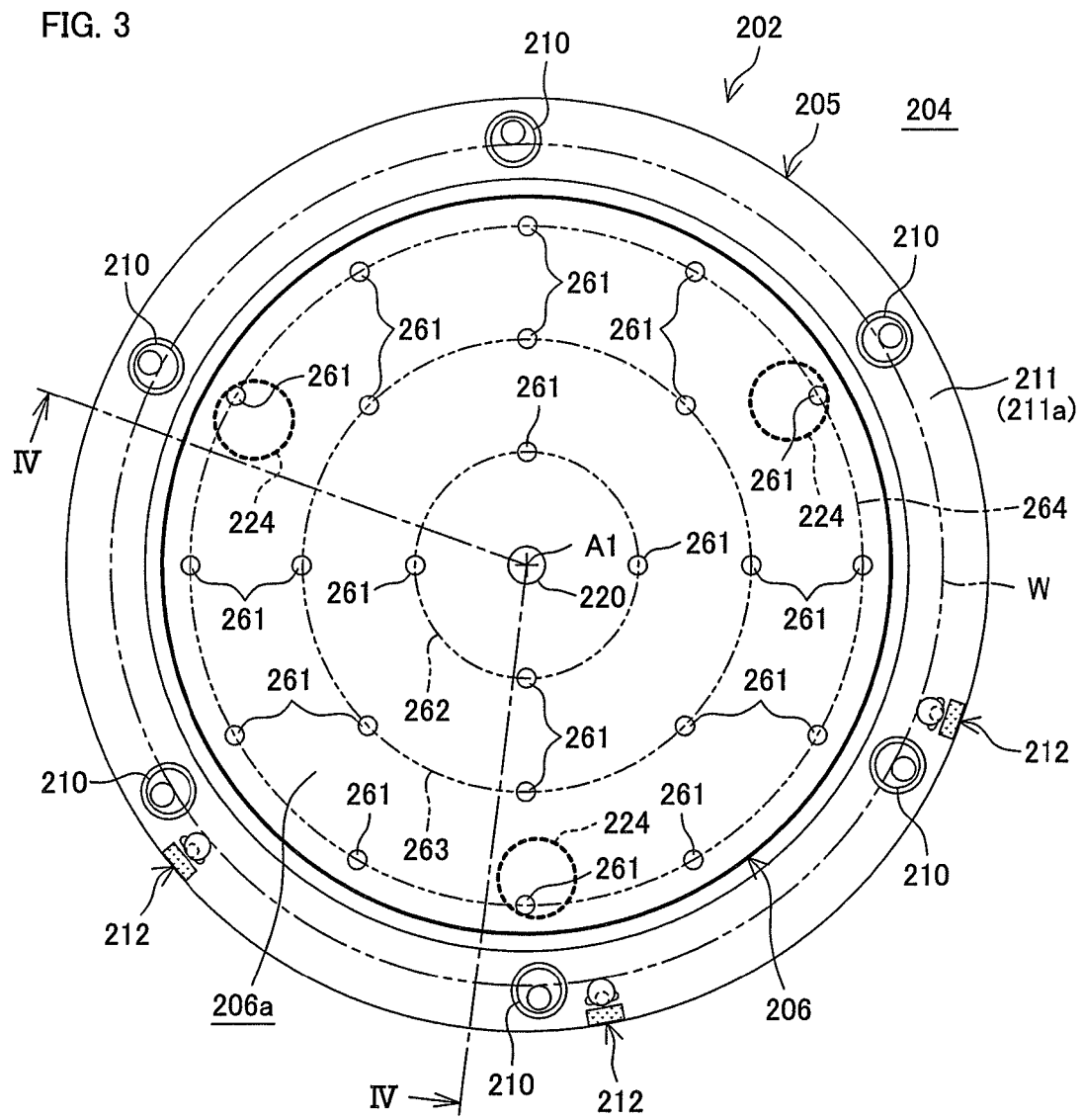
FIG. 3 is a plan view of the first substrate holding unit and the second substrate holding unit shown in FIG. 2.
Figure 4:
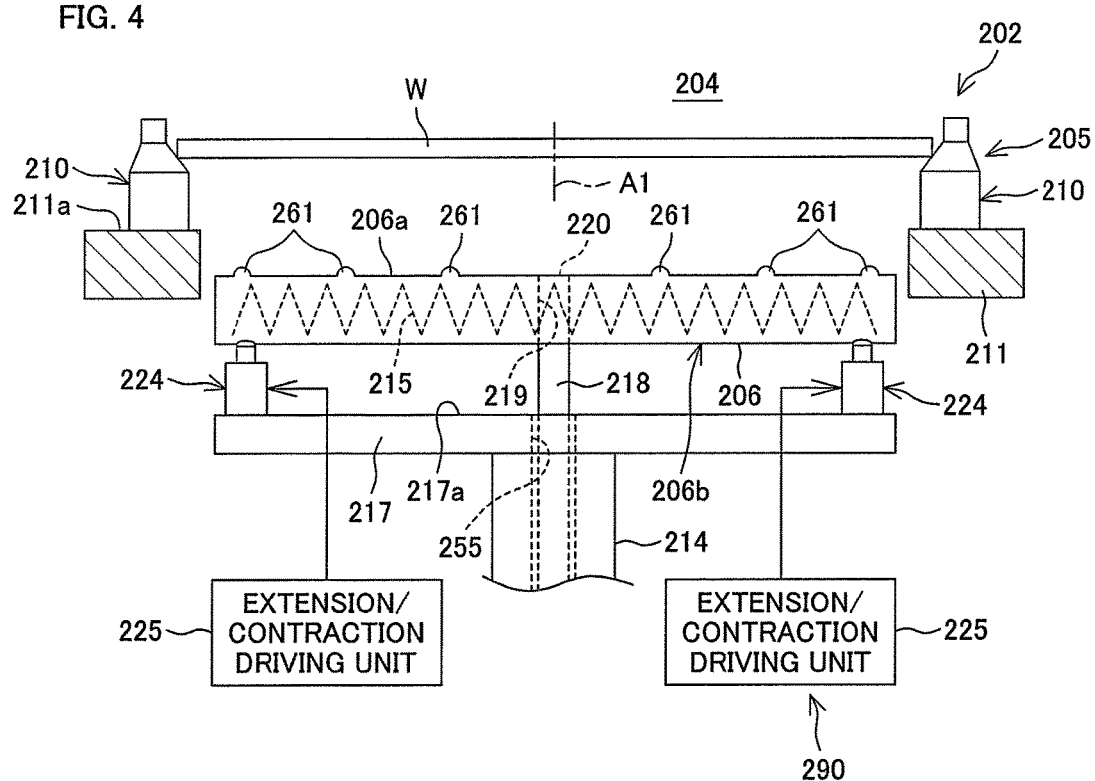
FIG. 4 is a cross-sectional view taken along the line IV-IV in FIG. 3.

FIG. 3 is a plan view of the first substrate holding unit 205 and the second substrate holding unit 206b. FIG. 4 is a cross-sectional view taken along the line IV-IV in FIG. 3.

As shown in FIGS. 2 to 4, the first substrate holding unit 205 has an annular rotational ring 211 having an outer diameter greater than that of the substrate W. The rotational ring 211 is made of a chemical-resistant resin material and has a rotational center concentric with the rotational axis A1 of the substrate W. The rotational ring 211 also has a horizontal and flat annular upper surface 211a. The upper surface 211a is provided with multiple (six, for example) fixed pins (support pins) 210 fixed with respect to the rotational ring 211 and multiple (three, for example) movable pins 212 movable with respect to the rotational ring 211.

The multiple fixed pins 210 are disposed in an equally spaced manner in the circumferential direction on the upper surface 211a of the rotational ring 211. The multiple movable pins 212 are disposed in the circumferential direction on the upper surface 211a of the rotational ring 211. The three movable pins 212 are associated one for one with three of the fixed pins 210 arranged continuously in the circumferential direction. The three movable pins 212 are disposed, respectively, in the vicinity of the associated three fixed pins 210. The three movable pins 212 are thus disposed unevenly in the circumferential direction.

The rotational ring 211 is coupled with a ring rotating unit 213 arranged to rotate the rotational ring 211 about the rotational axis A1. The ring rotating unit 213 includes, for example, an electric motor and a transmitting mechanism arranged to transmit the power of the electric motor.

As shown in FIGS. 2 to 4, the hot plate 206 is a disk-shaped member made of, for example, ceramic or silicon carbide (SiC). The upper surface of the hot plate 206 has a flat circular substrate opposing surface 206a. The outer diameter of the substrate opposing surface 206a is smaller than the inner diameter of the rotational ring 211. The hot plate 206 does not overlap the rotational ring 211 of the first substrate holding unit 205 in the vertical direction. An electric heater 215, for example, is provided in an embedded manner inside the hot plate 206. The heater 215, when energized, produces heat. This causes the entire hot plate 206 including the substrate opposing surface 206a to be heated.

As shown in FIG. 3, the hot plate 206 has multiple (24 in this preferred embodiment) support pins 261 protruding upward approximately semi-spherically from the substrate opposing surface 206a. The multiple support pins 261 have approximately the same diameter. The multiple support pins 261 are disposed on the substrate opposing surface 206a in such a distributed manner as to have an approximately uniform density across the substrate opposing surface 206a. More specifically, the multiple support pins 261 are disposed on a first virtual circle 262, a second virtual circle 263, and a third virtual circle 264 with their respective different diameters set centering on the rotational axis A1. The second virtual circle 263 is set to have a diameter about twice that of the first virtual circle 262. The third virtual circle 264 is set to have a diameter about three times that of the first virtual circle 262. On the first virtual circle 262, four of the support pins 261 are disposed in an equally spaced manner. On the second virtual circle 263, eight of the support pins 261 are disposed in an equally spaced manner. On the third virtual circle 264, twelve of the support pins 261 are disposed in an equally spaced manner. The substrate W is supported at a position at which the lower surface of the substrate W is separated above from the substrate opposing surface 206a by small gap Wa through contact between the multiple support pins 261 and the lower surface of the substrate W.

When the heater 215 produces heat with the substrate W being held on the hot plate 206, the heat is transferred to the substrate W. Specifically, the heat from the heater 215 is transferred to the substrate W through fluid between the substrate opposing surface 206a and the substrate W and/or the support pins 261. The heat from the heater 215 is also transferred to the substrate W by heat radiation. This causes the substrate W held on the hot plate 206 to be heated.

Figure 5:
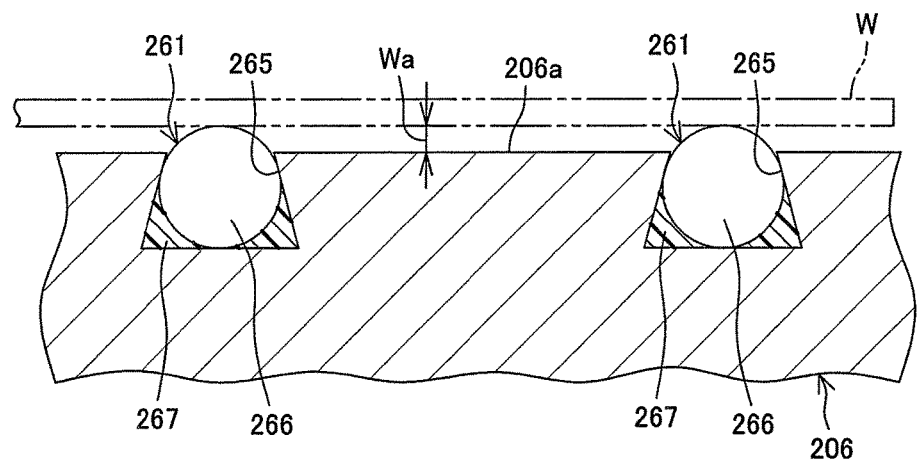
FIG. 5 is an enlarged vertical cross-sectional view showing a substrate opposing surface of a hot plate.

FIG. 5 is an enlarged vertical cross-sectional view showing the substrate opposing surface 206a of the hot plate 206.

As shown in FIG. 5, the support pins 261 are each formed by a sphere 266 disposed within a small groove 265 that is provided in the substrate opposing surface 206a. More specifically, the small groove 265 is provided in a region of the substrate opposing surface 206a in which each support pin 261 is to be formed. The sphere 266 is formed of, for example, ceramic or silicon carbide (SiC). The sphere 266 is fitted into the small groove 265 in a manner partially protruding at a position higher than the substrate opposing surface 206a. The sphere 266 is fixed within the small groove 265 with adhesive 267. Each support pin 261 is formed by a portion of the sphere 266 protruding from the small groove 265.

The support pins 261 have, for example, the same height (vertical length from the substrate opposing surface 206a to the upper end of the support pins 261). The height of the support pins 261 is equal to the small gap Wa. The support pins 261 are set to have a height (about 0.1 mm, for example) that is sufficient so that the substrate W supported by the support pins 261 can be suppressed or prevented from being adsorbed to the substrate opposing surface 206a and contaminants on the substrate opposing surface 206a cannot be transferred to the lower surface of the substrate W.

Since the substrate W is thus supported in a manner spaced from the substrate opposing surface 206a, it is possible to suppress or prevent the substrate W from being attracted and sticking to the substrate opposing surface 206a. In addition, even if contaminants may exist on the substrate opposing surface 206a, it is possible to suppress or prevent the contaminants from being transferred to (the lower surface of) the substrate W.

Further, since the substrate W is supported by the multiple support pins 261 disposed in a distributed manner on the substrate opposing surface 206a, it is possible to keep the likelihood of heat transfer from the substrate opposing surface 206a to the substrate W uniform in the plane of the substrate W. In addition, since the multiple support pins 261 are not eccentrically located, it is possible to suppress or prevent the substrate W from bending.

It is noted that the multiple support pins 261 may not have the same height. For example, the height of support pins 261 in a central portion of the substrate opposing surface 206a may be smaller than the height of support pins 261 in a peripheral portion of the substrate opposing surface 206a.

As shown in FIGS. 2 and 4, the hot plate 206 is supported by a plate support shaft 214 via multiple (three, for example) extensible units 224 and a support member 217 supporting the extensible units 224.

The support member 217 is, for example, a disk-shaped or ring-shaped member. FIG. 2 shows an example of the support member 217 being disk-shaped. The support member 217 has a horizontal and flat support surface 217a and is fixed to the upper end of the plate support shaft 214. The three extensible units 224 are disposed in a peripheral portion of the support surface 217a of the support member 217 in an equally spaced manner in the circumferential direction. The extensible units 224 are disposed medial to three of the fixed pins 210, respectively, in a plan view.

The extensible units 224 are cylinders including a cylinder main body provided on and fixed to the support member 217 and an extensible rod protruding vertically upward from the cylinder main body. The length of the extensible units 224 is adjusted continuously within a range from a maximally contracted state where the amount of protrusion of the extensible rod is minimum and a maximally extended state where the amount of protrusion of the extensible rod is maximum. The extensible units 224 support a peripheral portion of the hot plate 206 thereon. The multiple extensible units 224 have the same specifications. Accordingly, the multiple extensible units 224 have the same length in the maximally contracted state. Each of the extensible units 224 is coupled with an extension/contraction driving unit 225 arranged to supply driving fluid to extend/contract the extensible rod in the vertical direction. Although in this preferred embodiment, the extensible unit 224 and the extension/contraction driving unit 225 are provided as separate members, the extensible unit 224 may be configured as a single member such as an electromagnetic actuator.

In this preferred embodiment, the attitude changing unit 290 is constituted by the support member 217, the extensible units 224, and the extension/contraction driving units 225.

In the state shown in FIG. 4, all the extensible units 224 are in the maximally contracted state. All the extensible units 224 also have the same length. This causes the hot plate 206 to be kept in the horizontal attitude. In this state, the substrate opposing surface 206a of the hotplate 206 is disposed in a horizontal plane. The substrate W on the hot plate 206 does not move on the hot plate 206 but remains in rest state due to a frictional force acting between the substrate W and the support pins 261.

Figure 16:
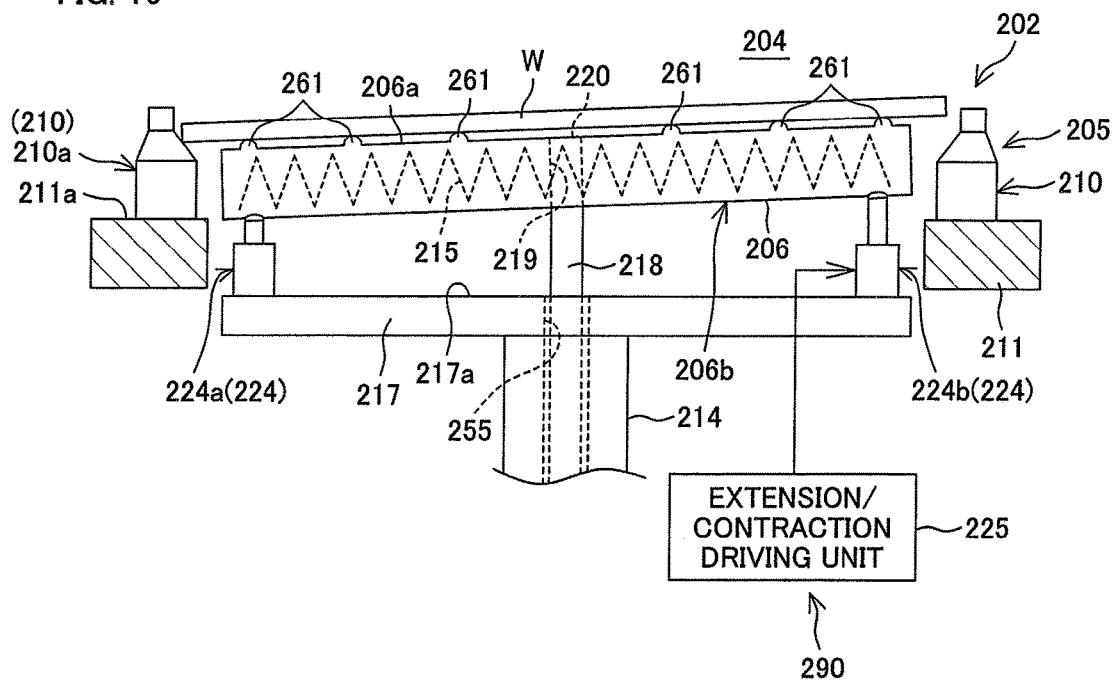
FIG. 16 is a vertical cross-sectional view of the first substrate holding unit and the second substrate holding unit in an organic solvent removing step when viewed horizontally.

Also, the hot plate 206 can be changed from the horizontal attitude shown in FIG. 4 to the tilted attitude shown in FIG. 16 by controlling the three extensible units 224. In the state shown in FIG. 16, one of the three extensible units 224 is kept in the maximally contracted state, while the other two are extended relative to the maximally contracted state. This causes the hot plate 206 to be kept at the tilted attitude. The attitude changing unit 290, with a simple structure including the multiple extensible units 224, can thus cause the hot plate 206 to undergo an attitude change between the horizontal attitude and the tilted attitude.

The plate support shaft 214 is, for example, a vertically extending hollow shaft. Power feeder wire (not shown) for the heater 215 and a lower pipe 218 are inserted into the plate support shaft 214.

The lower pipe 218 is disposed in a manner passing through a first through hole 255 that penetrates a central portion of the support member 217 in its thickness direction and a second through hole 219 that penetrates a central portion of the hot plate 206 in its thickness direction. The lower pipe 218 communicates with a lower discharge port 220 opened in the central portion of the substrate opposing surface 206a of the hot plate 206. The lower pipe 218 is composed of a flexible pipe at least in a portion closer to the lower discharge port 220.

Hydrofluoric acid as an example of the first chemical solution, SC1 (ammonia-hydrogen peroxide mixture) as an example of the second chemical solution, and the rinse liquid are supplied selectively through the lower pipe 218. Hydrofluoric acid is supplied through a first chemical solution lower valve 221 into the lower pipe 218. SC1 is supplied through a second chemical solution lower valve 222 into the lower pipe 218. The rinse liquid is supplied through a rinse liquid lower valve 223 into the lower pipe 218.

The rinse liquid is, for example, pure water (deionized water). The rinse liquid is not limited to pure water, but may be any one of carbonated water, electrolyzed ionic water, regenerated water (hydrogen water), ozone water, and hydrochloric acid water with a dilute concentration (of about 10 to 100 ppm, for example). The first chemical solution, the second chemical solution, and the rinse liquid supplied into the lower pipe 218 pass through the second through hole 219 to be discharged upward through the lower discharge port 220.

Specifically, when the first chemical solution lower valve 221 is opened with the second chemical solution lower valve 222 and the rinse liquid lower valve 223 being closed, the first chemical solution is discharged upward through the lower discharge port 220. If the substrate W is held on the first substrate holding unit 205, the first chemical solution is supplied onto a central portion of the lower surface of the substrate W.

Similarly, when the second chemical solution lower valve 222 is opened with the first chemical solution lower valve 221 and the rinse liquid lower valve 223 being closed, the second chemical solution is discharged upward through the lower discharge port 220. If the substrate W is held on the first substrate holding unit 205, the second chemical solution is supplied onto the central portion of the lower surface of the substrate W.

Also, when the rinse liquid lower valve 223 is opened with the first chemical solution lower valve 221 and the second chemical solution lower valve 222 being closed, the rinse liquid is discharged upward through the lower discharge port 220. If the substrate W is held on the first substrate holding unit 205, the rinse liquid is supplied onto the central portion of the lower surface of the substrate W.

As shown in FIGS. 2 to 4, the lower discharge port 220 includes one discharge port shared by each processing liquid, but may include multiple discharge ports. In this case, the lower discharge port 220 may include a discharge port for each type of processing liquid.

The plate support shaft 214 is coupled with a plate raising/lowering unit 216 arranged to raise/lower the plate support shaft 214 (see FIG. 2). The plate raising/lowering unit 216 includes, for example, an electric motor and a transmitting mechanism (ball screw mechanism or the like) arranged to transmit the power of the electric motor.

Figure 13A:
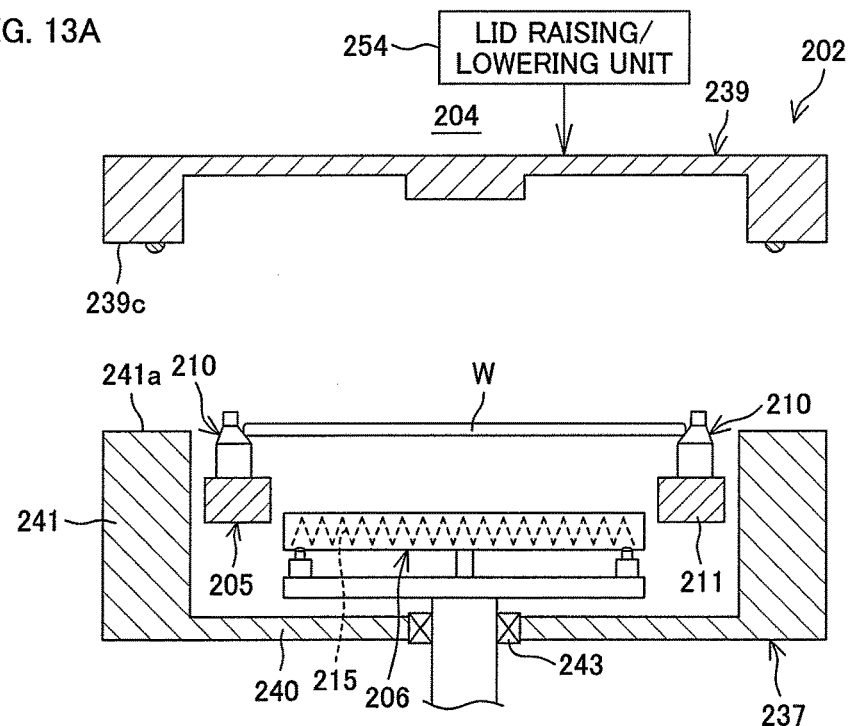
FIG. 13A is a schematic view for illustrating the first example of processing shown in FIG. 12.

When the plate raising/lowering unit 216 raises/lowers the plate support shaft 214, the plate support shaft 214, extensible units 224, the support member 217, and the hot plate 206 are integrally raised/lowered. When the plate raising/lowering unit 216 is thus driven, the hot plate 206 is raised/lowered between a lower position (such as shown in FIG. 13A) and a higher position (such as shown in FIG. 13G).

The lower position of the hot plate 206 has a height at which the substrate opposing surface 206a of the hot plate 206 is positioned lower than the lower surface of the substrate W held on the first substrate holding unit 205. If the hot plate 206 is controlled to be constantly ON, the lower position may have a height at which the lower surface of the substrate W cannot be largely heated by the hot plate 206. On the other hand, the upper position of the hot plate 206 has a height at which the substrate opposing surface 206a of the hot plate 206 is positioned higher than the lower surface of the substrate W held on the first substrate holding unit 205. As described above, since the hot plate 206 does not overlap the rotational ring 211 of the first substrate holding unit 205 in the vertical direction, the hot plate 206 and the first substrate holding unit 205 cannot interfere with each other even during the raising/lowering of the hot plate 206.

As shown in FIG. 2, the processing liquid supplying unit 207 includes a first chemical solution nozzle 226 arranged to discharge the first chemical solution therethrough, a second chemical solution nozzle 227 arranged to discharge the second chemical solution therethrough, and a rinse liquid nozzle 228 arranged to discharge the rinse liquid therethrough. The first chemical solution nozzle 226, the second chemical solution nozzle 227, and the rinse liquid nozzle 228 are mounted at the leading end of a horizontally extensible arm 229 with the discharge ports being directed downward. The arm 229 is provided in a manner swingable about a predetermined axis of rotation. The first chemical solution nozzle 226, the second chemical solution nozzle 227, and the rinse liquid nozzle 228 are arranged in the direction in which the arm 229 is swung.

The arm 229 is coupled with an arm swinging unit 230 arranged to swing the arm 229 within a predetermined angular range. When the arm 229 is swung, the first chemical solution nozzle 226, the second chemical solution nozzle 227, and the rinse liquid nozzle 228 are caused to move between a position over the central portion of the substrate W held on the first substrate holding unit 205 or the hot plate 206 and a home position set outside the inner chamber 209.

As shown in FIG. 2, the first chemical solution nozzle 226 is, for example, a straight nozzle arranged to discharge hydrofluoric acid, an example of the first chemical solution, downward to form a continuous flow. The first chemical solution nozzle 226 is connected with a first chemical solution pipe 231 that forms a supply passage through which the first chemical solution from a first chemical solution source flows. A first chemical solution valve 232 arranged to control the supply of the first chemical solution is installed in the first chemical solution pipe 231. When the first chemical solution valve 232 is opened, the first chemical solution is supplied through the first chemical solution pipe 231 to the first chemical solution nozzle 226. When the first chemical solution valve 232 is closed, the supply of the first chemical solution through the first chemical solution pipe 231 to the first chemical solution nozzle 226 is stopped.

As shown in FIG. 2, the second chemical solution nozzle 227 is, for example, a straight nozzle arranged to discharge SC1, an example of the second chemical solution, downward to form a continuous flow. The second chemical solution nozzle 227 is connected with a second chemical solution pipe 233 that forms a supply passage through which the second chemical solution from a second chemical solution source flows. A second chemical solution valve 234 arranged to control the supply of the second chemical solution is installed in the second chemical solution pipe 233. When the second chemical solution valve 234 is opened, the second chemical solution is supplied through the second chemical solution pipe 233 to the second chemical solution nozzle 227. When the second chemical solution valve 234 is closed, the supply of the second chemical solution through the second chemical solution pipe 233 to the second chemical solution nozzle 227 is stopped.

As shown in FIG. 2, the rinse liquid nozzle 228 is, for example, a straight nozzle arranged to discharge the rinse liquid downward therethrough to form a continuous flow. The rinse liquid nozzle 228 is connected with a rinse liquid pipe 235 that forms a supply passage through which the rinse liquid from a rinse liquid source flows. A rinse liquid valve 236 arranged to control the supply of the rinse liquid is installed in the rinse liquid pipe 235. When the rinse liquid valve 236 is opened, the rinse liquid is supplied through the rinse liquid pipe 235 to the rinse liquid nozzle 228. When the rinse liquid valve 236 is closed, the supply of the rinse liquid through the rinse liquid pipe 235 to the rinse liquid nozzle 228 is stopped.

It is noted that although FIG. 2 shows the case where the first chemical solution nozzle 226, the second chemical solution nozzle 227, and the rinse liquid nozzle 228 are disposed on the single arm 229, the nozzles may be mounted, respectively, on three different arms.

As shown in FIG. 2, the inner chamber 209 includes a chamber main body 237 to house the first substrate holding unit 205 and the second substrate holding unit 206b and a lid member 239 to close the opening 238 of the chamber main body 237. The lid member 239 closing the opening 238 of the chamber main body 237 forms a sealed space inside the inner chamber 209 serving as a sealed chamber.

The chamber main body 237 has a bottomed cylindrical shape with the circular opening 238 provided on top thereof. The chamber main body 237 integrally includes a disk-shaped bottom wall portion 240 and a peripheral wall portion 241 standing upward from the bottom wall portion 240. The peripheral wall portion 241 has a cylindrical shape concentric with the rotational axis A1. The peripheral wall portion 241 also has an annular upper end face 241a. The upper surface of the bottom wall portion 240 is connected with one end of a waste liquid passage (not shown). The other end of the waste liquid passage is connected to waste liquid equipment (not shown) installed outside the substrate processing apparatus 1.

A receiver cup (not shown) arranged to receive processing liquid splattering from the substrate W held on the first substrate holding unit 205 or the second substrate holding unit 206b is disposed around the peripheral wall portion 241. The receiver cup is connected to the waste liquid equipment (not shown) installed outside the substrate processing apparatus 1. An annular sealing member 243 is provided for sealing between the plate support shaft 214 and the central portion of the bottom wall portion 240.

The lid member 239 is disposed over the chamber main body 237 in a horizontal attitude such that the center thereof is positioned on the rotational axis A1 of the substrate W. The lid member 239 is connected with a lid raising/lowering unit 254. The lid raising/lowering unit 254 includes, for example, an electric motor and a transmitting mechanism (ball screw mechanism or the like) arranged to transmit the power of the electric motor. When the lid raising/lowering unit 254 is driven, the lid member 239 is raised/lowered between a lid closed position at which the opening 238 of the chamber main body 237 is closed and a lid opened position at which the lid member is retracted to a higher position than that of the chamber main body 237 and the opening 238 of the chamber main body 237 is opened.

The lower surface of the lid member 239 includes a horizontal and flat circular central portion 239a. The central portion 239a of the lower surface of the lid member 239 is opposed to the central portion of the upper surface of the substrate W held on the first substrate holding unit 205 or the central portion of the upper surface of the substrate W held on the hot plate 206.

A sealing ring 253 is provided over the entire circumference of a peripheral portion 239c of the lower surface of the lid member 239. The sealing ring 253 is made of, for example, an elastic material such as synthetic resin. When the lid member 239 is at the lid closed position, the sealing ring 253, which is disposed in the peripheral portion 239c of the lower surface of the lid member 239, comes into contact with the upper end face 241a of the chamber main body 237 over the entire circumference for sealing between the lid member 239 and the chamber main body 237. A cylindrical upper annular groove 239b concentric with the lid member 239 is provided in the region of the lower surface of the lid member 239 excluding the central portion 239a and the peripheral portion 239c.

As shown in FIG. 2, a rinse liquid upper pipe 244, an organic solvent upper pipe 245, and a nitrogen gas upper pipe 246 are inserted into a hole opened in the central portion 239a of the lower surface of the lid member 239.

The lower end of the rinse liquid upper pipe 244 is opened in the central portion 239a of the lower surface of the lid member 239 to form a rinse liquid discharge port 247. The rinse liquid upper pipe 244 is connected with a rinse liquid source. The rinse liquid is supplied from the rinse liquid source into the rinse liquid upper pipe 244. A rinse liquid upper valve 248 arranged to control the supply of the rinse liquid is installed in the rinse liquid upper pipe 244.

The lower end of the organic solvent upper pipe 245 is opened in the central portion 239a of the lower surface of the lid member 239 to form an organic solvent discharge port 249. The organic solvent upper pipe 245 is connected with an organic solvent source. IPA is supplied from an IPA source into the organic solvent upper pipe 245. An organic solvent valve 250 arranged to control the supply of the IPA is installed in the organic solvent upper pipe 245. The organic solvent upper pipe 245 and the organic solvent valve 250 constitute an organic solvent supplying unit 208. The organic solvent supplying unit is also an example of the processing liquid supplying unit.

The lower end of the nitrogen gas upper pipe 246 is opened in the central portion 239a of the lower surface of the lid member 239 to form a nitrogen gas discharge port 251 arranged to discharge nitrogen gas ($N_2$), an example of inert gas, therethrough. The nitrogen gas upper pipe 246 is connected with a nitrogen gas source. Nitrogen gas from the nitrogen gas source is supplied through the nitrogen gas upper pipe 246 that forms a nitrogen gas supply passage to the nitrogen gas discharge port 251. A nitrogen gas valve 252 arranged to control the supply of the nitrogen gas is installed in the nitrogen gas upper pipe 246.

Figure 6:
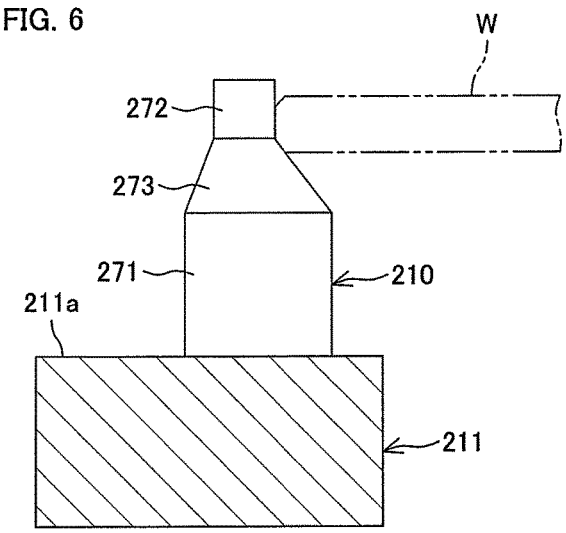
FIG. 6 is a schematic view of a fixed pin when viewed horizontally.

FIG. 6 is a schematic view of a fixed pin 210 when viewed horizontally. As shown in FIG. 6, the fixed pin 210 includes a first lower shaft portion 271 coupled to the rotational ring 211 and a first upper shaft portion 272 formed integrally with the upper end of the first lower shaft portion 271. The first lower shaft portion 271 and the first upper shaft portion 272 each have a columnar shape. The first upper shaft portion 272 is eccentric with respect to the central axis of the first lower shaft portion 271. A tapered surface 273 narrowed upward is formed in the portion in which the first lower shaft portion 271 is coupled to the first upper shaft portion 272.

Figure 7:
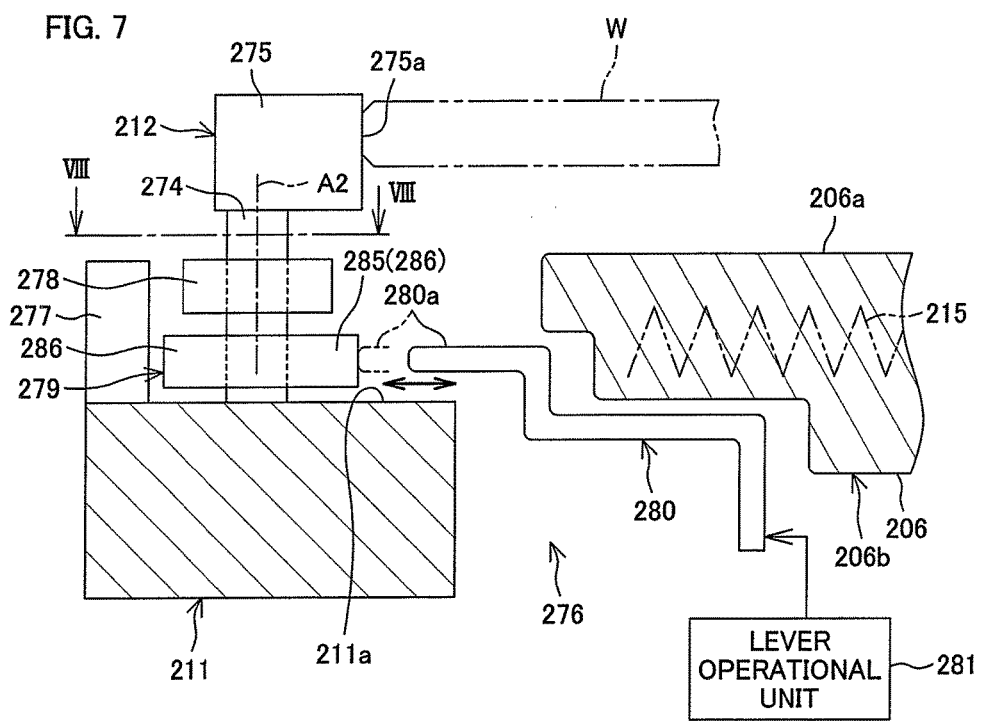
FIG. 7 is a schematic view of a movable pin and a chuck opening/closing unit when viewed horizontally.

FIG. 7 is a schematic view of one of the movable pins 212 and a chuck opening/closing unit 276 when viewed horizontally. The movable pin 212 includes a second lower shaft portion 274 coupled to the rotational ring 211 in a manner rotatable about a rotational axis A2 and extending in the vertical direction and a second upper shaft portion 275 fixed to the second lower shaft portion 274 with the central axis thereof being eccentric with respect to the rotational axis A2. The second upper shaft portion 275 has a cylindrical surface 275a contactable with the peripheral end of the substrate W. When the second lower shaft portion 274 is rotated, the cylindrical surface 275a of the second upper shaft portion 275 is repositioned between a releasing position at which the cylindrical surface 275a of the second upper shaft portion 275 is set away from the rotational axis A1 of the substrate W (see FIG. 2) and a holding position at which the cylindrical surface 275a of the second upper shaft portion 275 is set closer to the rotational axis A1. The movable pin 212 is connected to the chuck opening/closing unit 276. The chuck opening/closing unit 276 is arranged to start or stop holding the substrate W by repositioning the second upper shaft portion 275 between the releasing position and the holding position.

When the substrate W is held by the multiple fixed pins 210, the peripheral end of the substrate W is in contact with the tapered surface 273 of each fixed pin 210, as shown in FIG. 6. In this state, the second upper shaft portion 275 of each of the multiple movable pins 212 is repositioned from the releasing position to the holding position (see FIG. 7). When the second upper shaft portion 275 is thus repositioned from the releasing position to the holding position, the cylindrical surface 275a comes into contact with the peripheral end of the substrate W and the portion in contact with the cylindrical surface 275a (a portion of the peripheral end of the substrate W) is pressed toward the inside of the substrate W. This causes the portion positioned opposite to the contact portion with respect to the rotational axis A1 (another portion of the peripheral end of the substrate W) to be pressed against the first upper shaft portion 272 of the fixed pin 210 positioned opposite to the movable pin 212 with respect to the rotational axis A1. When the second upper shaft portion 275 of each of the multiple movable pins 212 is thus repositioned from the releasing position to the holding position, the multiple movable pins 212 are repositioned from an open position (see FIG. 10 to be described hereinafter) to a closed position (see FIG. 8 to be described hereinafter). This causes the substrate W to be held in the horizontal attitude by the multiple fixed pins 210 and the multiple movable pins 212.

It is noted that instead of pressing the peripheral end of the substrate W with the cylindrical surface 275a, the cylindrical surface 275a of each of the multiple movable pins 212 may have a V-shaped groove opposed to the rotational axis A1 and opened horizontally. Even with the multiple movable pins 212, the substrate W can be held by bringing the upper and lower tapered surfaces constituting the V-shaped groove into contact with the peripheral end of the substrate W.

Figure 8:
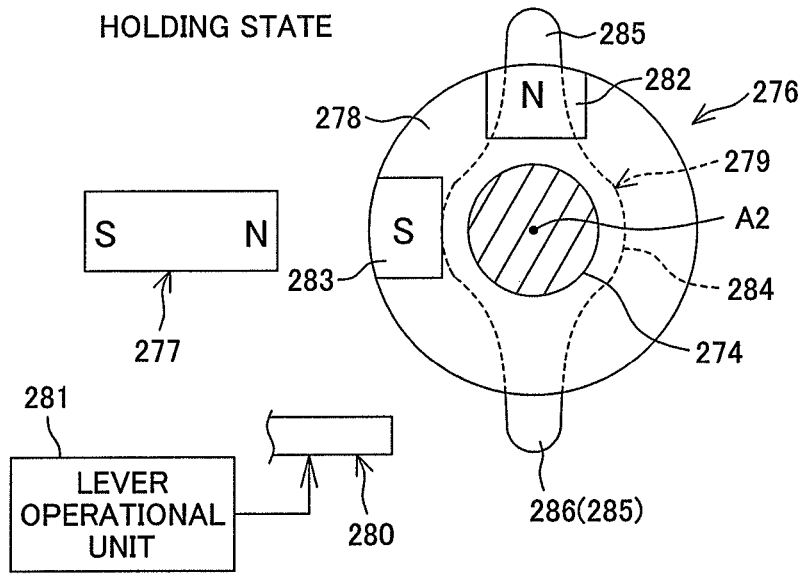
FIG. 8 is a schematic cross-sectional view taken along the line VIII-VIII in FIG. 7, showing a state where the movable pin is at a closed position.
Figure 9:
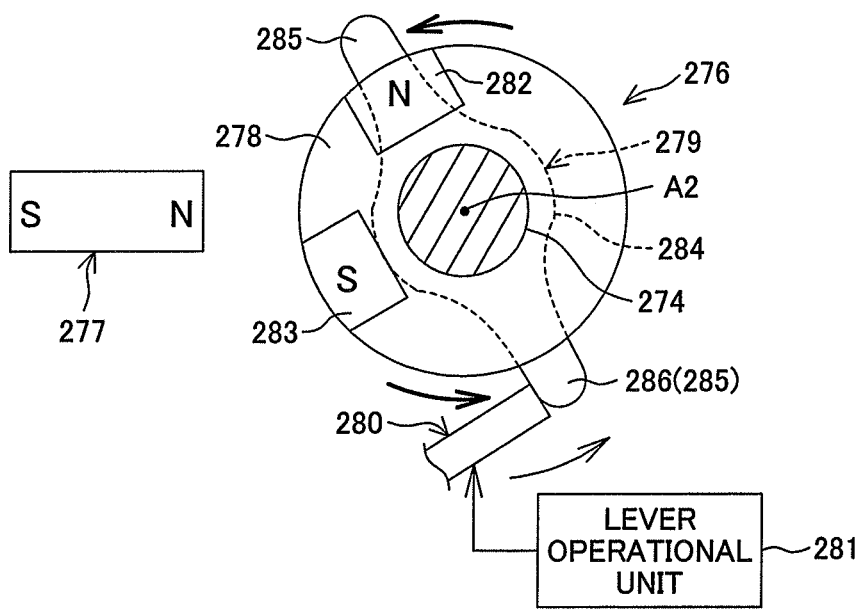
FIG. 9 is a schematic view showing a state where the movable pin moves from the closed position to an open position.
Figure 10:
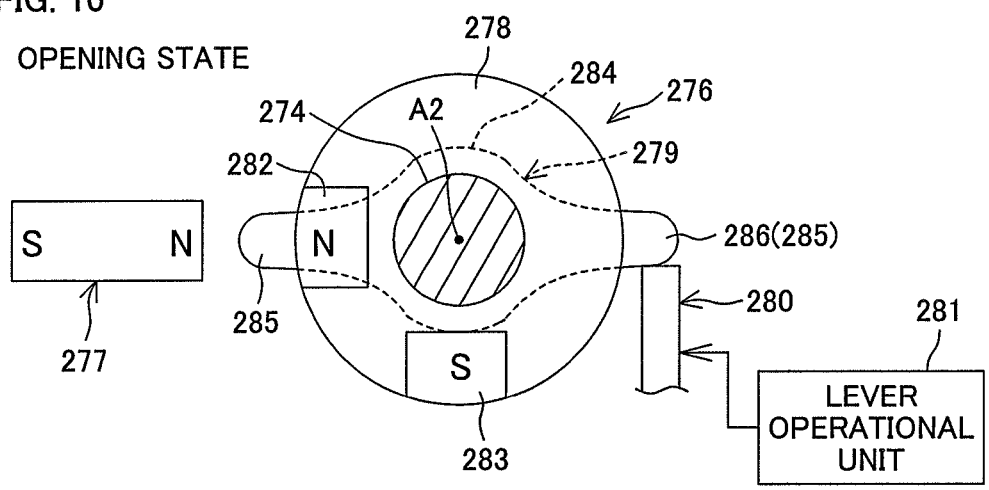
FIG. 10 is a schematic view showing a state where the movable pin is at the open position.

FIGS. 8 to 10 are cross-sectional views taken along the line VIII-VIII in FIG. 7. FIG. 8 is a schematic view showing a state where the movable pin 212 is at the closed position.

FIG. 9 is a schematic view showing a state where the movable pin 212 moves from the closed position to the open position. FIG. 10 is a schematic view showing a state where the movable pin 212 is at the open position. The arrangement of the chuck opening/closing unit 276 will be described with reference to FIGS. 7 to 10.

The chuck opening/closing unit 276 is a constantly-closing unit arranged to move the movable pin 212 from the closed position to the open position only when it is necessary. The chuck opening/closing unit 276 includes a driving permanent magnet 277, a pin-side permanent magnet 278, an operating ring 279, an operating lever 280, and a lever operational unit 281.

The driving permanent magnet 277 is disposed on the upper surface 211a of the rotational ring 211 on the outside of the second lower shaft portion 274 of the movable pin 212. The driving permanent magnet 277 is fixed to the upper surface 211a such that, for example, the magnetic pole direction follows the radial direction of rotation of the first substrate holding unit 205. In this preferred embodiment, the N pole of the driving permanent magnet 277 is directed toward the inside of the hot plate 206. On the other hand, the S pole of the driving permanent magnet 277 is directed toward the outside of the hot plate 206.

The pin-side permanent magnet 278 is a thick annular or cylindrical magnet. The pin-side permanent magnet 278 is fitted and fixed on an intermediate portion of the second lower shaft portion 274. The central axis of the pin-side permanent magnet 278 corresponds to the rotational axis A2 of the movable pin 212. The outer peripheral surface of the pin-side permanent magnet 278 is opposed to the N pole of the driving permanent magnet 277. The pin-side permanent magnet 278 is provided with an N polar portion 282 and an S polar portion 283 at their respective different circumferential positions. In this preferred embodiment, the S polar portion 283 is, for example, about 90 degrees off the N polar portion 282 counterclockwise centering on the rotational axis A2 in a plan view in which the movable pin 212 is viewed from above.

The operating ring 279 is fitted and fixed on the second lower shaft portion 274 between the upper surface 211a of the rotational ring 211 and the pin-side permanent magnet 278. The central axis of the operating ring 279 corresponds to the rotational axis A2 of the movable pin 212.

The operating ring 279 includes a columnar portion 284 and a pair of flared pieces 285. The pair of flared pieces 285 are disposed opposite to each other by 180 degrees with respect to the rotational axis A2 and extend outward in the radial direction of rotation from the columnar portion 284. One of the pair of flared pieces 285 is a to-be-operated piece 286 to come into contact with and be operated by the operating lever 280. The other of the pair of flared pieces 285 is positioned over the N polar portion 282 of the pin-side permanent magnet 278. The operating ring 279 is provided in a manner integrally rotatable with the pin-side permanent magnet 278. When the operating ring 279 is rotated, the portion of the outer peripheral surface of the pin-side permanent magnet 278 opposed to the N pole of the driving permanent magnet 277 is rotated.

The operating lever 280 is disposed in a space below the hot plate 206. The operating lever 280 is formed in a crank shape corresponding to the concavo-convex shape of the lower surface of the hot plate 206 so as not to come into contact with the hot plate 206. The operating lever 280 has, for example, a rod-shaped leading end portion 280a. The leading end portion 280a of the operating lever 280 extends outward from the hot plate 206 (away from the rotational axis A1). The operating lever 280 is provided in a manner slidably movable in a predetermined horizontal direction. The leading end portion 280a of the operating lever 280 is arranged to press and rotate the to-be-operated piece 286 to move the movable pin 212 from the closed position to the open position.

The operating lever 280 is coupled with the lever operational unit 281. The lever operational unit 281 is an air cylinder including, for example, a cylinder main body held on the hot plate 206 and a rod movable with respect to the cylinder main body, though not shown. When the lever operational unit 281 is driven, the operating lever 280 is slidably moved horizontally between a retracted position at which the leading end portion 280a is retracted laterally to the to-be-operated piece 286 (as shown in FIG. 8) and a released position to be described hereinafter (as shown in FIG. 10).

As shown in FIGS. 7 and 8, when the movable pin 212 is at the closed position, the second upper shaft portion 275 is located at the holding position. At the closed position, the N pole of the driving permanent magnet 277 and the S polar portion 283 of the pin-side permanent magnet 278 are opposed to each other. On the other hand, as shown in FIG. 10, when the movable pin 212 is at the open position, the second upper shaft portion 275 is located at the releasing position. At the open position, the N pole of the driving permanent magnet 277 and the N polar portion 282 of the pin-side permanent magnet 278 are opposed to each other. The releasing position of the second upper shaft portion 275 is rotated counterclockwise by about 90 degrees from the holding position of the second upper shaft portion 275 centering on the rotational axis A2 in a plan view.

As shown in FIG. 8, when the movable pin 212 is at the closed position, the N pole of the driving permanent magnet 277 and the S polar portion 283 of the pin-side permanent magnet 278 are opposed to each other. Accordingly, an attractive magnetic force in the radial direction of the pin-side permanent magnet 278 occurs between the driving permanent magnet 277 and the S polar portion 283 of the pin-side permanent magnet 278. As a result, when the movable pin 212 is at the closed position, the pin-side permanent magnet 278 is kept in an attitude in which the N polar portion 282 is opposed to the driving permanent magnet 277. This causes the second upper shaft portion 275 to be kept in holding position. When the movable pin 212 is at the closed position, the operating lever 280 is retracted by the lever operational unit 281 to the retracted position.

As shown in FIG. 9, when the lever operational unit 281 moves the operating lever 280 to cause the leading end portion 280a of the operating lever 280 to come into contact with the to-be-operated piece 286, the movable pin 212 moves from the closed position to the open position. The lever operational unit 281 continues moving the operating lever 280 even after coming into contact with the to-be-operated piece 286. The leading end portion 280a of the operating lever 280 rotates counterclockwise centering on the rotational axis A2 while remaining in contact with the to-be-operated piece 286 in a plan view. This causes the to-be-operated piece 286 to rotate about the rotational axis A2 against the attractive magnetic force between the driving permanent magnet 277 and the pin-side permanent magnet 278. With the rotation of the to-be-operated piece 286, the second lower shaft portion 274 and the second upper shaft portion 275 also rotate about the rotational axis A2. As the operating lever 280 moves to the released position, the second upper shaft portion 275 is repositioned to the releasing position and thereby the movable pin 212 takes the open position.

As shown in FIG. 10, when the movable pin 212 is at the open position, the operating lever 280 is kept at the releasing position by the lever operational unit 281. Also, the N pole of the driving permanent magnet 277 and the N polar portion 282 of the pin-side permanent magnet 278 are opposed to each other. Accordingly, a repulsive magnetic force occurs between the driving permanent magnet 277 and the pin-side permanent magnet 278. The repulsive magnetic force acts on the pin-side permanent magnet 278 in the circumferential direction. More specifically, a clockwise force in a plan view acts on the pin-side permanent magnet 278. However, since the operating lever 280 is engaged with the to-be-operated piece 286, neither the second upper shaft portion 275 nor the to-be-operated piece 286 rotates. As a result, the second upper shaft portion 275 remains kept at the releasing position.

When the movable pin 212 moves from the open position to the closed position, the lever operational unit 281 moves and retracts the operating lever 280 to the retracted position. As described above, when the second upper shaft portion 275 is at the releasing position, a clockwise force acts on the pin-side permanent magnet 278. Accordingly, when the operating lever 280 is put back to the retracted position and the engagement between the leading end portion 280a of the operating lever 280 and the to-be-operated piece 286 is released, the pin-side permanent magnet 278 rotates clockwise in a plan view. This causes the second upper shaft portion 275 to be repositioned from the releasing position to the holding position. This in turn causes the movable pin 212 to be repositioned to the closed position.

It is noted that the driving permanent magnet 277 disposed on the upper surface 211a of the rotational ring 211 may have an inverted polar direction of the N pole and the S pole. With this inversion, the pin-side permanent magnet 278 may also have an inverted polar direction of the N polar portion 282 and the S polar portion 283.

Also, in the above-described example, when the second upper shaft portion 275 is at the releasing position, a repulsive magnetic force acts between the driving permanent magnet 277 and the pin-side permanent magnet 278, while when the second upper shaft portion 275 is at the holding position, an attractive magnetic force acts between the driving permanent magnet 277 and pin-side permanent magnet 278.

However, the driving permanent magnet 277 and the pin-side permanent magnet 278 may be arranged such that when the second upper shaft portion 275 is at the releasing position, an attractive magnetic force acts between the driving permanent magnet 277 and the pin-side permanent magnet 278, while when the second upper shaft portion 275 is at the holding position, a repulsive magnetic force acts between the driving permanent magnet 277 and the pin-side permanent magnet 278.

As shown in FIG. 1, the controller 3 is constituted by, for example, a microcomputer. The controller 3 is arranged to control the operation of the ring rotating unit 213, the extension/contraction driving unit 225, the plate raising/lowering unit 216, the arm swinging unit 230, the lid raising/lowering unit 254, the chuck opening/closing unit 276, the lever operational unit 281, and the like according to a predefined program. The controller 3 is also arranged to adjust the power to be supplied to the heater 215. The controller 3 is further arranged to control the opening/closing of the first chemical solution lower valve 221, the second chemical solution lower valve 222, the rinse liquid lower valve 223, the first chemical solution valve 232, the second chemical solution valve 233, the rinse liquid valve 236, the rinse liquid upper valve 248, the organic solvent valve 250, the nitrogen gas valve 252, and the like.

Figure 11:
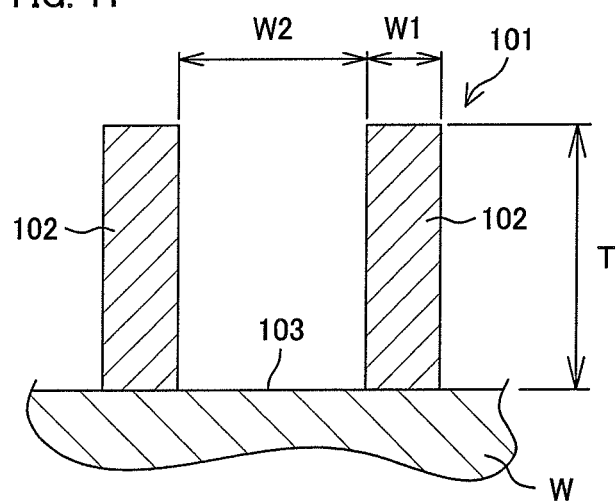
FIG. 11 is an enlarged cross-sectional view showing a surface of a substrate to be processed.

FIG. 11 is an enlarged cross-sectional view showing a surface of a substrate W to be processed by the processing unit 202. The substrate W to be processed is, for example, a silicon wafer. A pattern 101 is formed in a surface (upper surface 100), that is, a pattern formed surface of the substrate W.

As shown in FIG. 11, the pattern 101 may have convex (columnar) structures 102 arranged in a matrix manner. In this case, the width W1 of the structures 102 is, for example, about 10 to 45 nm. The gap W2 of the pattern 101 is, for example, about 10 nm to a few micrometers. The film thickness T of the pattern 101 is, for example, about 50 nm to 5 μm. The aspect ratio (the ratio of the film thickness T to the width W1) of the pattern 101 may be, for example, about 5 to 500 (typically about 5 to 50).

The pattern 101 includes, for example, an insulating film. The pattern 101 may also include a conductor film. More specifically, the pattern 101 may be formed of a multi-layer film of multiple layered films. The multi-layer film may include an insulating film and a conductor film. The pattern 101 may alternatively be formed of a single-layer film. The insulating film may be a silicon oxide film ($SiO_2$ film) or a silicon nitride film (SiN film). The conductor film may be an amorphous silicon film into which impurities are introduced for resistance reduction or a metal film (metal wiring film, for example).

It is noted that the pattern 101 may include repetitively arranged linear patterns each defined by a fine trench. Alternatively, the pattern 101 may be defined by providing multiple fine holes (voids or pores) in a thin film.

Figure 12:
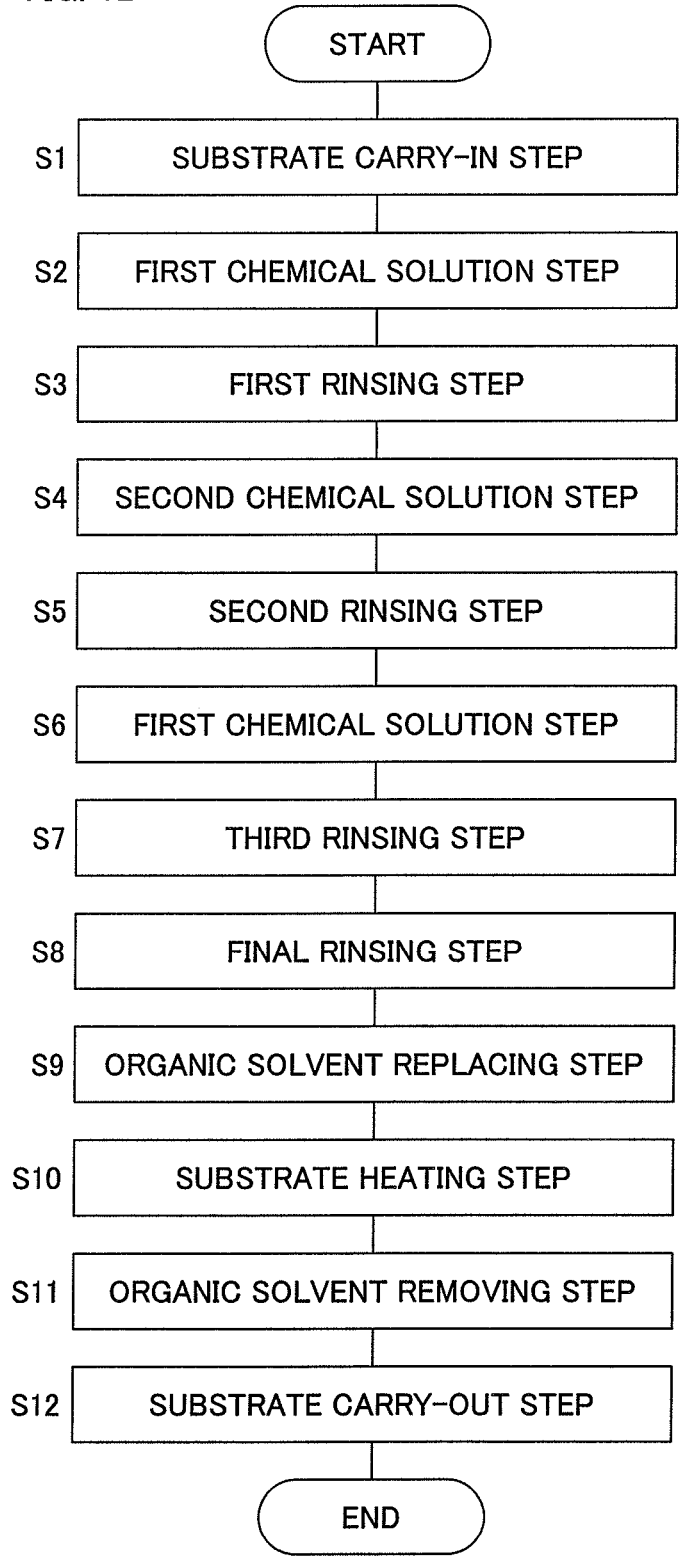
FIG. 12 is a process chart for illustrating a first example of processing to be performed on the substrate in the processing unit.
Figure 17:
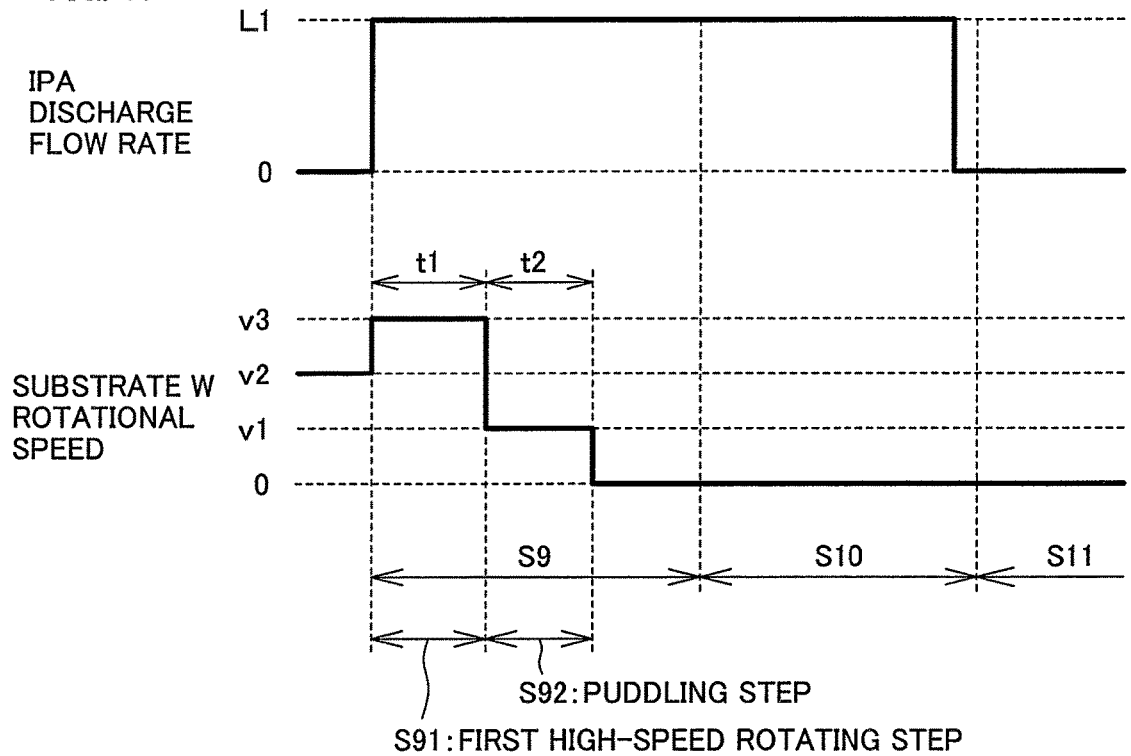
FIG. 17 shows the change in the discharge flow rate of IPA and the change in the rotational speed of the substrate in an organic solvent replacing step, the substrate heating step, and the organic solvent removing step.

FIG. 12 is a process chart for illustrating a first example of processing to be performed on the substrate W in the processing unit 202. FIGS. 13A to 13I are schematic views for illustrating the first example of processing. FIGS. 14A to 14D are schematic cross-sectional views for illustrating the condition of the upper surface of the substrate W in the first example of processing. FIGS. 15 and 16 are vertical cross-sectional views of the first substrate holding unit 205 and the second substrate holding unit 206b when viewed horizontally. FIG. 15 shows a substrate heating step (S10) and FIG. 16 shows an organic solvent removing step (S11). FIG. 17 shows the change in the discharge flow rate of IPA and the change in the rotational speed of the substrate W in an organic solvent replacing step (S9), the substrate heating step (S10), and the organic solvent removing step (S11).

Hereinafter, reference will be made to FIGS. 1 and 2. Reference to FIGS. 11 to 17 will be made appropriately. It is noted that "the front surface (upper surface) of the substrate W" in the description below includes the front surface (upper surface) of the substrate W itself and the front surface (upper surface) of the pattern 101.

For processing of the substrate W in the processing unit 202, a substrate carry-in step (step S1) is performed to carry the unprocessed substrate W into the outer chamber 204. Prior to the substrate carry-in step (S1), the controller 3 sets the heater 215 ON (energized) and locates the hot plate 206 at the lower position, at which the hot plate 206 is retracted substantially downward from the position at which the substrate W is to be held on the first substrate holding unit 205. The controller 3 also retracts all the nozzles from above the first substrate holding unit 205. The controller 3 also causes all the movable pins 212 to have a releasing state.

In the substrate carry-in step (S1), the controller 3 causes a hand H of the delivery robot CR holding the substrate W (see FIG. 1) to enter the outer chamber 204 and causes the delivery robot CR to place the substrate W on the first substrate holding unit 205. This causes the underside of the substrate W to be supported by the multiple fixed pins 210 of the first substrate holding unit 205 with the pattern formed surface (front surface) facing upward. Thereafter, the controller 3 moves all the multiple movable pins 212 to the closed position. This causes the substrate W to be held horizontally by the multiple fixed pins 210 and the multiple movable pins 212, as shown in FIG. 13A (only the fixed pins 210 are shown in FIG. 13A). After the substrate W is transferred to the first substrate holding unit 205, the controller 3 retracts the hand H of the delivery robot CR from inside the outer chamber 204.

After the substrate W is thus held by the multiple fixed pins 210 and the multiple movable pins 212, the controller 3 controls the ring rotating unit 213 to start rotating the substrate W. The rotational speed of the substrate W is increased to a predefined liquid processing rotational speed v2 (about 300 to 500 rpm, for example, see FIG. 17) and kept at the liquid processing rotational speed v2.

It is noted that the heater 215 is controlled to be ON and the hot plate 206 is caused to produce heat as in the substrate carry-in step (S1). However, since the space between the hot plate 206 at the lower position and the substrate W held on the first substrate holding unit 205 is sufficiently large, heat from the hot plate 206 cannot be transferred sufficiently to the substrate W.

Next, a first chemical solution step (step S2) is performed to supply the first chemical solution onto the substrate W.

Figure 13B:
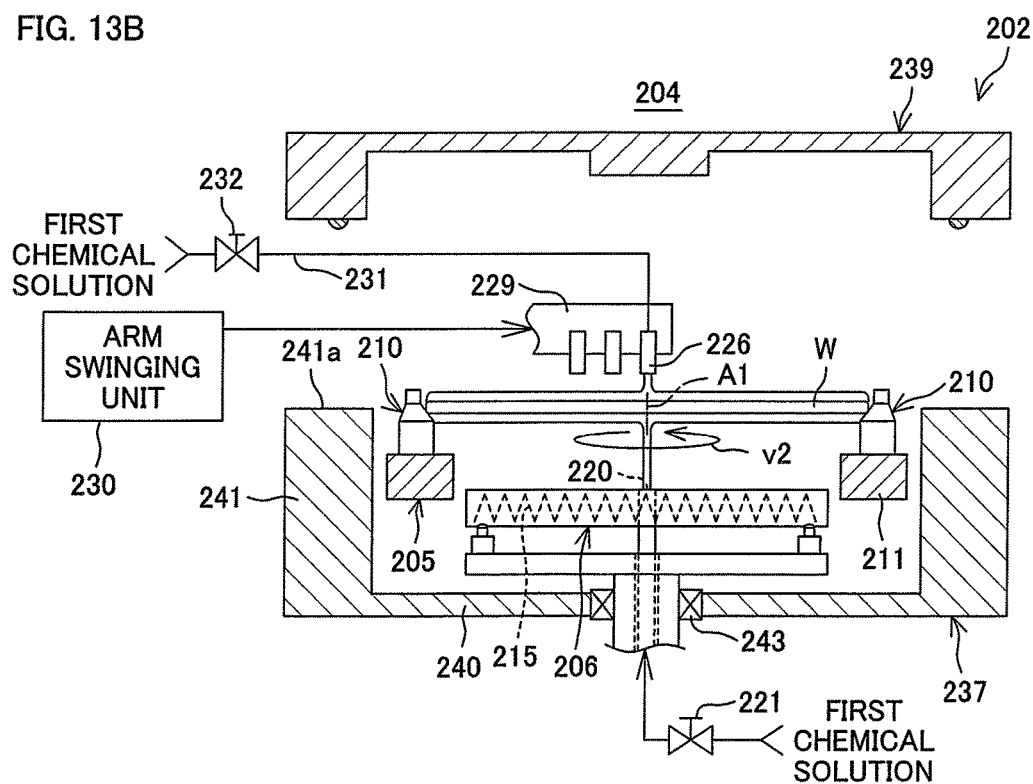
FIG. 13B is a schematic view for illustrating a step following that shown in FIG. 13A.

Specifically, as shown in FIG. 13B, the controller 3 controls the arm swinging unit 230 to swing the arm 229 from its home position and move the first chemical solution nozzle 226 from its retracted position to over the substrate W. This causes the first chemical solution nozzle 226 to be located at its processing position (at which the first chemical solution nozzle 226 is opposed to the central portion of the upper surface of the substrate W). After the first chemical solution nozzle 226 is thus located at the processing position, the controller 3 opens the first chemical solution valve 232 while closing the second chemical solution valve 234 and the rinse liquid valve 236. This causes the first chemical solution to be discharged through the discharge port of the first chemical solution nozzle 226. The controller 3 also opens the first chemical solution lower valve 221 while closing the second chemical solution lower valve 222 and the rinse liquid lower valve 223. This causes the first chemical solution to be discharged upward through the lower discharge port 220.

The first chemical solution supplied onto the central portion of the upper surface of the substrate W undergoes a centrifugal force due to the rotation of the substrate W to flow on the upper surface of the substrate W toward the peripheral portion of the substrate W. On the other hand, the first chemical solution supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with and processed by the first chemical solution. The first chemical solution reaching the peripheral portions of the upper surface and the lower surface of the substrate W splatters laterally from the substrate W. As a result, droplets of the first chemical solution fly outward from the peripheral portions of the substrate W.

The first chemical solution splattering from the peripheral portions of the substrate W is received by and runs down the inner wall of the peripheral wall portion 241 of the chamber main body 237 to collect at the bottom of the chamber main body 237. The first chemical solution collecting at the bottom of the chamber main body 237 is sent through the waste liquid passage (not shown) to the waste liquid equipment (not shown) to be processed. The first chemical solution may be sent not to the waste liquid equipment but to recovery equipment to be reused.

When a predefined time has elapsed since the start of the discharge of the first chemical solution, the controller 3 closes the first chemical solution valve 232 and the first chemical solution lower valve 221 to stop the discharge of the first chemical solution through the first chemical solution nozzle 226 and the lower discharge port 220.

Next, a first rinsing step (step S3) is performed to remove the first chemical solution from the substrate W.

Figure 13C:
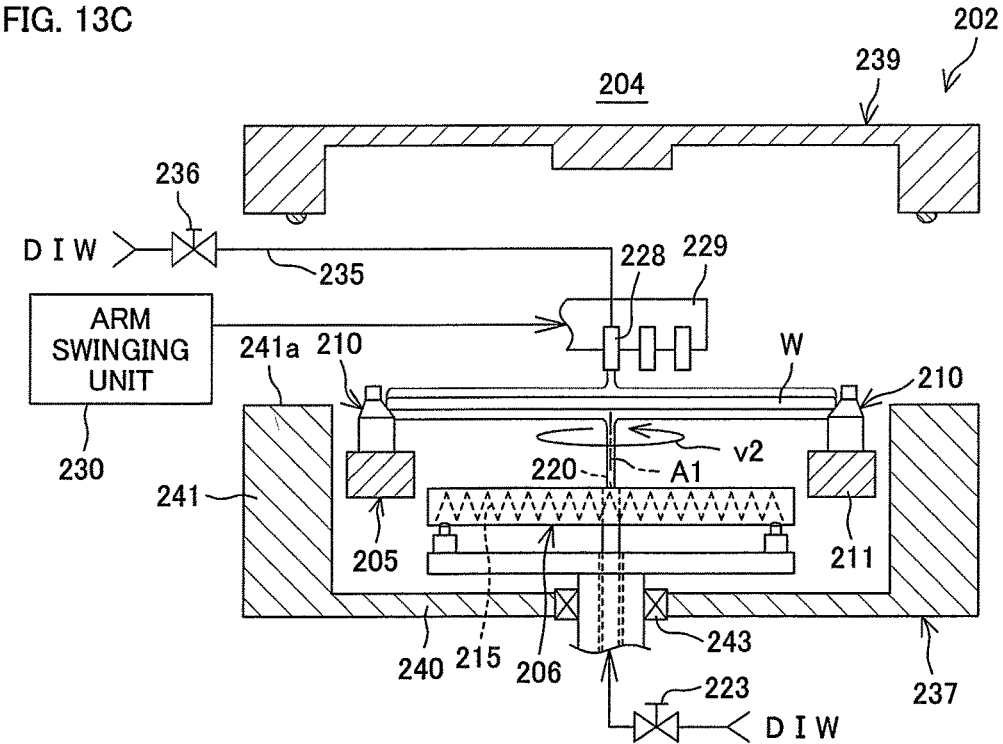
FIG. 13C is a schematic view for illustrating a step following that shown in FIG. 13B.

Specifically, as shown in FIG. 13C, the controller 3 controls the arm swinging unit 230 to swing the arm 229 and locate the rinse liquid nozzle 228 at its processing position. After the rinse liquid nozzle 228 is thus located at the processing position, the controller 3 opens the rinse liquid valve 236 while closing the first chemical solution valve 232 and the second chemical solution valve 234. This causes rinse liquid to be discharged through the discharge port of the rinse liquid nozzle 228. The controller 3 also opens the rinse liquid lower valve 223 while closing the first chemical solution lower valve 221 and the second chemical solution lower valve 222. This causes rinse liquid to be discharged upward through the lower discharge port 220.

The rinse liquid supplied onto the central portion of the upper surface of the substrate W undergoes a centrifugal force due to the rotation of the substrate W to flow on the upper surface of the substrate W toward the peripheral portion of the substrate W. On the other hand, the rinse liquid supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with the rinse liquid and the first chemical solution adhering to the upper surface and the lower surface of the substrate W to be rinsed off. The rinse liquid reaching the peripheral portions of the upper surface and the lower surface of the substrate W splatters laterally from the substrate W. As a result, droplets of the rinse liquid fly outward from the peripheral portions of the substrate W.

The rinse liquid splattering from the peripheral portions of the substrate W is received by and runs down the inner wall of the peripheral wall portion 241 of the chamber main body 237 to collect at the bottom of the chamber main body 237. The rinse liquid collecting at the bottom of the chamber main body 237 is sent through the waste liquid passage (not shown) to the waste liquid equipment (not shown) to be processed.

When a predefined time has elapsed since the start of the discharge of the rinse liquid, the controller 3 closes the rinse liquid valve 236 and the rinse liquid lower valve 223 to stop the discharge of the rinse liquid through the rinse liquid nozzle 228 and the lower discharge port 220.

Next, a second chemical solution step (step S4 in FIG. 12) is performed to supply the second chemical solution onto the substrate W.

Figure 13D:
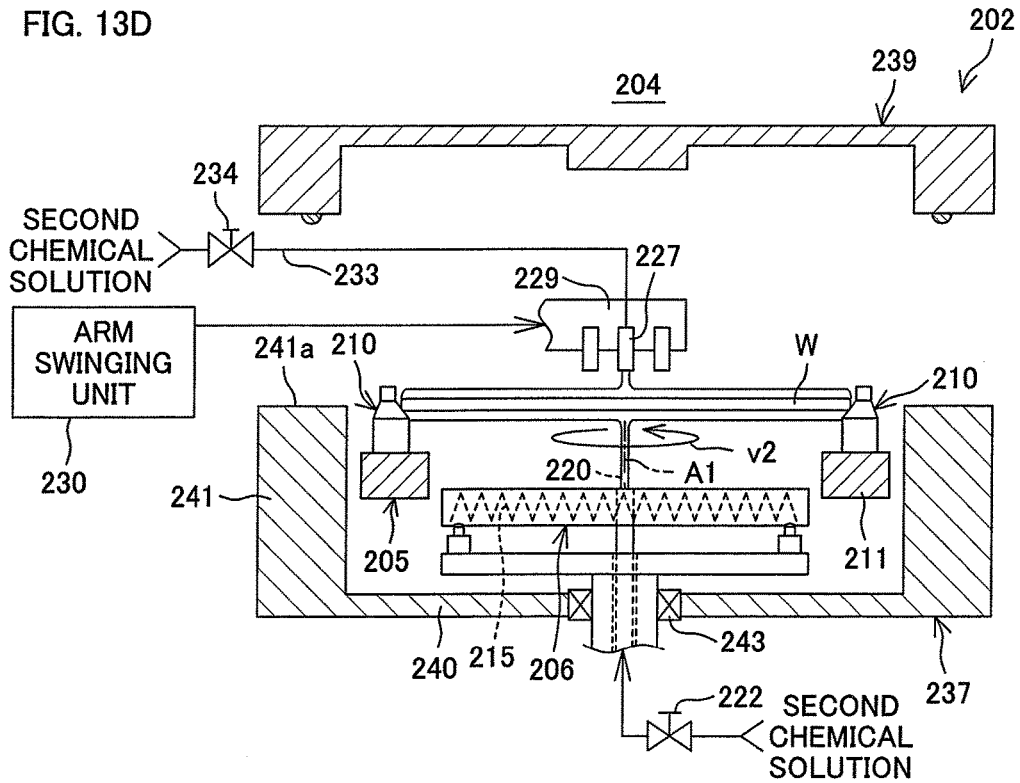
FIG. 13D is a schematic view for illustrating a step following that shown in FIG. 13C.

Specifically, as shown in FIG. 13D, the controller 3 controls the arm swinging unit 230 to swing the arm 229 and locate the second chemical solution nozzle 227 at its processing position. After the second chemical solution nozzle 227 is thus located at the processing position, the controller 3 opens the second chemical solution valve 234 while closing the first chemical solution valve 232 and the rinse liquid valve 236. This causes the second chemical solution to be discharged through the discharge port of the second chemical solution nozzle 227. The controller 3 also opens the second chemical solution lower valve 222 while closing the first chemical solution lower valve 221 and the rinse liquid lower valve 223. This causes the second chemical solution to be discharged upward through the lower discharge port 220.

The second chemical solution supplied onto the central portion of the upper surface of the substrate W undergoes a centrifugal force due to the rotation of the substrate W to flow on the upper surface of the substrate W toward the peripheral portion of the substrate W. On the other hand, the second chemical solution supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with and processed by the second chemical solution. The second chemical solution reaching the peripheral portions of the upper surface and the lower surface of the substrate W splatters laterally from the substrate W. As a result, droplets of the second chemical solution fly outward from the peripheral portions of the substrate W.

The second chemical solution splattering from the peripheral portions of the substrate W is received by and runs down the inner wall of the peripheral wall portion 241 of the chamber main body 237 to collect at the bottom of the chamber main body 237. The second chemical solution collecting at the bottom of the chamber main body 237 is sent through the waste liquid passage (not shown) to the waste liquid equipment (not shown) to be processed. The second chemical solution may be sent not to the waste liquid equipment but to recovery equipment to be reused.

When a predefined time has elapsed since the start of the discharge of the second chemical solution, the controller 3 closes the second chemical solution valve 234 and the second chemical solution lower valve 222 to stop the discharge of the second chemical solution through the second chemical solution nozzle 227 and the lower discharge port 220.

Next, a second rinsing step (step S5 in FIG. 12, see FIG. 13C again) is performed to remove the second chemical solution from the substrate W.

Specifically, the controller 3 controls the arm swinging unit 230 to swing the arm 229 and locate the rinse liquid nozzle 228 at its processing position. After the rinse liquid nozzle 228 is thus located at the processing position, the controller 3 opens the rinse liquid valve 236 while closing the first chemical solution valve 232 and the second chemical solution valve 234. This causes rinse liquid to be discharged through the discharge port of the rinse liquid nozzle 228. The controller 3 also opens the rinse liquid lower valve 223 while closing the first chemical solution lower valve 221 and the second chemical solution lower valve 222. This causes rinse liquid to be discharged upward through the lower discharge port 220.

The rinse liquid supplied onto the central portion of the upper surface of the substrate W undergoes a centrifugal force due to the rotation of the substrate W to flow on the upper surface of the substrate W toward the peripheral portion of the substrate W. On the other hand, the rinse liquid supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with the rinse liquid and the second chemical solution adhering to the upper surface and the lower surface of the substrate W to be rinsed off. The rinse liquid reaching the peripheral portions of the upper surface and the lower surface of the substrate W splatters laterally from the substrate W. As a result, droplets of the rinse liquid fly outward from the peripheral portions of the substrate W. As described above, the rinse liquid splattering from the peripheral portions of the substrate W is sent to the waste liquid equipment (not shown) to be processed.

When a predefined time has elapsed since the start of the discharge of the rinse liquid, the controller 3 closes the rinse liquid valve 236 and the rinse liquid lower valve 223 to stop the discharge of the rinse liquid through the rinse liquid nozzle 228 and the lower discharge port 220. Next, another first chemical solution step (step S6) is performed to supply first chemical solution onto the substrate W.

Specifically, referring again to FIG. 13B, the controller 3 controls the arm swinging unit 230 to swing the arm 229 and locate the first chemical solution nozzle 226 at its processing position. After the first chemical solution nozzle 226 is thus located at the processing position, the controller 3 opens the first chemical solution valve 232 while closing the second chemical solution valve 234 and the rinse liquid valve 236. This causes the first chemical solution to be discharged through the discharge port of the first chemical solution nozzle 226. The controller 3 also opens the first chemical solution lower valve 221 while closing the second chemical solution lower valve 222 and the rinse liquid lower valve 223. This causes the first chemical solution to be discharged upward through the lower discharge port 220.

The first chemical solution supplied onto the central portion of the upper surface of the substrate W undergoes a centrifugal force due to the rotation of the substrate W to flow on the upper surface of the substrate W toward the peripheral portion of the substrate W. On the other hand, the first chemical solution supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with and processed by the first chemical solution. The first chemical solution reaching the peripheral portions of the upper surface and the lower surface of the substrate W splatters laterally from the substrate W. As a result, droplets of the first chemical solution fly outward from the peripheral portions of the substrate W. As described above, the first chemical solution splattering from the peripheral portions of the substrate W is sent to the waste liquid equipment (not shown) to be processed.

When a predefined time has elapsed since the start of the discharge of the first chemical solution, the controller 3 closes the first chemical solution valve 232 and the first chemical solution lower valve 221 to stop the discharge of the first chemical solution through the first chemical solution nozzle 226 and the lower discharge port 220. Next, a third rinsing step (step S7) is performed to remove the first chemical solution from the substrate W.

Specifically, referring again to FIG. 13C, the controller 3 controls the arm swinging unit 230 to swing the arm 229 and locate the rinse liquid nozzle 228 at its processing position. After the rinse liquid nozzle 228 is thus located at the processing position, the controller 3 opens the rinse liquid valve 236 while closing the first chemical solution valve 232 and the second chemical solution valve 234. This causes rinse liquid to be discharged through the discharge port of the rinse liquid nozzle 228. The controller 3 also opens the rinse liquid lower valve 223 while closing the first chemical solution lower valve 221 and the second chemical solution lower valve 222. This causes rinse liquid to be discharged upward through the lower discharge port 220.

The rinse liquid supplied onto the central portion of the upper surface of the substrate W undergoes a centrifugal force due to the rotation of the substrate W to flow on the upper surface of the substrate W toward the peripheral portion of the substrate W. On the other hand, the rinse liquid supplied onto the central portion of the lower surface of the substrate W undergoes a centrifugal force due to the rotation of the substrate W to flow on the lower surface of the substrate W toward the peripheral portion of the substrate W. This causes the entire upper surface and the entire lower surface of the substrate W to be supplied with the rinse liquid and the first chemical solution adhering to the upper surface and the lower surface of the substrate W to be rinsed off. The rinse liquid reaching the peripheral portions of the upper surface and the lower surface of the substrate W splatters laterally from the substrate W. As a result, droplets of the rinse liquid fly outward from the peripheral portions of the substrate W. As described above, the rinse liquid splattering from the peripheral portions of the substrate W is sent to the waste liquid equipment (not shown) to be processed.

When a predefined time has elapsed since the start of the discharge of the rinse liquid, the controller 3 closes the rinse liquid valve 236 and the rinse liquid lower valve 223 to stop the discharge of the rinse liquid through the rinse liquid nozzle 228 and the lower discharge port 220 and controls the arm swinging unit 230 to put the arm 229 back to the home position. This causes the first chemical solution nozzle 226, the second chemical solution nozzle 227, and the rinse liquid nozzle 228 to be put back to the retracted position.

Figure 13E:
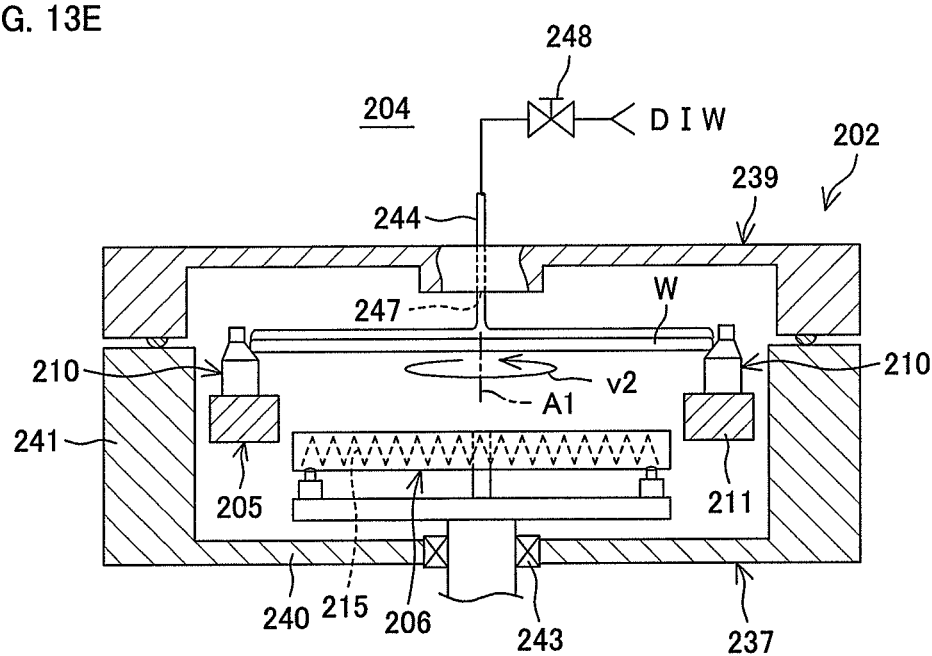
FIG. 13E is a schematic view for illustrating a step following that shown in FIG. 13D.

Next, the controller 3 controls the lid raising/lowering unit 254 to lower the lid member 239 to the lid closed position, as shown in FIG. 13E. The lid member 239 thus lowered to the lid closed position closes the opening 238 of the chamber main body 237. In this state, when the lid member 239 and the chamber main body 237 are coupled using a locking member (not shown), the sealing ring 253, which is disposed in the peripheral portion 239c of the lower surface of the lid member 239, comes into contact with the upper end face 241a of the chamber main body 237 over the entire circumference for sealing between the chamber main body 237 and the lid member 239. This causes the interior space between the chamber main body 237 and the lid member 239 to be sealed. In this state, the rinse liquid discharge port 247, the organic solvent discharge port 249, and the nitrogen gas discharge port 251 are respectively disposed in a manner opposed to the upper surface of the substrate W.

Next, a final rinsing step (step S8) is performed on the substrate W.

Specifically, as shown in FIG. 13E, the controller 3 opens the rinse liquid upper valve 248 to cause rinse liquid to be discharged through the rinse liquid discharge port 247 of the rinse liquid upper pipe 244. The rinse liquid discharged through the rinse liquid discharge port 247 lands on the central portion of the upper surface of the substrate W.

The rinse liquid supplied onto the central portion of the upper surface of the substrate W undergoes a centrifugal force due to the rotation of the substrate W to flow on the upper surface of the substrate W toward the peripheral portion of the substrate W. This causes the entire upper surface of the substrate W to be supplied with the rinse liquid and the upper surface of the substrate W to be rinse-processed.

Figure 14A:
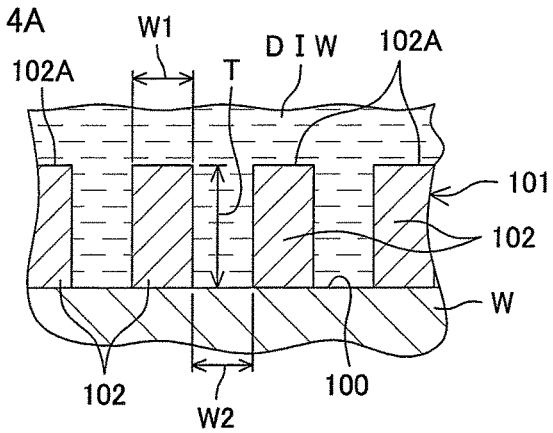
FIG. 14A is a schematic cross-sectional view for illustrating the condition of the upper surface of the substrate in the first example of processing shown in FIG. 12.
Figure 15:
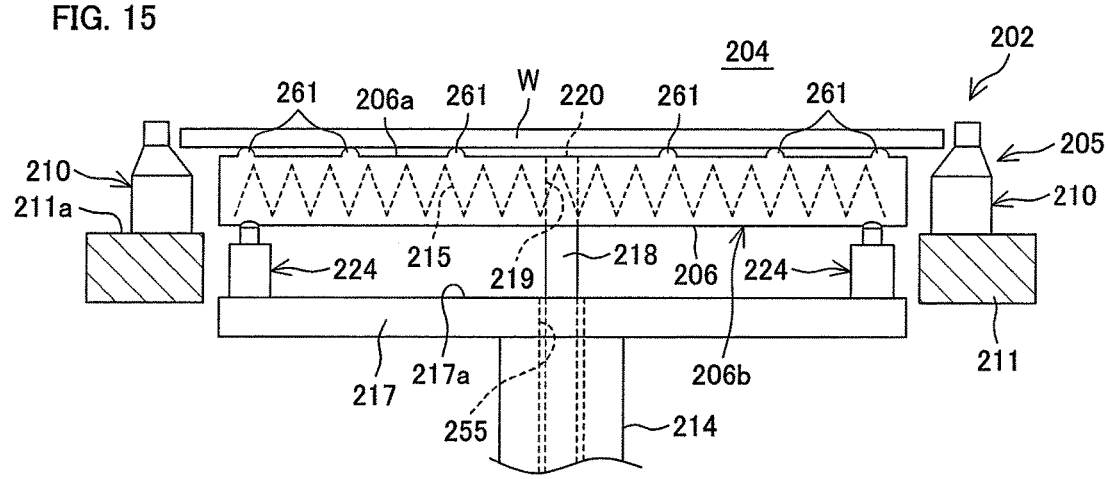
FIG. 15 is a vertical cross-sectional view of the first substrate holding unit and the second substrate holding unit in a substrate heating step when viewed horizontally.

In the final rinsing step (S8), the rinse liquid reaches the bottom of the gap of the pattern 101 formed on the upper surface 100 of the substrate W (fairly close to the upper surface 100 of the substrate W itself in the gap), as shown in FIG. 14A.

The rinse liquid splattering from the peripheral portions of the substrate W is also received by and runs down the inner wall of the peripheral wall portion 241 of the chamber main body 237 to collect at the bottom of the chamber main body 237. The rinse liquid collecting at the bottom of the chamber main body 237 is sent through the waste liquid passage (not shown) to the waste liquid equipment (not shown).

When a predefined time has elapsed since the start of the discharge of the rinse liquid, the controller 3 closes the rinse liquid upper valve 248 to stop the discharge of the rinse liquid through the rinse liquid discharge port 247.

After the completion of the final rinsing step (S8), the controller 3 increases the speed of the substrate W from the liquid processing rotational speed v2 to a higher rotational speed v3 (first rotational speed and second rotational speed. 800 rpm, for example), as shown in FIG. 17. Next, an organic solvent replacing step (step S9) is performed to supply IPA liquid onto the upper surface of the substrate W to replace the rinse liquid on the upper surface of the substrate W with the IPA.

Figure 13F:
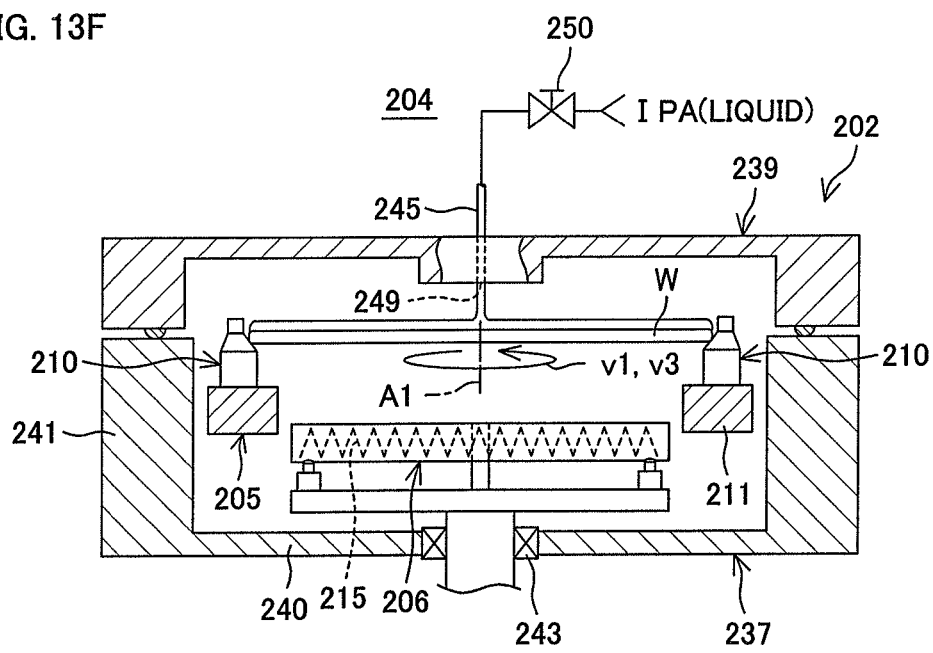
FIG. 13F is a schematic view for illustrating a step following that shown in FIG. 13E.
Figure 13G:
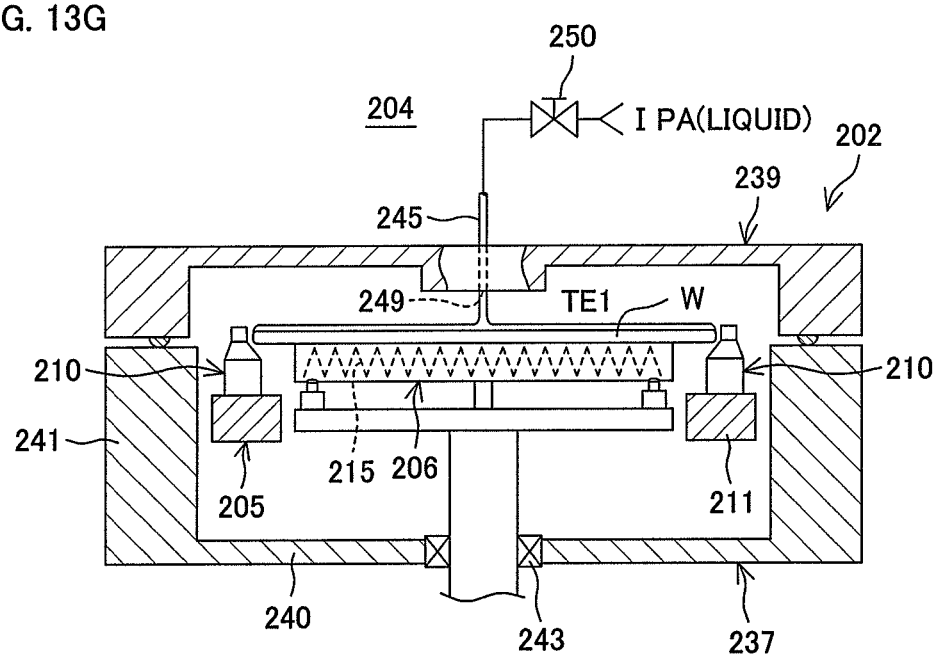
FIG. 13G is a schematic view for illustrating a step following that shown in FIG. 13F.
Figure 13H:
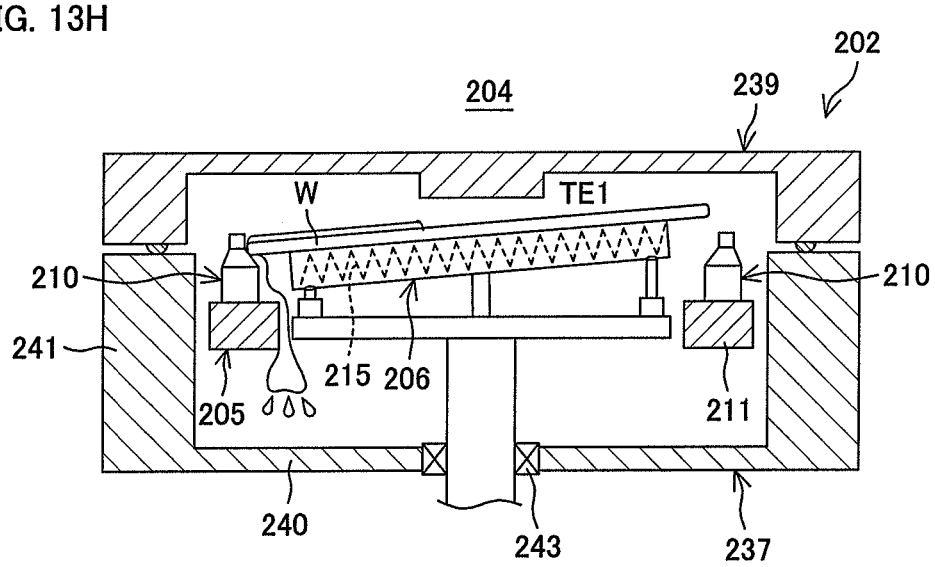
FIG. 13H is a schematic view for illustrating a step following that shown in FIG. 13G.

When the rotational speed of the substrate W reaches the higher rotational speed v3, the controller 3 opens the organic solvent valve 250 to cause IPA liquid to be discharged through the organic solvent discharge port 249 of the organic solvent upper pipe 245, as shown in FIG. 13F. This causes the discharge of IPA to start. The IPA discharged through the organic solvent discharge port 249 is room-temperature (25° C., for example) liquid, that is, having a temperature lower than the boiling point of IPA (82.4° C.). The IPA liquid discharged through the organic solvent discharge port 249 lands on the central portion of the upper surface of the substrate W. With the start of the discharge of IPA, the organic solvent replacing step (S9) starts.

The IPA liquid supplied onto the central portion of the upper surface of the substrate W undergoes a centrifugal force due to the rotation of the substrate W to flow on the upper surface of the substrate W toward the peripheral portion of the substrate W. The IPA liquid supplied onto the central portion of the upper surface of the substrate W can thus spread toward the peripheral portion. This allows the IPA liquid to reach the entire upper surface of the substrate W. During this time, the hot plate 206 is at the lower position and heat from the hot plate 206 is not transferred sufficiently to the substrate W. As a result, the upper surface of the substrate W has, for example, a room temperature, and the IPA liquid flows on the upper surface of the substrate W while remaining at the room temperature.

In parallel with the organic solvent replacing step (S9), the controller 3 performs a first high-speed rotating step (step S91) to rotate the substrate W at the higher rotational speed v3 and, following the first high-speed rotating step (S91), a puddling step (step S92) to rotate the substrate W at a puddling speed v1 (i.e. lower speed near zero, for example, within a range lower than 50 rpm, about 20 rpm, for example), as shown in FIG. 17.

Specifically, the controller 3 rotates the substrate W at the higher rotational speed v3 (first high-speed rotating step (S91)) for a predetermined high-speed rotation time t1 (about 15 seconds, for example) after the start of the organic solvent replacing step (S9). After the high-speed rotation time t1 has elapsed, the controller 3 reduces the rotational speed of the substrate W from the higher rotational speed v3 to the puddling speed v1. With the deceleration of the substrate W, the centrifugal force acting on the IPA liquid on the substrate W decreases, so that the IPA liquid remains on the upper surface of the substrate W without being discharged from the peripheral portion of the substrate W. As a result, an IPA liquid film 111 in a puddle state is maintained on the upper surface of the substrate W (puddling step (S92)). Since the IPA liquid reaches the entire upper surface of the substrate W, the IPA liquid film 111 also covers the entire upper surface of the substrate W. The IPA liquid film 111 has a predetermined film thickness (about 1 mm, for example).

Figure 14B:
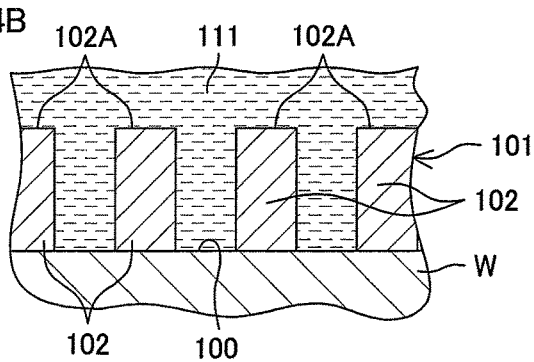
FIG. 14B is a schematic cross-sectional view for illustrating the condition of the upper surface of the substrate in the first example of processing shown in FIG. 12.

The IPA liquid is thus supplied onto the upper surface of the substrate W, with which the rinse liquid existing in the gap of the pattern 101 can be replaced successfully, as shown in FIG. 14B. Also, since the IPA liquid film 111 is thus formed in a manner covering the entire upper surface of the substrate W, the rinse liquid can be replaced successfully with the IPA liquid across the upper surface of the substrate W. After a puddling time t2 (about 15 seconds, for example) has elapsed, the controller 3 controls the ring rotating unit 213 to stop the rotation of the substrate W.

It is noted that unlike the above-described example of rotating the substrate W at the puddling speed v1, a lower speed, in the puddling step (S92), the rotation of the substrate W may be stopped to maintain the rotational speed of the substrate W at zero in the puddling step (S92). In this case, no centrifugal force acts on the IPA liquid on the substrate W in the puddling step (S92), and the IPA liquid remains on the upper surface of the substrate W without being discharged from the peripheral portion of the substrate W, so that an IPA liquid film 111 in a puddle state is maintained on the upper surface of the substrate W.

After the organic solvent replacing step (S9), a substrate heating step (step S10) is performed.

The controller 3 controls the plate raising/lowering unit 216 to raise the hot plate 206 from the lower position (as shown in FIG. 13F) to the upper position (as shown in FIG. 13G). The hot plate 206, when raised to the same height as the rotational ring 211, comes into contact with the lower surface of the substrate W. When the controller 3 continuously raises the hot plate 206, the substrate W moves away from the first substrate holding unit 205 to be held only on the hot plate 206. The substrate W is thus transferred from the first substrate holding unit 205 to the hot plate 206. The substrate W transferred to the hot plate 206 is supported by the multiple support pins 261. Even after the substrate W is thus transferred, the hot plate 206 continues to be raised to reach the upper position, at which the raising of the hot plate 206 is stopped. FIGS. 13G and 15 show the state where the hot plate 206 is located at the upper position.

Since the heater 215 is controlled to be constantly ON, the hot plate 206 produces heat (on the substrate opposing surface 206a). When the substrate W is placed on the hot plate 206, heat from the substrate opposing surface 206a is provided to the lower surface of the substrate W. This causes the substrate W to be heated and thereby the IPA liquid film 111 on the substrate W to be also heated. The amount of heat per unit area provided to the substrate W is approximately the same across the substrate W.

In the substrate heating step (S10), the hot plate 206 heating the substrate W causes the upper surface of the substrate W to be heated to a predefined liquid film raising temperature (first temperature) TE1. The liquid film raising temperature TE1 is set at a predetermined temperature within a range, for example, 10 to 50° C. higher than the boiling point of IPA (82.4° C.). Although the IPA liquid film 111 is raised from the upper surface of the substrate W in the substrate heating step (S10), as will be described below, the liquid film raising temperature TE1 is a temperature at which the raised IPA liquid film 111 cannot come to a boil.

The temperature of the upper surface of the substrate W (the upper surface of the pattern 101 (see FIG. 14C, for example), more particularly the upper end face 102A of each structure 102), after having reached the liquid film raising temperature TE1, is kept at the liquid film raising temperature TE1. The entire upper surface of the substrate W is kept at the liquid film raising temperature TE1. During this time, the amount of heat generation per unit time from the heater 215 is set such that the upper surface of the substrate W placed on the hot plate 206 is kept at the liquid film raising temperature TE1.

When a period of time has elapsed after the temperature of the upper surface of the substrate W reaches the liquid film raising temperature TE1, the gap of the pattern 101 is filled with IPA vapor generated from the IPA liquid film 111. Further, the IPA vapor forms an IPA gaseous phase 112 in a space over the upper surface of the substrate W (the upper end face 102A of each structure 102). This causes the IPA liquid film 111 to be raised from the upper surface of the substrate W (the upper end face 102A of each structure 102) (see FIG. 14C). The gap of the pattern 101 is also filled with the IPA gaseous phase 112.

For example, if the gap of the pattern 101 is filled with the IPA liquid and when the substrate W is dried in this state, a force (surface tension) attracting adjacent structures 102 to each other is added. As a result, the pattern 101 may be destroyed.

Figure 14C:
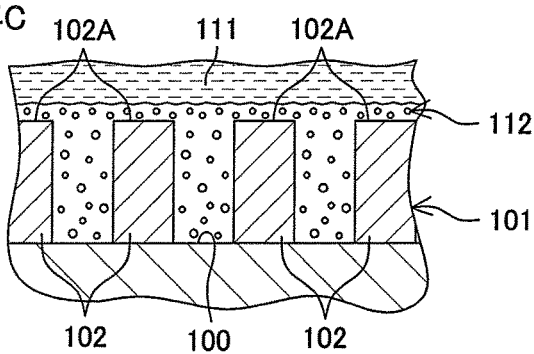
FIG. 14C is a schematic cross-sectional view for illustrating the condition of the upper surface of the substrate in the first example of processing shown in FIG. 12.

On the other hand, in the state of FIG. 14C, the gap of the pattern 101 is filled with the IPA gaseous phase 112. It is therefore possible to suppress or prevent destruction of the pattern 101 due to a surface tension.

In the state of FIG. 14C, since the IPA liquid film 111 is raised from the upper surface of the substrate W (the upper end face 102A of each structure 102), a frictional force of approximately zero is generated between the upper surface of the substrate W and the IPA liquid film 111.

The substrate heating step (S10) is set to have a duration during which, at least, the IPA liquid in the gap of the pattern 101 is completely vaporized and the IPA liquid film 111 is raised across the upper surface of the substrate W. The duration of operation of the substrate heating step (S10) means a time since the hot plate 206 had held the substrate W thereon. In the first example of processing, the duration of operation of the substrate heating step (S10) is, for example, 1 to 2 minutes.

If the pattern 101 has a high aspect ratio, the contact area between the IPA liquid and the structures 102 increases. In this case, the amount of the IPA liquid existing in the space between two adjacent structures 102 also increases, which requires a larger amount of heat to vaporize the IPA liquid. It is therefore desirable to adjust the liquid film raising temperature TE1 and/or the substrate heating time according to the aspect ratio of the pattern 101.

Meanwhile, a crack and/or a break (hereinafter referred to collectively as "crack 113") could occur in the IPA liquid film 111 raised over the substrate W. Such a crack 113 could result in a liquid-solid interface formed there between the IPA liquid and the substrate W, and destruction of the pattern 101 due to a surface tension could occur during drying of the substrate W. After drying, a defect such as a watermark could also occur at the crack 113. It is therefore necessary to suppress or prevent the occurrence of such a crack 113 in the raised IPA liquid film 111 during the substrate heating step (S10).

The following two factors may cause the occurrence of such a crack 113 in the raised IPA liquid film 111.

The first factor is the generation of a larger amount of IPA vapor and/or the boiling of the IPA liquid film 111 due to prolonged heating of the substrate W. The generation of a larger amount of IPA vapor would result in that the IPA gaseous phase 112 cuts through the IPA liquid film 111 located over the IPA gaseous phase 112 and spouts upward through the IPA liquid film 111. As a result, a crack 113 could occur in the IPA liquid film 111. Similarly for the boiling of the IPA liquid film 111, a crack 113 could occur in the IPA liquid film 111.

To address the first factor, in the first example of processing, the liquid film raising temperature TE1 in the substrate heating step (S10) and the duration of operation of the substrate heating step (S10) are set within a range in which no crack 113 could occur. In addition, the IPA liquid is continuously supplied even during the substrate heating step (S10) to keep the raised IPA liquid film 111 thickened such that no crack 113 could occur during the entire substrate heating step (S10).

The second factor for such a crack 113 is the split of the IPA liquid film 111 caused by a centrifugal force due to the rotation of the substrate W. To address the second factor, in the first example of processing, the rotation of the substrate W is stopped during the substrate heating step (S10). This can prevent the IPA liquid film 111 from being split due to a centrifugal force. It is therefore possible to prevent such a crack 113.

Following the substrate heating step (S10), an organic solvent removing step (step S11) is performed to remove the IPA liquid film 111 located over the IPA gaseous phase 112 directly as a liquid mass.

Specifically, when a predefined time has elapsed since the transfer of the substrate W to the hot plate 206, the controller 3 controls the extension/contraction driving unit 225 to change the hot plate 206 from the horizontal attitude to the tilted attitude, as shown in FIGS. 13G and 16.

The attitude change of the hot plate 206 will hereinafter be described in detail with reference to FIG. 16. In the description, one of the three extensible units 224 is referred to as an extensible unit 224*a*, while the other two are referred to as extensible units 224*b*.

In order to change the hot plate 206 from the horizontal attitude to the tilted attitude, the other two extensible units 224*b* (only one of them is shown in FIG. 16) are lengthened while the length of the extensible unit 224*a* is maintained. In this case, the amount of extension of the two extensible units 224*b* is the same. This allows the hot plate 206 to undergo an attitude change to the tilted attitude. When the hot plate 206 is at the tilted attitude, the substrate opposing surface 206*a* is tilted with respect to the horizontal. The tilt angle is, for example, about 1 degree. That is, when the hot plate 206 is at the tilted attitude, the substrate opposing surface 206*a* is tilted by, for example, about 1 degree with respect to the horizontal surface. Thus, the upper surface of the substrate W supported by the hot plate 206 is also tilted by, for example, about 1 degree with respect to the horizontal. In this case, the hot plate 206 is highest at the position in the circumferential direction of the hot plate 206 corresponding to the midpoint of the two extensible units 224*b*, while lowest at the position corresponding to the extensible unit 224*a*.

When the hot plat 206 is tilted as shown in FIG. 16, the substrate W supported by the hot plate 206 is also tilted. When the substrate W and the hot plate 206 are at the tilted attitude, a force acts on the substrate W along the substrate opposing surface 206*a* (as a component of the substrate's own weight). If the force is larger than the frictional force between the substrate W and the support pins 261, the substrate W may move along the substrate opposing surface 206*a*.

The lowest portion of the peripheral portion of the substrate W (the left end portion of the substrate W in FIG. 16) is located medial to one of the six fixed pins 210 (fixed pin 210*a*). When the hot plate 206 is at the tilted attitude, the fixed pin 210 is aligned with the shortest extensible unit 224 in the radial direction of the hot plate 206. When the hot plate 206 is at the tilted attitude as shown in FIG. 16, even when the substrate W may move along the substrate opposing surface 206*a* with respect to the hot plate 206, comes into contact with the fixed pin 210, so that the movement of the substrate W with respect to the hot plate 206 is restricted. It is therefore possible to keep both the substrate W and the hot plate 206 at the tilted attitude while reliably preventing the substrate W from sliding off the hot plate 206.

In addition, the fixed pin 210 supporting the substrate W prevents the substrate W from sliding off the hot plate 206, which can lead to a reduction in the number of parts and cost compared to the case of providing the sliding preventing member separately from the fixed pin 210.

At the end of the substrate heating step (S10), a frictional force of approximately zero is generated between the upper surface of the substrate W and the IPA liquid film 111, as described above. Thus, the IPA liquid film 111 is easily movable along the upper surface of the substrate W. In the organic solvent removing step (S11), since the upper surface of the substrate W is tilted with respect to the horizontal surface, the IPA liquid film 111 moves under its own weight toward the lowest portion of the peripheral portion of the tilted substrate W along the upper surface of the substrate W. The IPA liquid film 111 moves while remaining in a liquid mass without being split into a number of small droplets. This causes the IPA liquid film 111 to be removed from over the substrate W.

After the IPA liquid film 111 is completely removed from over the substrate W, the controller 3 controls the extensible units 224 to put the hot plate 206 from the tilted attitude back to the horizontal attitude. The controller 3 also controls the plate raising/lowering unit 216 to lower the hot plate 206 from the upper position to the lower position. During the lowering of the hot plate 206 from the upper position to the lower position, the peripheral portion of the lower surface of the substrate W comes into contact with the tapered surface 273 of each fixed pin 210. Thereafter, when the hot plate 206 is further lowered, the substrate W is transferred from the hot plate 206 to the first substrate holding unit 205. The substrate W is supported by the multiple fixed pins 210 of the first substrate holding unit 205. Since the movable pins 212 are at the open position, the substrate W is supported only by the fixed pins 210, without being held by the fixed pins 210 or the movable pins 212.

Figure 13I:
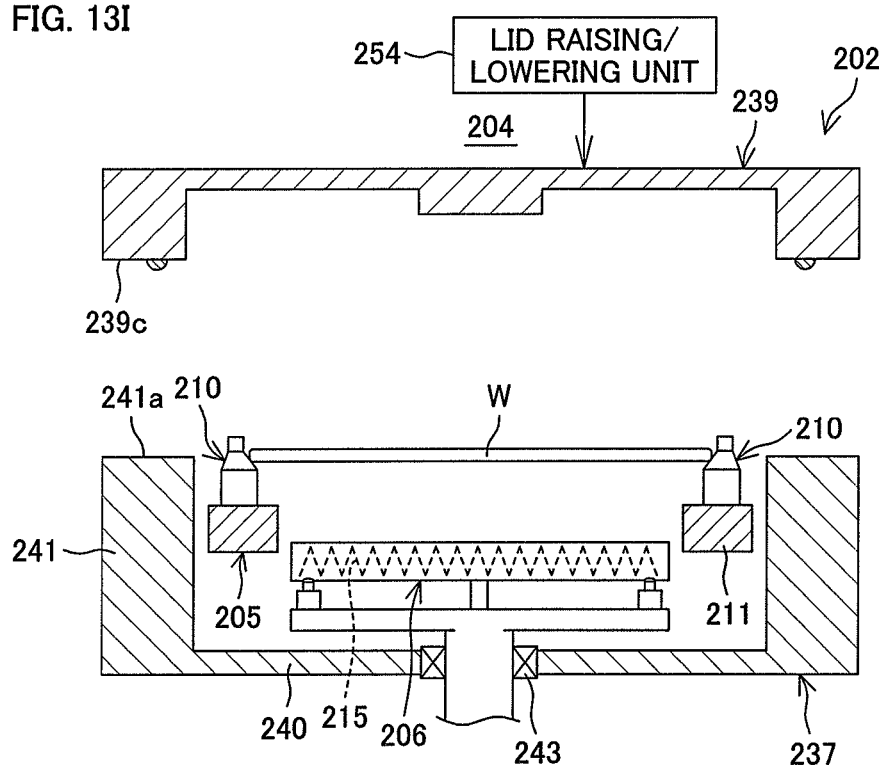
FIG. 13I is a schematic view for illustrating a step following that shown in FIG. 13H.

The controller 3 also drives the locking member (not shown) to release the coupling between the lid member 239 and the chamber main body 237. The controller 3 then controls the lid raising/lowering unit 254 to raise the lid member 239 to the lid opened position, as shown in FIG. 13I.

After the hot plate 206 is lowered to the lower position, since the space between the hot plate 206 and the substrate W held on the first substrate holding unit 205 is sufficiently large, heat from the hot plate 206 cannot be transferred sufficiently to the substrate W. The heating of the substrate W by the hot plate 206 is thus terminated, and the temperature of the substrate W decreases gradually to the room temperature.

The chemical solution processing on the single substrate W is thus terminated, and the delivery robot CR (see FIG. 1) carries the processed substrate W out of the outer chamber 204 (step S12). The IPA liquid is thus supplied onto the upper surface of the substrate W and the IPA liquid film 111 covering the upper surface of the substrate W is formed on the substrate W to replace the rinse liquid existing in the gap of the pattern 101 with the IPA liquid. Since the IPA liquid film 111 covers the entire upper surface of the substrate W, the rinse liquid existing in the gap of the pattern 101 can be replaced successfully across the upper surface of the substrate W. After thus forming the IPA liquid film 111, the upper surface of the substrate W is caused to reach the liquid film raising temperature TE1. This causes the IPA gaseous phase 112 to be formed across the upper surface of the substrate W between the IPA liquid film 111 and the upper surface of the substrate W and the IPA liquid film 111 to be raised over the IPA gaseous phase 112. In this state, a frictional force of approximately zero is generated between the upper surface of the substrate W and the IPA liquid film 111, and thus the IPA liquid film 111 is easily movable along the upper surface of the substrate W.

In the organic solvent removing step (S11), the substrate W and the hot plate 206 are caused to undergo an attitude change to the tilted attitude so that the upper surface of the substrate W is tilted with respect to the horizontal surface, while keeping constant the relative attitude between the substrate W and the hot plate 206. This causes the raised IPA liquid film 111 to move under its own weight toward the lowest portion of the peripheral portion of the tilted substrate W along the upper surface of the substrate W to be removed through the peripheral portion of the substrate W. The IPA liquid film 111 moves while remaining in a liquid mass without being split into a number of small droplets, and thus can be removed smoothly and completely from over the substrate W.

Accordingly, no droplet of the IPA remains on the upper surface of the substrate W after the removal of the IPA liquid film 111. That is, no IPA liquid remains in the gap of the pattern 101. It is therefore possible, even in the case of processing a substrate W with a pattern 101 formed on the upper surface thereof, to dry the upper surface of the substrate W successfully while suppressing or preventing the pattern 101 from being collapsed.

Further, in parallel with the organic solvent replacing step (S9), the substrate W is rotated at the puddling speed v1, which is lower than the higher rotational speed v3. With the deceleration of the substrate W, the centrifugal force acting on the IPA liquid on the substrate W becomes zero or small, so that the IPA liquid remains on the upper surface of the substrate W without being discharged from the peripheral portion of the substrate W. As a result, the IPA liquid film 111 in a puddle state is maintained on the upper surface of the substrate W. The rinse liquid on the upper surface of the substrate W is replaced with IPA contained in the IPA liquid film 111 that is maintained on the upper surface of the substrate W. This allows the rinse liquid to be replaced with IPA more successfully on the upper surface of the substrate W.

Prior to the puddling step (S92), the first high-speed rotating step (S91) is performed. In the first high-speed rotating step (S91), the substrate W is rotated at the first rotational speed. This causes the IPA liquid on the substrate W to undergo a centrifugal force due to the rotation of the substrate W and thereby spread toward the peripheral portion of the substrate W. This allows the IPA liquid to reach the entire upper surface of the substrate W. Accordingly, in the puddling step (S92) following the first high-speed rotating step (S91), the IPA liquid film 111 in a puddle state covering the entire upper surface of the substrate W is maintained on the upper surface of the substrate W. This allows the rinse liquid on the upper surface of the substrate W to be replaced with the IPA liquid successfully across the upper surface of the substrate W.

The substrate heating step (S10) is performed with the substrate W not rotating. If the substrate W is rotated at high speed during the substrate heating step (S10), the peripheral portion of the substrate W would be cooled with the rotation of the substrate W. As a result, the temperature of the peripheral portion of the upper surface of the substrate W might not reach the liquid film raising temperature TE1. In this case, the IPA liquid film 111 might not be raised successfully in the peripheral portion of the substrate W.

On the other hand, in the first example of processing, since the substrate heating step (S10) is performed with the substrate W not rotating, the peripheral portion of the upper surface of the substrate W can be heated to the liquid film raising temperature TE1. This allows the IPA liquid film 111 to be raised across the upper surface of the substrate W.

In addition, the hot plate 206 is in contact with the underside of the substrate W to support the substrate W thereon while heating the underside of the substrate W. An attitude change of the hot plate 206 from the horizontal attitude to the tilted attitude allows the upper surface of the substrate W to be tilted with respect to the horizontal while the substrate W is held successfully on the hot plate 206. This allows for tilting the upper surface of the substrate W with respect to the horizontal surface while heating the substrate W with the hot plate 206.

Further, the multiple extensible units 224 support the peripheral portions of the hot plate 206 thereon. When the multiple extensible units 224 have the same length, the hot plate 206 is kept in the horizontal attitude. When at least one of the multiple extensible units 224 has a length different from that of the other extensible units 224, the hot plate 206 is kept at the tilted attitude. This allows the hot plate 206 to undergo an attitude change between the horizontal attitude and the tilted attitude with a simple structure.

Figure 18:
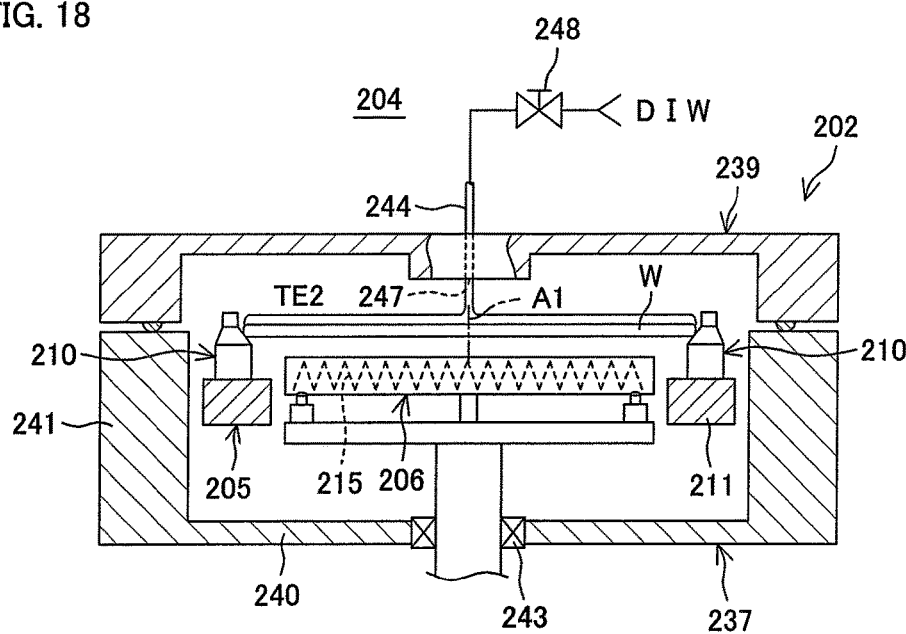
FIG. 18 is a schematic view for illustrating a final rinsing step of a second example of processing to be performed on the substrate in the processing unit.

FIG. 18 is a schematic view for illustrating a final rinsing step (S8) of a second example of processing to be performed on the substrate W in the processing unit 202.

The second example of processing differs from the first example of processing in that the hot plate 206 heats the upper surface of the substrate W in the final rinsing step (S8) and the organic solvent replacing step (S9). The process flow sequence is the same as in the first example of processing shown in FIG. 12.

In the second example of processing, prior to or during the final rinsing step (S8), the controller 3 controls the plate raising/lowering unit 216 to raise the hot plate 206 from the lower position (such as shown in FIG. 13A) to a middle position (as shown in FIG. 18). At the middle position, the substrate opposing surface 206a of the hot plate 206 is positioned at least lower than the lower surface of the substrate W held on the first substrate holding unit 205. The hot plate 206 is located at the middle position during the final rinsing step (S8) and the organic solvent replacing step (S9).

When the hot plate 206 is at the middle position and the heater 215 is controlled to be ON so that the hot plate 206 is caused to produce heat, heat from the hot plate 206 is provided by heat radiation to the substrate W held on the first substrate holding unit 205. In this state, since the hot plate 206 and the substrate W are spaced from each other, the amount of heat provided to the substrate W is smaller than in the case where the substrate W is held on the hot plate 206.

In the final rinsing step (S8) of the second example of processing, the substrate W is heated by the hot plate 206 such that the upper surface of the substrate W is heated to a predefined preliminary heating temperature (second temperature) TE2. The preliminary heating temperature TE2 is set to have a predetermined temperature (about 40 to 80° C., for example) lower than the boiling point of IPA (82.4° C.) but higher than the room temperature.

The temperature of the upper surface of the substrate W (the upper surface of the pattern 101 (see FIG. 14C, for example), more particularly the upper end face 102A of each structure 102), after having reached the preliminary heating temperature TE2, is kept at the preliminary heating temperature TE2. In this case, the entire upper surface of the substrate W is kept at the preliminary heating temperature TE2. That is, the middle position of the hot plate 206 is set to have a height at which the upper surface of the substrate W becomes the preliminary heating temperature TE2.

This causes the upper surface of the substrate W to be heated to the preliminarily heating temperature TE2 in the final rinsing step (S8) and the organic solvent replacing step (S9) of the second example of processing. As a result, the coefficient of diffusion of the IPA liquid in contact with the upper surface of the substrate W increases. This can increase the efficiency of IPA replacement. It is therefore possible to shorten the duration of operation of the organic solvent replacing step (S9).

Further, since the substrate heating step (S10) is started with the upper surface of the substrate W being heated, the time required for the upper surface of the substrate W to be heated to the liquid film raising temperature TE1 can be reduced. It is therefore possible to shorten the duration of operation of the substrate heating step (S10).

After the completion of the organic solvent replacing step (S9), the controller 3 controls the plate raising/lowering unit 216 to raise the hot plate 206 from the middle position (as shown in FIG. 18) to the upper position (such as shown in FIG. 13G). This causes the substrate W to be separated from the first substrate holding unit 205 and transferred to the hot plate 206. Next, the substrate heating step (S10) is performed.

It is noted that the heating of the substrate W by the hot plate 206 may be started in the organic solvent replacing step (S9), though started in the final rinsing step (S8) in the second example of processing.

Figure 19:
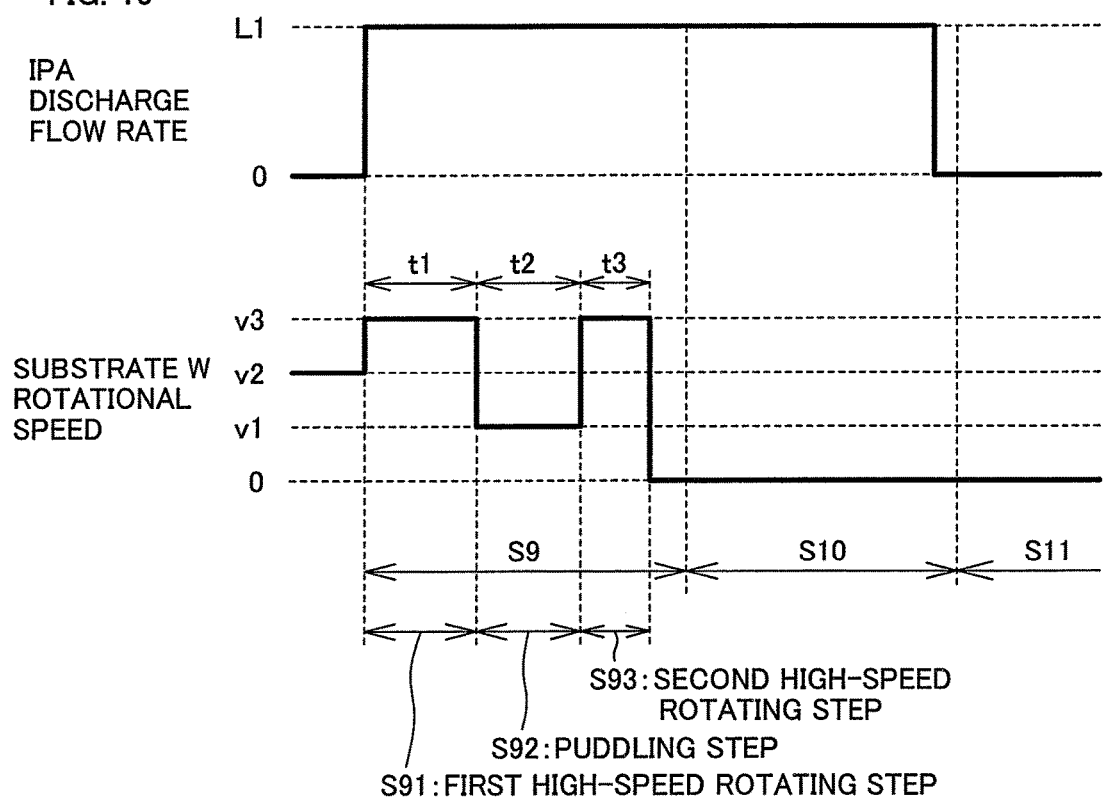
FIG. 19 shows the change in the discharge flow rate of IPA and the change in the rotational speed of the substrate in a third example of processing to be performed on the substrate in the processing unit.

FIG. 19 shows the change in the discharge flow rate of IPA and the change in the rotational speed of the substrate W in a third example of processing to be performed on the substrate W in the processing unit 202.

The third example of processing differs from the first example of processing in that a second high-speed rotating step (step S93) is performed after the completion of the puddling step (S92) in the organic solvent replacing step (S9) and before the substrate heating step (S10). In parallel with the organic solvent replacing step (S9), the second high-speed rotating step (S93) is performed in which the substrate W is rotated at a rotational speed higher than that in the puddling step (S92).

Specifically, after the completion of the puddling step (S92), the controller 3 increases the speed of the substrate W from the puddling speed v1 to the higher rotational speed v3 (800 rpm, for example). The substrate W is rotated at the higher rotational speed v3 for a predetermined high-speed rotation time t3 (about 5 seconds, for example). With the high-speed rotation of the substrate W, a centrifugal force due to the rotation of the substrate W acts on the IPA liquid film 111 on the substrate W, so that the IPA liquid on the substrate W is removed from the substrate W. This causes the IPA liquid film 111 to be thinned while the entire upper surface of the substrate W is covered with the IPA liquid film 111, resulting in a reduction in the thickness of the IPA liquid film 111. The thickness of the thinned IPA liquid film 111 is, for example, 0.5 mm.

In the puddling step (S92), since the centrifugal force acting on the IPA liquid on the substrate W is zero or small, the thickness of the IPA liquid film 111 is relatively large (1 mm, for example). Transitioning to the substrate heating step (S10) with this thickness might require a long period of time to remove the IPA liquid film 111 in the liquid film removing step (S11), because the thickness of the IPA liquid film 111 raised over the substrate W is relatively large.

On the other hand, in the third example of processing, since the second high-speed rotating step (S93) is performed before the substrate heating step (S10), the thickness of the IPA liquid film 111 raised over the substrate W decreases in the substrate heating step (S10) (the thickness decreases from 1 mm to 0.5 mm, for example). It is therefore possible to shorten the duration of the liquid film removing step (S11) (the time period required to remove the IPA liquid film 111).

It is noted that the rotational speed of the substrate W in the second high-speed rotating step (S93) may be set different from the rotational speed (higher rotational speed v3) of the substrate W in the first high-speed rotating step (S91), though set equal to the rotational speed of the substrate W in the first high-speed rotating step (S91) as merely an example in the third example of processing.

Although the first to third examples of processing have been described based on the arrangement that the final rinsing step (S8) is performed with the interior space between the chamber main body 237 and the lid member 239 being sealed, the final rinsing step (S8) may be performed with the interior space between the chamber main body 237 and the lid member 239 being opened (the lid member 239 being at the lid opened position). The rinse liquid may be supplied onto the upper surface of the substrate W through the rinse liquid discharge port 247 of the rinse liquid upper pipe 244 or through the rinse liquid nozzle 228 disposed in a manner opposed to the upper surface of the substrate W. In this case, the interior space between the chamber main body 237 and the lid member 239 is to be sealed after the final rinsing step (S8).

Also, the first chemical solution step, which is performed two times (S2, S6) in the first to third examples of processing, may be performed two times or more or may be performed only one time.

Although the first and second chemical solution steps (S2, S4, S6) and the first to third rinsing steps (S3, S5, S7) in the first to third examples of processing have been described with the example in which both the upper and lower surfaces of the substrate W are processed, only the upper surface (pattern formed surface) of the substrate W may be processed in the steps (S2 to S7).

Further, the third rinsing step (S7) may be omitted in the first to third examples of processing.

Although the first preferred embodiment of the present invention has heretofore been described, the present invention may be embodied as follows.

Figure 20:
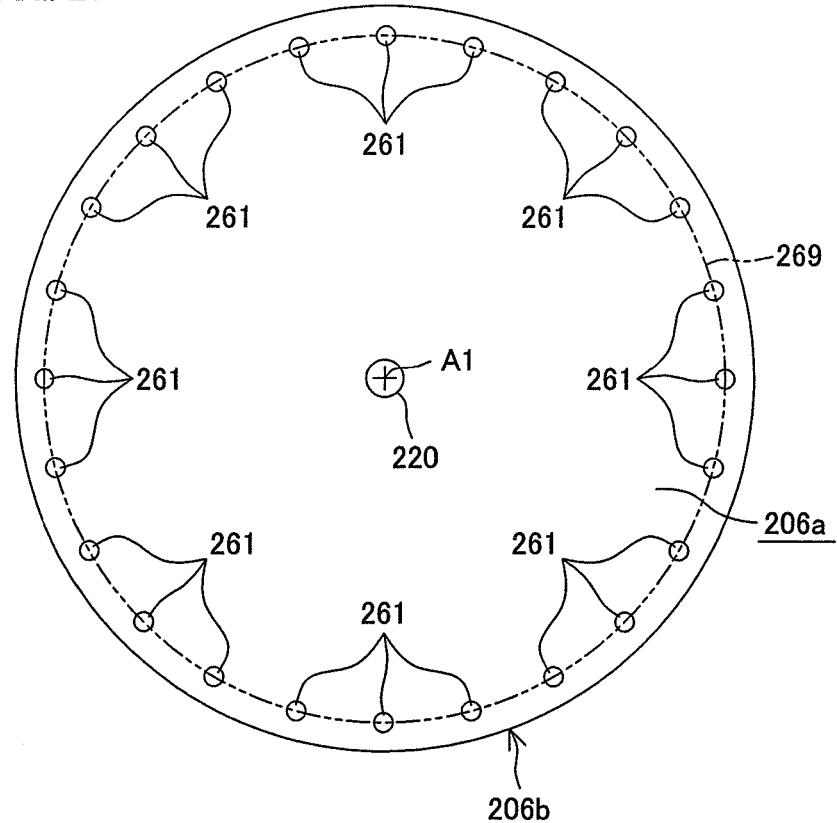
FIG. 20 shows a first variation of the second substrate holding unit according to the first preferred embodiment of the present invention.

For example, as shown in FIG. 20, the multiple support pins 261 may be disposed not across the substrate opposing surface 206a but only in the peripheral portion of the substrate opposing surface 206a. In FIG. 20, the multiple support pins 261 are disposed in the peripheral portion of the substrate opposing surface 206a in an equally spaced manner on a fourth virtual circle 269 set centering on the rotational axis A1.

Figure 21:
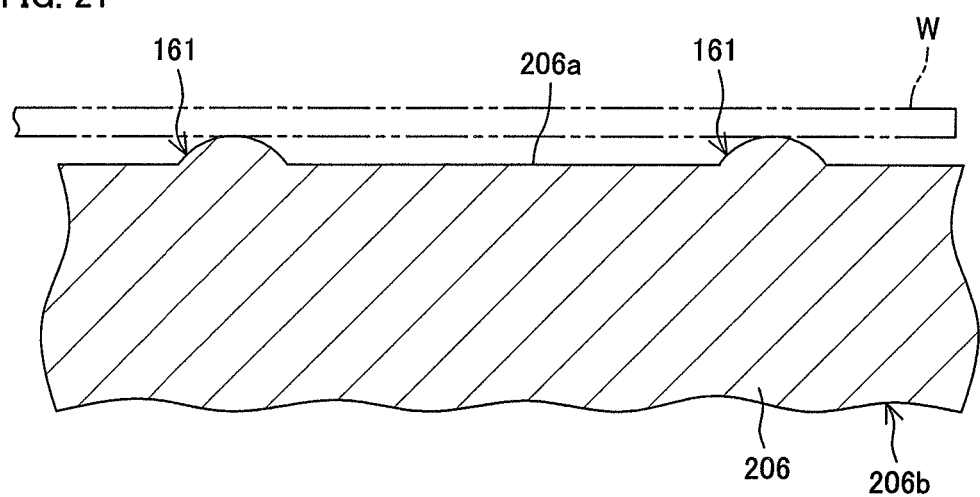
FIG. 21 shows a second variation of the second substrate holding unit according to the first preferred embodiment of the present invention.

Also, as shown in FIG. 21, support pins 161 provided integrally with the hot plate 206 may be employed instead of the support pins 261 each formed by a portion of each sphere 266.

Although the preferred embodiment above has been described based on the arrangement that the three extensible units 224 are disposed medial to the three respective fixed pins 210, the extensible units 224 may not be aligned with the respective fixed pins 210 in the circumferential direction of the hot plate 206. In this case, when the substrate W is at the tilted attitude, the fixed pin 210 (fixed pin 210a) closest to the extensible unit 224 in the maximally contracted state comes into contact with the lower portion of the peripheral portion of the tilted substrate W. This can prevent the substrate W from sliding off the hot plate 206.

Although the preferred embodiment above has been described with the example in which the hot plate 206 is raised/lowered to transfer the substrate W between the hot plate 206 and the first substrate holding unit 205, the first substrate holding unit 205 may be raised/lowered to transfer the substrate W. Alternatively, both the hot plate 206 and the first substrate holding unit 205 may be raised/lowered to transfer the substrate W between the first substrate holding unit 205 and the hot plate 206.

Further, a sliding preventing member may be provided separately from the fixed pins 210.

If the substrate W cannot move along the substrate opposing surface 206a even when the substrate W and the hot plate 206 may be at the tilted attitude, a sliding preventing member such as the fixed pins 210 may not be used to prevent the substrate W from sliding off.

For example, if the leading end of each support pin 261 (161) is composed of a member with a high frictional coefficient, the substrate W, even when may be tilted, is less likely to move with respect to the support pins 261 (161). In this case, the peripheral portion of the tilted substrate W may not be supported by, for example, the fixed pins 210 to prevent the substrate W from sliding off. Thus, if the tilt angle is small and/or the frictional force generated between the support pins 261 and the lower surface of the substrate W is large, the substrate W cannot move along the substrate opposing surface 206a, and therefore a sliding preventing member such as the fixed pins 210 may not be used to prevent the substrate W from sliding off.

Although the preferred embodiment above has been described based on the arrangement that the substrate W is heated by being placed on the hot plate 206 in the substrate heating step (S10), the hot plate 206 may be located near the lower surface of the substrate W held on the first substrate holding unit 205 to heat the substrate W in the substrate heating step (S10). In this case, the amount of heat provided to the substrate W can be adjusted by changing the space between the hot plate 206 and the substrate W.

Although in the preferred embodiment above, the plate raising/lowering unit 216 is controlled to raise/lower the hot plate 206 and thereby adjust the temperature for heating the substrate W, the plate raising/lowering unit 216 may not be used to adjust the temperature for heating the substrate W if the amount of heat generation from the hot plate 206 can be adjusted to at least two levels (ON state and OFF state).

In the case above, the substrate W can be rotated in parallel with the substrate heating step (S10). The rotation of the substrate W in the substrate heating step (S10) may be performed during a portion of the duration or during the entire duration of operation of the substrate heating step (S10). It is, however, preferred that the substrate W is rotated at a low rotational speed (about 10 to 100 rpm, for example) at which the peripheral portion of the upper surface of the substrate W cannot be cooled. If the substrate W is rotated at such a low rotational speed, only a small centrifugal force acts on the IPA liquid film 111 in the substrate heating step (S10). It is therefore possible to prevent a crack 113 from occurring in the IPA liquid film 111 more reliably.

Although in the preferred embodiment above, hydrofluoric acid and SC1 are exemplified, respectively, as the first chemical solution and the second chemical solution, liquid containing at least one of sulfuric acid, acetic acid, nitric acid, hydrochloric acid, hydrofluoric acid, ammonia water, oxygenated water, organic acid (such as citric acid, oxalic acid), organic alkali (such as TMAH (tetramethylammonium hydroxide)), surface-active agent, and corrosion inhibitor may be employed as the first chemical solution or the second chemical solution, for example, in the washing processing and the etching processing.

The substrate W may also be processed not using multiple types (two types) of chemical solution but using only one type of chemical solution.

Although in the description above, IPA is exemplified as organic solvent having a surface tension lower than that of water, methanol, ethanol, acetone, and HFE (hydrofluoroether), for example, may also be employed other than IPA.

Although in the preferred embodiment above, the chemical solution processing (etching processing, washing processing, etc.) is performed under the atmospheric pressure, the pressure of the processing atmosphere is not limited thereto. For example, the atmosphere in the sealed space defined by the lid member 239 and the chamber main body 237 may be pressurized or depressurized using a predetermined pressure adjusting unit so as to be adjusted to a high-pressure atmosphere higher than the atmospheric pressure or a low-pressure atmosphere lower than the atmospheric pressure for etching processing, washing processing, etc., in each preferred embodiment.

Second Preferred Embodiment

Figure 22:
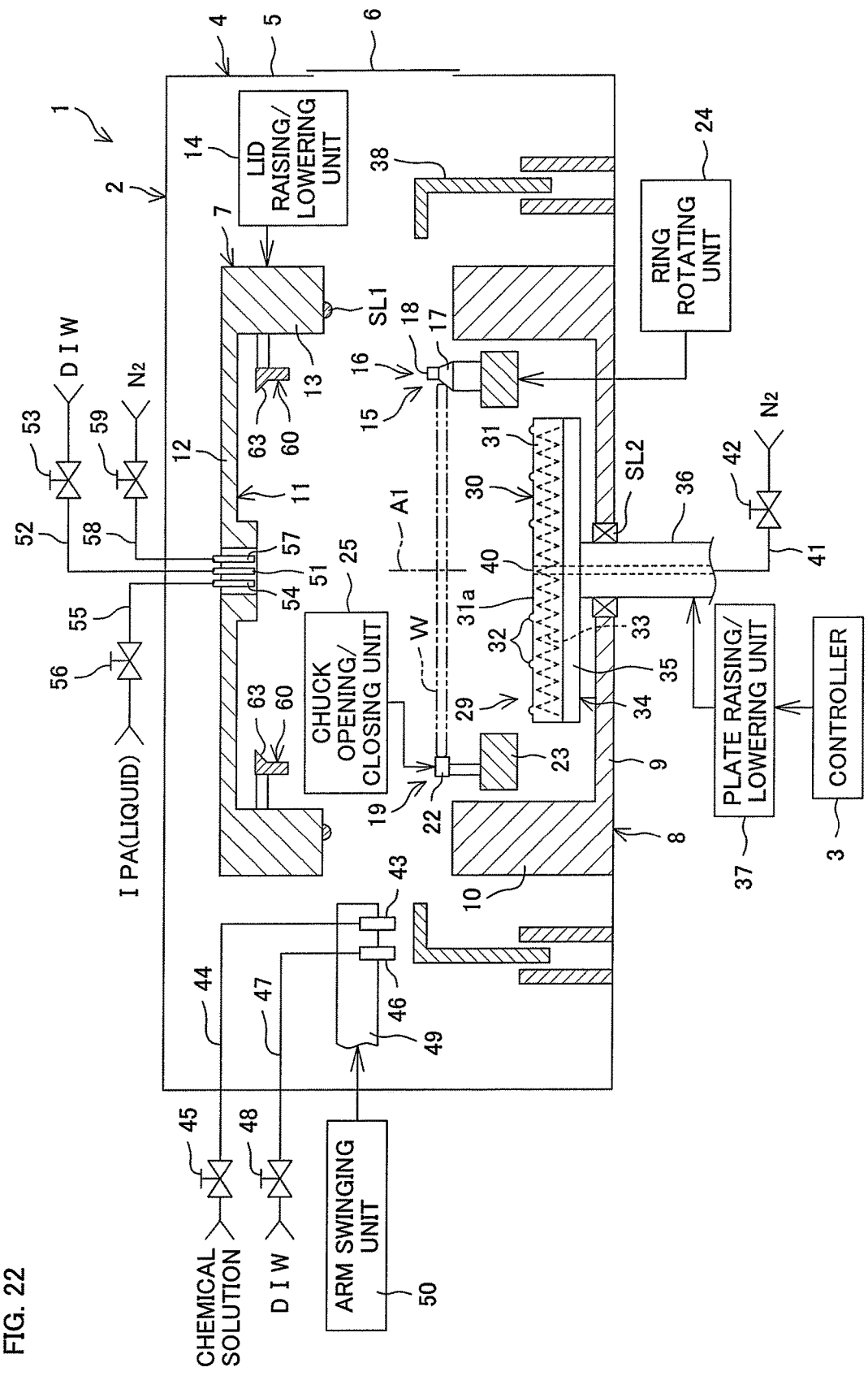
FIG. 22 is a schematic view of the interior of a processing unit according to a second preferred embodiment of the present invention when viewed horizontally.

Next will be described a second preferred embodiment of the present invention. In FIG. 22 and the following figures, components equivalent to those shown in FIGS. 1 to 21 are designated by the same reference symbols as in, for example, FIG. 1 and description thereof shall be omitted.

As shown in FIG. 22, the processing unit 2 includes a first substrate holding unit 15 arranged to rotate a substrates W about a vertical axis of rotation A1 passing through the center of the substrate W while keeping the substrate W in a horizontal attitude and a second substrate holding unit 29 arranged to heat the substrate W while keeping the substrate W in a horizontal attitude. The first substrate holding unit 15 and the second substrate holding unit 29 are examples of the substrate holding unit.

As shown in FIG. 22, the processing unit 2 further includes an openable/closable inner chamber 7 to house the first substrate holding unit 15 and the second substrate holding unit 29 therein, a cylindrical cup 38 surrounding the inner chamber 7 about the rotational axis A1, and an outer chamber 4 to house the inner chamber 7 and the cup 38 therein.

As shown in FIG. 22, the outer chamber 4 includes a box-shaped chamber main body 5 to house, for example, the first substrate holding unit 15 and the second substrate holding unit 29 therein and a shutter 6 arranged to open/close a carry-in/carry-out port provided on the chamber main body 5. The outer chamber 4 further includes a shutter opening/closing unit arranged to move the shutter 6 between an opened position at which the carry-in/carry-out port is opened and a closed position at which the carry-in/carry-out port is closed, though not shown.

As shown in FIG. 22, the inner chamber 7 includes a bottomed cylindrical chamber main body 8 to house the first substrate holding unit 15 and the second substrate holding unit 29 therein, a top lid 11 arranged to open/close an opening provided at the upper end of the chamber main body 8, and a lid raising/lowering unit 14 arranged to vertically raise/lower the top lid 11 within the outer chamber 4 between an upper position at which the opening of the chamber main body 8 is opened and a closed position at which the opening of the chamber main body 8 is closed with the top lid 11.

As shown in FIG. 22, the chamber main body 8 includes a disk-shaped bottom wall portion 9 disposed along the floor of the outer chamber 4 and a cylindrical lower peripheral wall portion 10 extending upward from an outer peripheral portion of the bottom wall portion 9. The top lid 11 includes a disk-shaped top wall portion 12 held in a horizontal attitude over the chamber main body 8 and a cylindrical upper peripheral wall portion 13 extending downward from an outer peripheral portion of the top wall portion 12. The top wall portion 12 of the top lid 11 is disposed over the first substrate holding unit 15 and the second substrate holding unit 29. The lower peripheral wall portion 10 of the chamber main body 8 surrounds the first substrate holding unit 15 and the second substrate holding unit 29. The upper peripheral wall portion 13 of the top lid 11 is disposed over the lower peripheral wall portion 10 of the chamber main body 8. The chamber main body 8 is connected to a waste liquid pipe (not shown) arranged to guide liquid discharged from inside the chamber main body 8.

Figure 25:
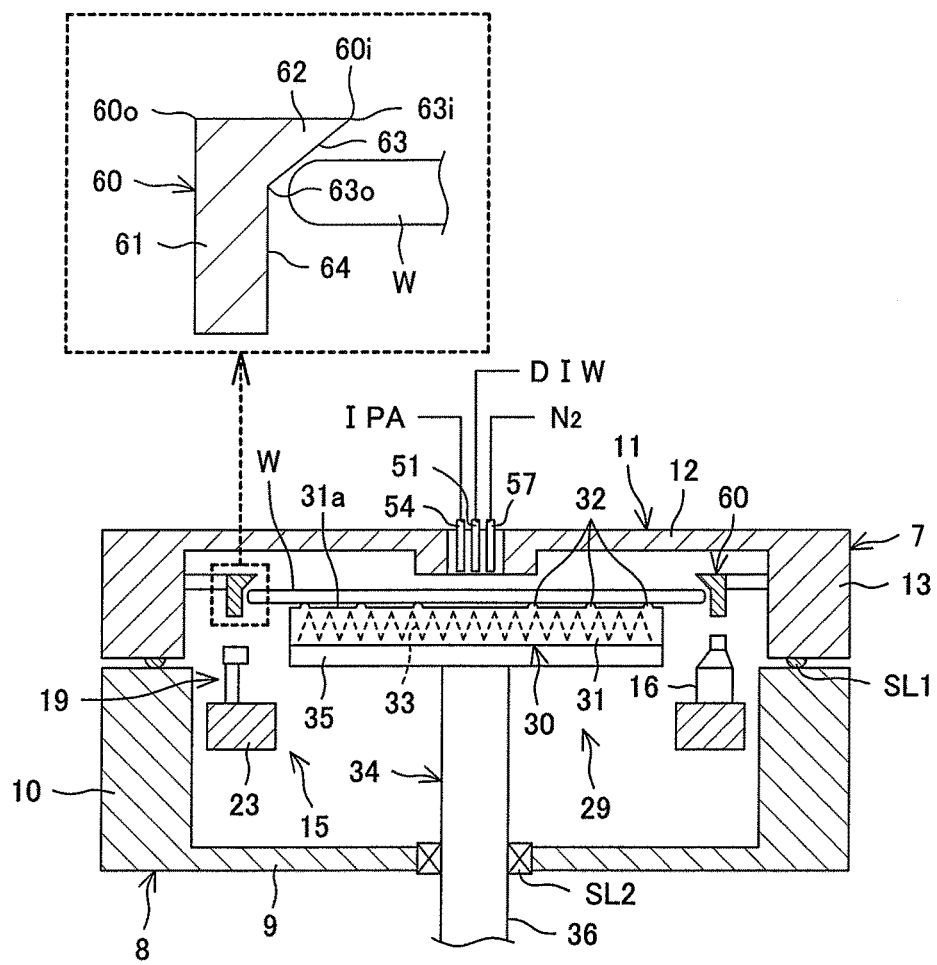
FIG. 25 is a partial schematic view of the processing unit, showing a cross-section of a guiding member.

As shown in FIGS. 22 and 25, the lid raising/lowering unit 14 is arranged to vertically raise/lower the top lid 11 between an upper position (as shown in FIG. 22) and a lower position (as shown in FIG. 25). The lower position is a sealed position at which the opening of the chamber main body 8 is closed. The upper position is a retracted position at which the top lid 11 is retracted upward from the chamber main body 8. When the lid raising/lowering unit 14 moves the top lid 11 to the lower position, the annular lower surface of the upper peripheral wall portion 13 comes close to the annular upper surface of the lower peripheral wall portion 10, and the gap between the upper peripheral wall portion 13 and the lower peripheral wall portion 10 is sealed with an annular sealing member SL1 held on the upper peripheral wall portion 13. This results in a higher degree of sealing of the interior of the inner chamber 7. On the other hand, when the lid raising/lowering unit 14 moves the top lid 11 to the upper position, the annular lower surface of the upper peripheral wall portion 13 gets away upward from the annular upper surface of the lower peripheral wall portion 10, and the gap between the lower surface of the upper peripheral wall portion 13 and the upper surface of the lower peripheral wall portion 10 is expanded such that a scan nozzle can get between the upper peripheral wall portion 13 and the lower peripheral wall portion 10.

As shown in FIG. 22, the first substrate holding unit 15 includes multiple (six, for example) fixed pins 16 arranged to support the substrate W in a horizontal attitude and multiple (three, for example) movable pins 19 arranged to grip the substrate in the horizontal attitude in cooperation with the multiple fixed pins 16. The first substrate holding unit 15 further includes a support ring 23 holding the multiple fixed pins 16 and the multiple movable pins 19 thereon, a chuck opening/closing unit 25 arranged to move the multiple movable pins 19 with respect to the support ring 23, and a ring rotating unit 24 arranged to rotate the support ring 23 about the rotational axis A1. The ring rotating unit 24 includes a rotor rotatable about the rotational axis A1 together with the support ring 23 and a stator held on the chamber main body 8 of the inner chamber 7, though not shown.

Figure 23:
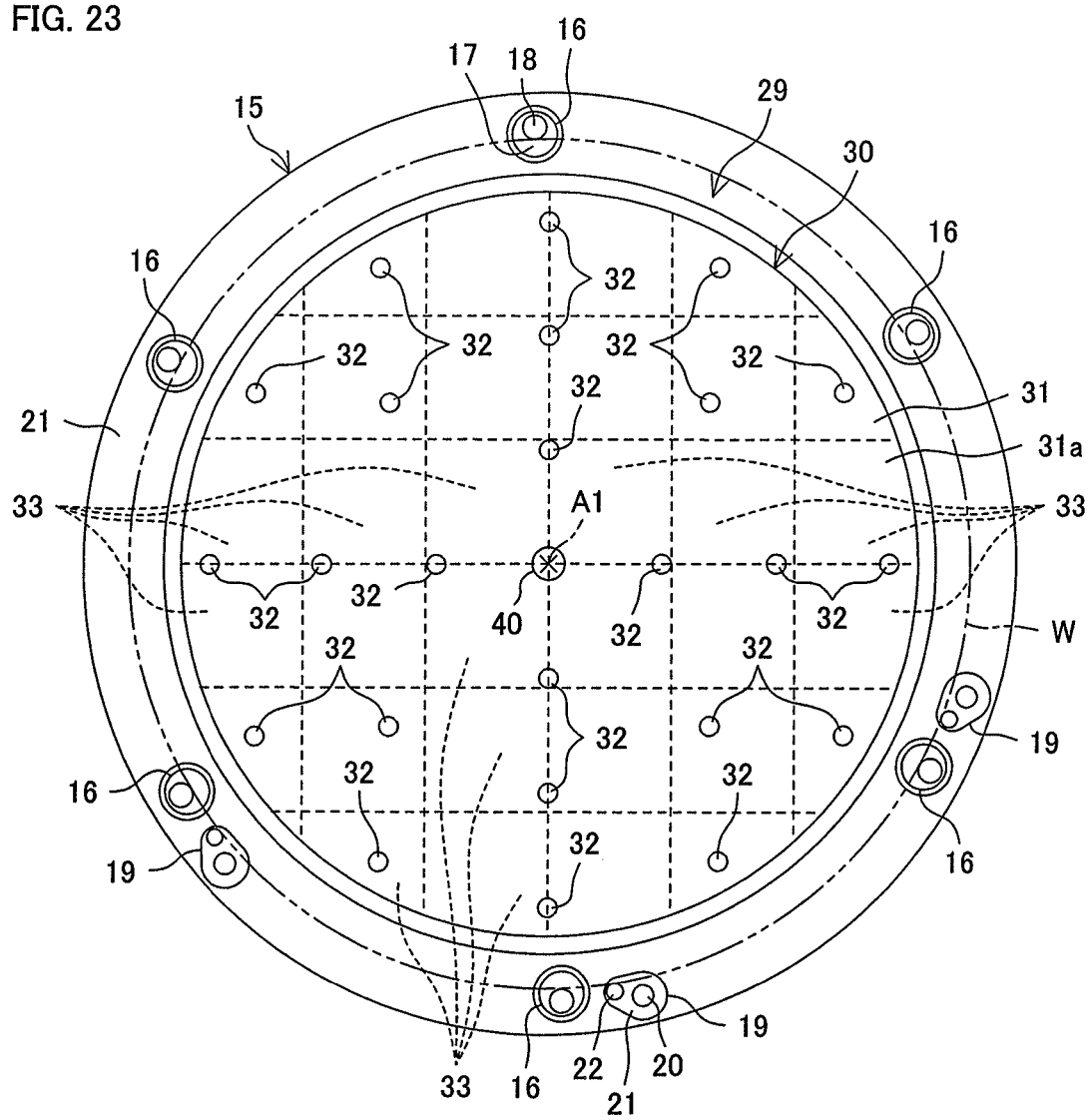
FIG. 23 is a plan view of a first substrate holding unit and a second substrate holding unit.

As shown in FIG. 22, the fixed pins 16 and the movable pins 19 protrude upward from the support ring 23. The fixed pins 16 and the movable pins 19 are held on the support ring 23. As shown in FIG. 23, the six fixed pins 16 are arranged in an equally spaced manner in the circumferential direction. The three movable pins 19 are disposed, respectively, in the vicinity of circumferentially adjacent three of the fixed pins 16. The central angle of the arc covering the three movable pins 19 is smaller than 180 degrees in a plan view, and the three movable pins 19 are thus disposed unevenly in the circumferential direction. The fixed pins 16 are not movable with respect to the support ring 23, while the movable pins 19 are movable with respect to the support ring 23. The support ring 23 has an outer diameter greater than that of the substrate W. The support ring 23 is held within the chamber main body 8 of the inner chamber 7.

Figure 27:
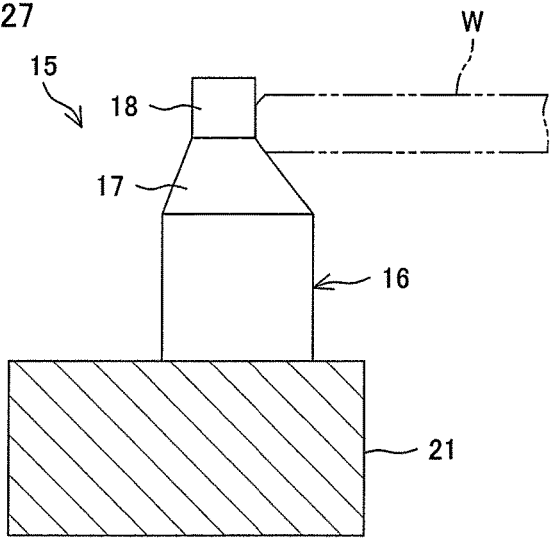
FIG. 27 is a schematic view of a fixed pin when viewed horizontally.

As shown in FIG. 27, each of the fixed pins 16 includes a fixed support portion 17 arranged to come into contact with the peripheral portion of the lower surface of the substrate W to support the substrate W in the horizontal attitude and a fixed gripping portion 18 arranged to be pressed against the peripheral portion of the substrate W supported by the fixed support portion 17. The fixed support portion 17 includes a support surface extending obliquely downward and inward. The multiple fixed pins 16 are each arranged to hold the substrate W in the horizontal attitude through contact between the fixed support portion 17 and the peripheral portion of the lower surface of the substrate W. The positions at which the substrate W is supported by the multiple fixed pins 16 are at a higher position than that of the upper end of the lower peripheral wall portion 10 of the inner chamber 7.

Figure 24:
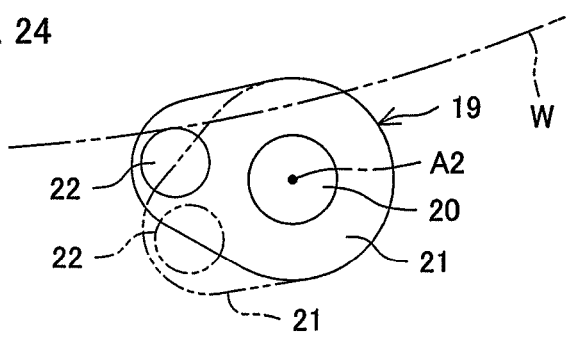
FIG. 24 is a plan view of a movable pin.

As shown in FIG. 24, each of the movable pins 19 includes a vertically extending shaft portion 20, a base portion 21 supported by the shaft portion 20, and a columnar movable gripping portion 22 protruding upward from the base portion 21. The movable pin 19 is movable with respect to the support ring 23 about a vertical rotational axis A2 (centerline of the shaft portion 20) between a closed position at which the movable gripping portion 22 is pressed against the peripheral portion of the substrate W (as indicated by the solid line) and an open position at which the movable gripping portion 22 is set away from the substrate W (as indicated by the alternate long and two short dashed line). The multiple movable pins 19 are arranged to grip the substrate W in cooperation with the fixed gripping portions 18 of the multiple fixed pins 16. The positions at which the substrate W is gripped by the fixed pins 16 and the movable pins 19 are the same as the positions at which the substrate W is supported by the multiple fixed pins 16.

Figure 29A:
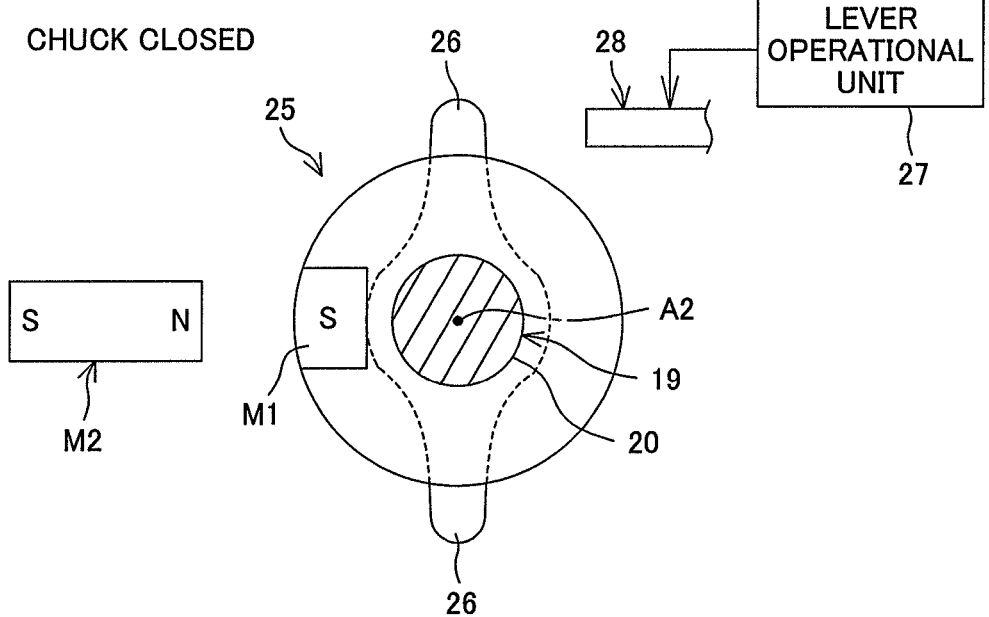
FIG. 29A is a cross-sectional view taken along the line IX-IX in FIG. 28, showing a state where the movable pin is at a closed position.
Figure 29B:
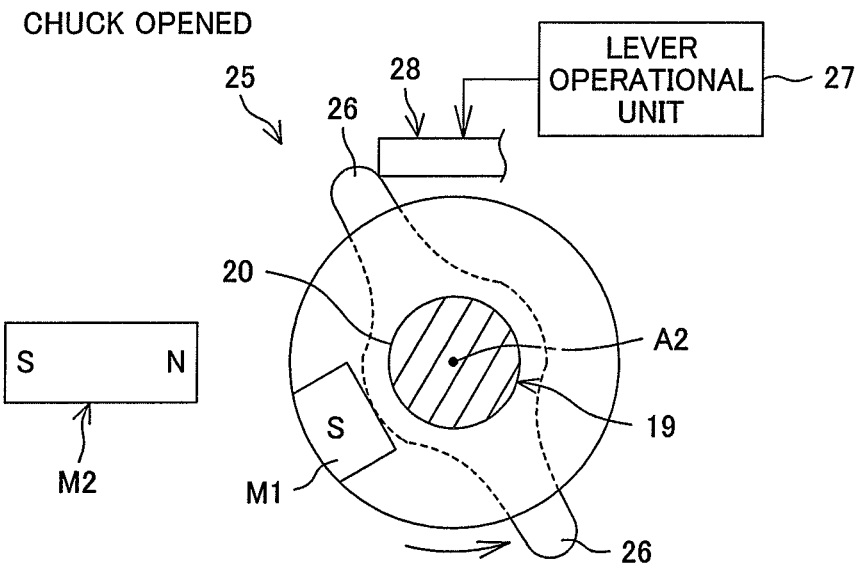
FIG. 29B is a cross-sectional view taken along the line IX-IX in FIG. 28, showing a state where the movable pin is at an open position.

The chuck opening/closing unit 25 is a constantly-closing unit arranged to move the movable pin 19 from the closed position only when it is necessary. As shown in FIGS. 29A and 29B, the chuck opening/closing unit 25 includes a movable magnet M1 rotatable about the rotational axis A2 together with the movable pin 19 and a fixed magnet M2 arranged to provide a magnetic force for moving the movable pin 19 to the closed position to the movable magnet M1. Both the movable magnet M1 and the fixed magnet M2 are permanent magnets. The movable magnet M1 and the fixed magnet M2 correspond to a closing unit arranged to move the movable pin 19 to the closed position.

The movable magnet M1 is held on the movable pin 19 and movable with respect to the support ring 23. The fixed magnet M2 is fixed to the support ring 23 and not movable with respect to the support ring 23. The movable pin 19 is urged toward the closed position by a repulsive force or an attractive force acting between the movable magnet M1 and the fixed magnet M2. Hence, when no force acts on the movable pin 19 excluding the magnetic force acting between the movable magnet M1 and the fixed magnet M2, the movable pin 19 is located at the closed position.

As shown in FIGS. 29A and 29B, the chuck opening/closing unit 25 includes two to-be-operated pieces 26 rotatable about the rotational axis A2 together with the movable pin 19, a lever operational unit 27 arranged to generate power for moving the movable pin 19 to the open position, and an operating lever 28 arranged to transmit power from the lever operational unit 27 to one of the two to-be-operated pieces 26. The to-be-operated pieces 26, the lever operational unit 27, and the operating lever 28 correspond to an opening unit arranged to move the movable pin 19 to the open position.

As shown in FIGS. 29A and 29B, the two to-be-operated pieces 26 are disposed in a manner spaced by 180 degrees, that is, symmetrically with respect to the rotational axis A2 to correct weight imbalance. The lever operational unit 27 is an air cylinder including, for example, a cylinder main body held on the hot plate 30 and a rod movable with respect to the cylinder main body, though not shown. The operating lever 28 is fixed to the rod. The lever operational unit 27 and the operating lever 28 are arranged to be raised/lowered vertically together with the hot plate 30.

Figure 28:
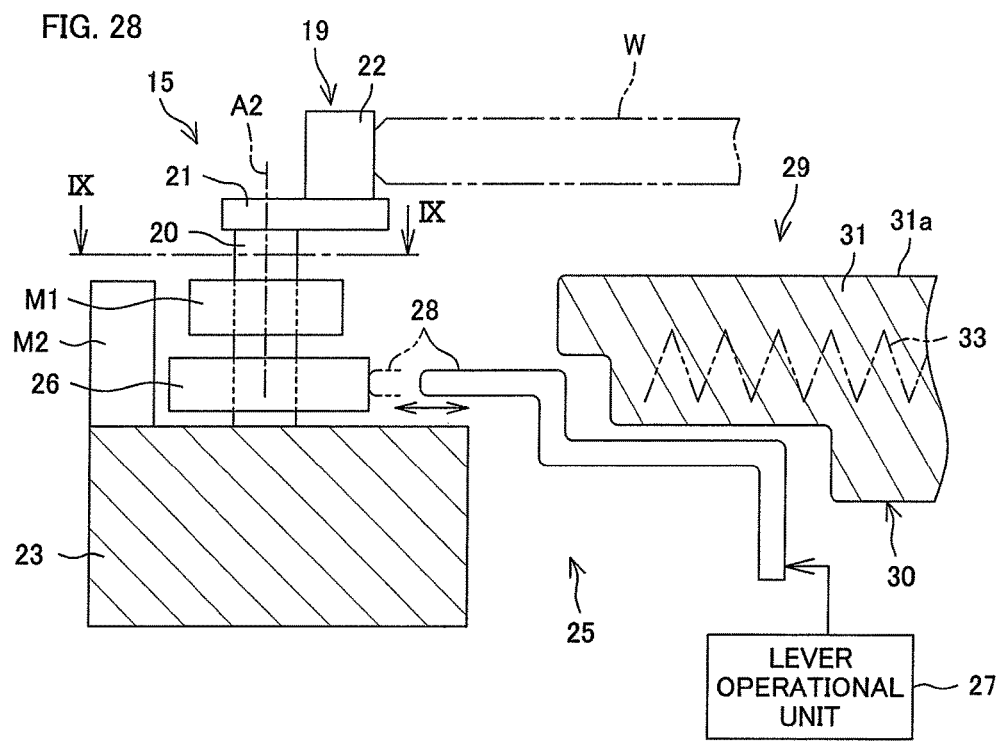
FIG. 28 is a schematic view of a movable pin and a chuck opening/closing unit when viewed horizontally.

As shown in FIG. 28, the leading end portion of the operating lever 28 extends outward from the hot plate 30 (away from the rotational axis A1). The leading end portion of the operating lever 28 is arranged to, by being opposed horizontally to one of the to-be-operated pieces 26, press and rotate the to-be-operated piece 26 to move the movable pin 19 from the closed position to the open position. As will be described hereinafter, the hot plate 30 moves vertically from a first substrate transferring step (step S7) to a second substrate transferring step (step S10) and, accordingly, the leading end portion of the operating lever 28 also moves vertically. The leading end portion of the operating lever 28 and the to-be-operated pieces 26 each have a sufficient vertical thickness such that the leading end portion of the operating lever 28 is constantly contactable with the to-be-operated pieces 26 even when the leading end portion of the operating lever 28 may thus move vertically.

In order to move the movable pin 19 to the open position, the controller 3 controls the rotational angle of the support ring 23 and the height of the hot plate 30 such that the leading end portion of the operating lever 28 is opposed horizontally to one of the to-be-operated pieces 26, as shown in FIG. 29B. When the operating lever 28 moves outward with the leading end portion of the operating lever 28 being opposed horizontally to one of the to-be-operated pieces 26, the to-be-operated piece 26 is pressed by the operating lever 28 and the movable pin 19 moves toward the open position, as shown in FIG. 29B. The movable pin 19 thus moves from the closed position to the open position.

The delivery robot CR is arranged to place the substrate W supported by the hand H (see FIG. 1) onto the fixed support portions 17 of the multiple fixed pins 16 and scoop the substrate W supported by the fixed support portions 17 of the multiple fixed pins 16 with the hand H. When the movable pin 19 is moved from the open position to the closed position with the substrate W being supported by the multiple fixed pins 16, the movable gripping portion 22 of the movable pin 19 is pressed against the peripheral portion of the substrate W, so that the substrate W moves horizontally away from the movable pin 19. This causes the peripheral portion of the substrate W to be pressed against the fixed gripping portion 18 of the fixed pin 16 at the position opposite to that of the movable pin 19 and thus the substrate W to be gripped by the fixed pin 16 and the movable pin 19. As a result, the substrate W is maintained solidly in the horizontal attitude.

As shown in FIG. 22, the second substrate holding unit 29 includes the hot plate 30 serving as a support plate arranged to support the substrate W in the horizontal attitude, a support table 34 supporting the hot plate 30, and a plate raising/lowering unit 37 arranged to vertically move the support table 34 to vertically raise/lower the hot plate 30.

As shown in FIG. 22, the hot plate 30 includes a plate main body 31 having a horizontal and flat circular upper surface 31a, multiple support pins 32 arranged to support the substrate W over the plate main body 31 with the lower surface of the substrate W being proximal to the upper surface 31a of the plate main body 31, and multiple heaters 33 arranged to heat the underside of the substrate W held on the multiple support pins 32 at a temperature higher than the room temperature (20 to 30° C., for example). The multiple heaters 33 are an example of the substrate heating unit.

As shown in FIG. 23, the plate main body 31 has an outer diameter smaller (by 6 mm, for example) than that of the substrate W. The plate main body 31 can vertically pass through the space inside the support ring 23. The support pins 32 each include a semi-spherical protruding portion protruding upward from the upper surface 31a of the plate main body 31. The multiple support pins 32 are arranged to support the substrate W over the plate main body 31 with the lower surface of the substrate W and the upper surface 31a of the plate main body 31 being in parallel or approximately in parallel with each other through point contact between the protruding portions and the lower surface of the substrate W.

The support pins 32 may be integrated with or separated from the plate main body 31. Also, the support pins 32 may have the same height or have their respective different heights. In the event of bending of the substrate W, the way of the bending (whether the central portion becomes convex upward or downward) may be predictable to some extent based on the processing that the substrate W had already undergone. Accordingly, the height of each support pin 32 may be adjusted in advance according to the bending of the substrate W such that the substrate W is supported evenly on the multiple support pins 32.

As shown in FIG. 23, the multiple heaters 33 are disposed inside the plate main body 31. The multiple heaters 33 are arranged to heat the entire upper surface 31a of the plate main body 31. The multiple heaters 33 are arranged to heat multiple regions of the upper surface of the substrate W at an independent temperature for each region. Hence, the controller 3 can control the multiple heaters 33 to heat the entire upper surface 31a of the plate main body 31 at the same temperature or generate a temperature difference in the upper surface 31a of the plate main body 31. The heaters 33 include a central heater arranged to heat a central portion of the upper surface 31a of the plate main body 31, an intermediate heater arranged to heat an annular intermediate portion of the upper surface surrounding the central portion of the upper surface 31a of the plate main body 31, and a peripheral heater arranged to heat an annular peripheral portion of the upper surface surrounding the intermediate portion of the upper surface 31a of the plate main body 31.

As shown in FIG. 22, the multiple support pins 32 are arranged to support the substrate W over the plate main body 31 such that the lower surface of the substrate W is opposed to the upper surface 31a of the plate main body 31 with a space of, for example, about 0.1 mm therebetween. Heat from the heaters 33 is transferred to the upper surface 31a of the plate main body 31. Heat from the heaters 33 is transferred to the substrate W through the space between the substrate W and the plate main body 31. Heat from the heaters 33 is also transferred to the substrate W through the support pins 32 in point contact with the lower surface of the substrate W. Since the substrate W and the plate main body 31 are proximal to each other, it is possible to prevent the efficiency of heating the substrate W from decreasing. Further, since the contact area between the substrate W and the support pins 32 is small, it is possible to prevent the uniformity of the temperature of the substrate W from decreasing.

If the lower surface of the substrate W were in plane contact with the upper surface 31a of the plate main body 31, the substrate W might be adsorbed to the plate main body 31 due to a negative pressure occurring therebetween when the lower surface of the substrate W moves vertically away from the upper surface 31a of the plate main body 31. In this preferred embodiment, the substrate W is supported by the multiple support pins 32 with the lower surface of the substrate W being set away from the upper surface 31a of the plate main body 31. It is therefore possible to suppress or prevent such a phenomenon from occurring. Furthermore, since the lower surface of the substrate W is set away from the upper surface 31a of the plate main body 31, it is possible to suppress or prevent foreign matter on the upper surface 31a of the plate main body 31 from adhering to the substrate W.

As shown in FIG. 22, the support table 34 includes a disk-shaped table portion 35 supporting the hot plate 30 and a shaft portion 36 extending downward from a central portion of the table portion 35 along the rotational axis A1. The shaft portion 36 extends from inside to outside the inner chamber 7 through the bottom wall portion 9 of the inner chamber 7. The gap between the shaft portion 36 of the support table 34 and the bottom wall portion 9 of the inner chamber 7 is sealed with an annular sealing member SL2. The plate raising/lowering unit 37 is connected to the shaft portion 36.

The substrate W, when carried into the processing unit 2, is first held on the multiple fixed pins 16 of the first substrate holding unit 15. During this time, the hot plate 30 is retracted to a position lower than that of the first substrate holding unit 15. Thereafter, the hot plate 30 is raised. In the course of the hot plate 30 thus being raised, the substrate W is transferred from the first substrate holding unit 15 to the hot plate 30. When the hot plate 30 is further raised, the substrate W moves to a position higher than the position at which the substrate W is supported by the multiple fixed pins 16. When the hot plate 30 is lowered in this state, the substrate W is transferred from the hot plate 30 to the multiple fixed pins 16. The substrate W is thus transferred between the multiple fixed pins 16 and the hot plate 30 as the hot plate 30 is raised/lowered.

As shown in FIGS. 22 and 25, the plate raising/lowering unit 37 is arranged to move the support table 34 to vertically raise/lower the hot plate 30 between an upper position (as shown in FIG. 25) and a lower position (as shown in FIG. 22). At the upper position, the position at which the substrate W is supported by the multiple fixed pins 16 is over the position at which the substrate W is supported by the hot plate 30. At the lower position, the position at which the substrate W is supported by the multiple fixed pins 16 is lower than the position at which the substrate W is supported by the hot plate 30. At the lower position, the hot plate 30 is retracted downward from the position at which the substrate W is supported by the multiple fixed pins 16. The plate raising/lowering unit 37 can position the hot plate 30 at any height between the upper position and the lower position.

As shown in FIGS. 22 and 25, when the plate raising/lowering unit 37 raises the hot plate 30 to a position higher than the lower surface of the substrate W with the substrate W being supported by the multiple fixed pins 16 of the first substrate holding unit 15 (the gripping of the substrate W being released), the substrate W is transferred from the multiple fixed pins 16 to the hot plate 30. On the contrary, when the plate raising/lowering unit 37 lowers the hot plate 30 to a position lower than the multiple fixed pins 16 with the substrate W being supported by the hot plate 30, the substrate W is transferred from the hot plate 30 to the multiple fixed pins 16.

As shown in FIG. 22, the processing unit 2 includes a lower gas pipe 41 arranged to supply gas therethrough to an upward discharge port 40 opened in a central portion of the upper surface of the hot plate 30, a lower gas valve 42 installed in the lower gas pipe 41, and an inline heater arranged to heat gas to be supplied through the lower gas pipe 41 to the upward discharge port 40. The gas to be supplied to the upward discharge port 40 is nitrogen gas. The gas to be supplied to the upward discharge port 40 is not limited to nitrogen gas, but may be inert gas other than nitrogen gas, such as argon gas, or alternatively dried air or cleaned air. The temperature of the gas to be supplied to the upward discharge port 40 may be equal to or higher than the room temperature.

As shown in FIG. 22, the processing unit 2 includes a scan nozzle arranged to discharge processing liquid or processing gas downward therethrough, a nozzle arm 49 with the scan nozzle attached to the leading end portion thereof, and an arm swinging unit 50 arranged to move the nozzle arm 49. FIG. 22 shows an example in which the processing unit 2 includes two scan nozzles (chemical solution nozzle 43 and rinse liquid nozzle 46). The chemical solution nozzle 43 is connected to a chemical solution pipe 44 with a chemical solution valve 45 installed therein. The rinse liquid nozzle 46 is connected to a rinse liquid pipe 47 with a rinse liquid valve 48 installed therein.

An example of chemical solution to be discharged through the chemical solution nozzle 43 is liquid containing at least one of sulfuric acid, acetic acid, nitric acid, hydrochloric acid, hydrofluoric acid, ammonia water, oxygenated water, organic acid (such as citric acid, oxalic acid), organic alkali (such as TMAH (tetramethylammonium hydroxide)), surface-active agent, and corrosion inhibitor.

The rinse liquid to be discharged through the rinse liquid nozzle 46 is pure water (deionized water). The rinse liquid to be discharged through the rinse liquid nozzle 46 is not limited to pure water, but may be any one of carbonated water, electrolyzed ionic water, hydrogen water, ozone water, and hydrochloric acid water with a dilute concentration (of about 10 to 100 ppm, for example).

The arm swinging unit 50 is arranged to move the leading end portion of the nozzle arm 49 between the inside and outside of the inner chamber 7 through the space between the chamber main body 8 of the inner chamber 7 and the top lid 11 of the inner chamber 7. This causes the scan nozzle to move horizontally between a processing position at which the processing liquid discharged through the scan nozzle lands on the upper surface of the substrate W and a retracted position at which the scan nozzle is retracted to around the substrate W. The processing position includes a central position at which the processing liquid lands on a central portion of the upper surface of the substrate W and a peripheral position at which the processing liquid lands on a peripheral portion of the upper surface of the substrate W.

As shown in FIG. 22, the processing unit 2 includes a fixed nozzle arranged to discharge processing liquid or processing gas downward therethrough. FIG. 22 shows an example in which the processing unit 2 includes three fixed nozzles (upper rinse liquid nozzle 51, upper solvent nozzle 54, and upper gas nozzle 57). The upper rinse liquid nozzle 51, the upper solvent nozzle 54, and the upper gas nozzle 57 are held on the top lid 11 and arranged to be vertically raised/lowered together with the top lid 11. The upper rinse liquid nozzle 51, the upper solvent nozzle 54, and the upper gas nozzle 57 are disposed with a through hole vertically penetrating the central portion of the top lid 11. The upper rinse liquid nozzle 51 is connected to an upper rinse liquid pipe 52 with an upper rinse liquid valve 53 installed therein. The upper solvent nozzle 54 is connected to an upper solvent pipe 55 with an upper solvent valve 56 installed therein. The upper gas nozzle 57 is connected to an upper gas pipe 58 with an upper gas valve 59 installed therein.

The rinse liquid to be discharged through the upper rinse liquid nozzle 51 is pure water. The rinse liquid to be discharged through the upper rinse liquid nozzle 51 is not limited to pure water, but may be another rinse liquid such as described above.

The solvent liquid to be discharged through the upper solvent nozzle 54 is room-temperature IPA liquid. The IPA liquid is an example of a low-surface-tension liquid having a surface tension lower than that of water and a boiling point lower than that of water. The low-surface-tension liquid is not limited to IPA, but may be HFE (hydrofluoroether) liquid.

The gas to be supplied to the upper gas nozzle 57 is room-temperature nitrogen gas. The gas to be supplied to the upper gas nozzle 57 is not limited to nitrogen gas, but may be inert gas other than nitrogen gas, such as argon gas, or alternatively dried air or cleaned air. The temperature of the gas to be supplied to the upper gas nozzle 57 may be higher than the room temperature.

As shown in FIG. 22, the cup 38 can be raised/lowered vertically between an upper position (as shown in FIG. 22) and a lower position. The upper position is a processing position at which the upper end of the cup 38 is positioned at a height between the upper end of the lower peripheral wall portion 10 of the inner chamber 7 and the nozzle arm 49. The lower position is a retracted position at which the upper end of the cup 38 is positioned lower than the upper end of the lower peripheral wall portion 10 of the inner chamber 7. The processing unit 2 includes a cup raising/lowering unit (not shown) arranged to vertically raise/lower the cup 38 between the upper position and the lower position. When the top lid 11 and the cup 38 are at the upper position, the processing liquid discharged from the substrate W that is held on the first substrate holding unit 15 to around the substrate W is received by and collected in the cup 38. The processing liquid collected in the cup 38 is then sent to recovery equipment or waste liquid equipment not shown.

Figure 26:
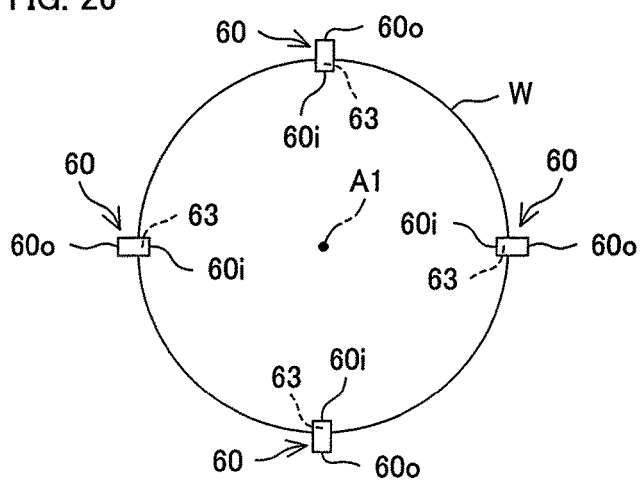
FIG. 26 is a plan view showing the positional relationship between multiple guiding members and the substrate.

As shown in FIG. 26, the processing unit 2 includes multiple (three or more, four, for example) guiding members 60 arranged to guide outward liquid on the substrate W. As shown in FIG. 25, the guiding members 60 each have a vertically extending first portion 61 and a second portion 62 extending inward (toward the rotational axis A1) from the first portion 61. The guiding members 60 are held on the top lid 11 and arranged to be vertically raised/lowered together with the top lid 11. As shown in FIG. 26, the multiple guiding members 60 are arranged in an equally spaced manner in the circumferential direction of the substrate W. The inner end 60*i* of each guiding member 60 is located at a position overlapping the substrate W in a plan view. The outer end 60*o* of each guiding member 60 is located at a position not overlapping the substrate W (around the substrate W) in a plan view.

The description of the guiding members 60 will hereinafter be continued based on the state where the top lid 11 is at the lower position. As shown in FIG. 25, each of the guiding members 60 has an inner surface opposed in a spaced manner to the upper surface and the peripheral portion of the substrate W. The inner surface of the guiding member 60 has an outward guiding surface 63 extending obliquely downward and outward and a downward guiding surface 64 extending vertically downward from the outer end 63*o* (lower end) of the outward guiding surface 63. The height of the inner end 63*i* of the outward guiding surface 63 is set to be at a higher position than the flat portion of the upper surface of the substrate W in an organic solvent heating step and an organic solvent removing step to be described hereinafter. The outer end 63*o* of the outward guiding surface 63 is located on the outer side of the substrate W. The height of the outer end 63*o* of the outward guiding surface 63 is set to be at a position lower than the upper surface of the substrate W and higher than the lower surface of the substrate W in the organic solvent heating step and the organic solvent removing step. The lower end of the downward guiding surface 64 is located lower than the substrate W in the organic solvent heating step and the organic solvent removing step.

As shown in FIG. 14A, the substrate W to be processed in the processing unit 2 is, for example, a silicon wafer with a pattern 101 formed on the front surface (upper surface 100) thereof serving as a pattern formed surface.

As shown in FIG. 14A, the pattern 101 may have convex (columnar) structures 102 arranged in a matrix manner. In this case, the width W1 of the structures 102 is, for example, about 10 to 45 nm. The gap W2 between adjacent the structures 102 is, for example, about 10 nm to a few micrometers. The film thickness T (see FIG. 14A) of the pattern 101 is, for example, about 50 nm to 5 μm. The aspect ratio (the ratio of the film thickness T to the width W1) of the pattern 101 may be, for example, about 5 to 500 (typically about 5 to 50).

The pattern 101 includes, for example, an insulating film. The pattern 101 may also include a conductor film. More specifically, the pattern 101 may be formed of a multi-layer film of multiple layered films. The multi-layer film may include an insulating film and a conductor film. The pattern 101 may alternatively be formed of a single-layer film. The insulating film may be a silicon oxide film ($SiO_2$ film) or a silicon nitride film (SiN film). The conductor film may be an amorphous silicon film into which impurities are introduced for resistance reduction or a metal film (metal wiring film, for example).

It is noted that the pattern 101 may include repetitively arranged linear patterns each defined by a fine trench. Alternatively, the pattern 101 may be defined by providing multiple fine holes (voids or pores) in a thin film.

Next will be described an example of processing to be performed on the substrate W in the processing unit 2. Hereinafter, reference will be made to FIGS. 22 and 30. For processing of the substrate W in the processing unit 2, a carry-in step (step S1 in FIG. 30) is performed to carry the substrate W into the outer chamber 4.

Specifically, the controller 3 causes the hand H of the delivery robot CR holding the substrate W to enter the outer chamber 4 with the top lid 11, the nozzle arm 49, and the cup 38 being retracted. The controller 3 then controls the delivery robot CR such that the substrate W on the hand H is placed on the multiple fixed pins 16. During this time, the hot plate 30 is located at a height at which the chuck opening/closing unit 25 can drive the movable pins 19, while at a position lower than the height at which contactable with the lower surface (rear surface) of the substrate W. Further, the chuck opening/closing unit 25 sets the movable pins 19 at the open position. The controller 3 retracts the hand H of the delivery robot CR from inside the outer chamber 4 after the substrate W is placed on the multiple fixed pins 16 with the front surface, that is, the pattern formed surface facing upward.

After the substrate W is placed on the fixed support portions 17 of the multiple fixed pins 16, the controller 3 controls the chuck opening/closing unit 25 to move the movable pins 19 from the open position to the closed position. This causes the movable gripping portions 22 of the movable pins 19 to be pressed against the peripheral portion of the substrate W and the fixed gripping portions 18 of the fixed pins 16 to be pressed against the peripheral portion of the substrate W. As a result, the substrate W is gripped by the fixed pins 16 and the movable pins 19 in the horizontal attitude. After the substrate W is thus gripped, the controller 3 then controls the ring rotating unit 24 to start rotating the substrate W. Further, the controller 3 raises the cup 38 to the upper position at which the cup 38 can receive the processing liquid discharged from the substrate 3.

Next, a chemical solution supplying step (step S2 in FIG. 30) is performed to supply chemical solution onto the substrate W.

Specifically, the controller 3 controls the arm swinging unit 50 to move the nozzle arm 49 from the retracted position to the processing position with the top lid 11 being retracted to the upper position and the hot plate 30 being set away from the substrate W. This causes the chemical solution nozzle 43 to move over the substrate W through between the lower peripheral wall portion 10 of the inner chamber 7 and the upper peripheral wall portion 13 of the inner chamber 7. After thus moving the chemical solution nozzle 43 over the substrate W, the controller 3 opens the chemical solution valve 45 to cause the chemical solution nozzle 43 to discharge chemical solution therethrough onto the upper surface of the rotating substrate W. In this state, the controller 3 controls the arm swinging unit 50 to move the chemical solution landing position on the upper surface of the substrate W between the central portion and the peripheral portion. When a predetermined time has elapsed since the opening of the chemical solution valve 45, the controller 3 then closes the chemical solution valve 45 to stop the discharge of the chemical solution.

The chemical solution discharged through the chemical solution nozzle 43 lands on the upper surface of the substrate W and then, under a centrifugal force, flows outward along the upper surface of the substrate W. The chemical solution splattering from the peripheral portion of the substrate W to around the substrate W then passes over the lower peripheral wall portion 10 of the inner chamber 7 to be received by the cup 38. The chemical solution is supplied onto the entire upper surface of the substrate W to form a liquid film covering the entire upper surface of the substrate W. Further, since the controller 3 moves the chemical solution landing position on the upper surface of the substrate W between the central portion and the peripheral portion with the substrate W rotating, the chemical solution landing position runs across the upper surface of the substrate W. As a result, the upper surface of the substrate W is processed uniformly with the chemical solution.

Next, a first rinse liquid supplying step (step S3 in FIG. 30) is performed to supply pure water, an example of the rinse liquid, onto the substrate W.

Specifically, the controller 3 opens the rinse liquid valve 48 with the rinse liquid nozzle 46 held on the nozzle arm 49 being positioned over the substrate W and the hot plate 30 being set away from the substrate W. This causes pure water to be discharged through the rinse liquid nozzle 46 toward the central portion of the upper surface of the rotating substrate W. As a result, the chemical solution on the substrate W is rinsed off by the pure water and a liquid film of pure water is formed covering the entire upper surface of the substrate W. When a predetermined time has elapsed since the opening of the rinse liquid valve 48, the controller 3 then closes the rinse liquid valve 48 to stop the discharge of the pure water. Thereafter, the controller 3 controls the arm swinging unit 50 to move the nozzle arm 49 from the processing position to the retracted position.

Next, an inner chamber sealing step (step S4 in FIG. 30) is performed to close the inner chamber 7.

Specifically, the controller 3 controls the lid raising/lowering unit 14 to move the top lid 11 from the upper position to the lower position with the nozzle arm 49 being retracted to the retracted position and the entire upper surface of the substrate W being covered with the liquid film of pure water. This causes the gap between the upper peripheral wall portion 13 of the top lid 11 and the lower peripheral wall portion 10 of the chamber main body 8 to be sealed. During this time, the substrate W is gripped by the fixed pins 16 and the movable pins 19. Also, the hot plate 30 is set away from the substrate W at a height at which heat from the heaters 33, if may be generated, is not sufficiently transferred to the substrate W.

Next, a second rinse liquid supplying step (step S5 in FIG. 30) is performed to supply pure water, an example of the rinse liquid, onto the substrate W.

Specifically, after the top lid 11 is moved to the lower position, the controller 3 opens the upper rinse liquid valve 53 to cause the upper rinse liquid nozzle 51 to discharge pure water therethrough toward the central portion of the upper surface of the rotating substrate W. This causes a liquid film covering the entire upper surface of the substrate W to be formed by the pure water discharged through the upper rinse liquid nozzle 51. The pure water splattering from the peripheral portion of the substrate W to around the substrate W is discharged through the bottom wall portion 9 of the chamber main body 8. When a predetermined time has elapsed since the opening of the upper rinse liquid valve 53, the controller 3 closes the upper rinse liquid valve 53 to stop the discharge of the pure water.

Next, an organic solvent supplying step (step S6 in FIG. 30) is performed to supply IPA liquid, an example of the organic solvent, onto the substrate W with the inner chamber 7 being closed.

Specifically, the controller 3 opens the upper solvent valve 56 with the inner chamber 7 being closed and the entire upper surface of the substrate W being covered with the liquid film of pure water. During this time, the substrate W is gripped by the fixed pins 16 and the movable pins 19 and the hot plate 30 is set away from the substrate W. The IPA liquid discharged through the upper solvent nozzle 54 lands on the central portion of the upper surface of the rotating substrate W and flows outward along the upper surface of the substrate W. This causes the pure water on the substrate W to be replaced with the IPA liquid and an IPA liquid film to be formed covering the entire upper surface of the substrate W. When a predetermined time has elapsed since the opening of the upper solvent valve 56, the controller 3 then closes the upper solvent valve 56 to stop the discharge of the IPA.

While the upper solvent nozzle 54 discharges the IPA liquid therethrough, the rotational speed of the substrate W may be constant or change. For example, the substrate W may be rotated at a replacement accelerating speed (800 rpm, for example) only in the early period of the discharge of the IPA liquid to accelerate the replacement of pure water with IPA, and then rotated at a post-replacement speed lower than the replacement accelerating speed. After the completion of the replacement with IPA, an IPA puddle covering the entire upper surface of the substrate W may be maintained on the substrate W with the discharge of the IPA being stopped. Specifically, the discharge of the IPA through the upper solvent nozzle 54 may be stopped after reducing the rotational speed of the substrate W to a puddling speed (higher than 0 but lower than 50 rpm, 20 rpm, for example) or stopping the rotation of the substrate W. In this case, since the amount of IPA discharge from the substrate W decreases with a reduction in the centrifugal force, an IPA puddle with a predetermined film thickness is maintained on the substrate W.

Next, a first substrate transferring step (step S7 in FIG. 30) is performed to move the substrate W from the first substrate holding unit 15 to the second substrate holding unit 29. Specifically, the controller 3 controls the rotational angle of the support ring 23 and the height of the hot plate 30 to move the chuck opening/closing unit 25 and the movable pins 19 to a position at which the chuck opening/closing unit 25, which is held on the hot plate 30, can drive the movable pins 19 on the support ring 23. The controller 3 then controls the chuck opening/closing unit 25 to move the movable pins 19 from the closed position to the open position. This causes the gripping of the substrate W by the fixed pins 16 and the movable pins 19 to be released, so that the substrate W is supported by the multiple fixed pins 16 without being gripped thereby. The controller 3 controls the plate raising/lowering unit 37 to move the hot plate 30 upward. This causes the substrate W to be raised by the support pins 32 of the hot plate 30 away from the multiple fixed pins 16. The controller 3 raises the hot plate 30 to a position short of where the IPA liquid film on the substrate W comes into contact with the outward guiding surface 63 and the downward guiding surface 64 of the guiding member 60 (see FIG. 25).

Next, an organic solvent heating step (step S8 in FIG. 30) is performed to vaporize the IPA liquid on the substrate W to form a gaseous phase between the IPA liquid film and the upper surface of the substrate W.

Specifically, the controller 3 starts energizing the heaters 33 to cause the heaters 33 to produce heat. The heaters 33 may begin producing heat at the same time as the substrate W is supported by the hot plate 30 or before or after the substrate W is supported by the hot plate 30. The heaters 33 thus producing heat cause the temperature of the hot plate 30 (the temperature of the plate main body 31) to reach a liquid film raising temperature higher than the boiling point of IPA (82.4° C.) (by, for example, 10 to 50° C.) and be kept at the temperature. This causes the IPA liquid in every position of the upper surface of the substrate W to be vaporized and the IPA liquid film to be set away from the upper surface of the substrate W. It is noted that during this time, the substrate W and the multiple guiding members 60 are set in a positional relationship in which the raised IPA liquid film cannot come into contact with the outward guiding surfaces 63 and the downward guiding surfaces 64 of the multiple guiding members 60. The raising of the IPA liquid film will hereinafter be described in detail.

Next, an organic solvent removing step (step S9 in FIG. 30) is performed to remove the IPA liquid film from the substrate W with the gaseous phase existing between the IPA liquid film and the upper surface of the substrate W.

Specifically, the controller 3 brings the outward guiding surfaces 63 of the multiple guiding members 60 into contact with the peripheral portion of the IPA liquid film with the IPA liquid film being raised over the upper surface of the substrate W. For example, the controller 3 raises the hot plate 30 slightly higher than in the organic solvent heating step (step S8 in FIG. 30) to bring the outward guiding surfaces 63 of the multiple guiding members 60 into contact with the IPA liquid film on the substrate W. Alternatively, the height of the hot plate 30 may be the same in the organic solvent heating step and in the organic solvent removing step. That is, the IPA liquid film on the substrate W may have been in contact with the outward guiding surfaces 63 of the multiple guiding members 60 already in the organic solvent heating step (step S8). The IPA liquid film moves with respect to the substrate W through contact with the multiple guiding members 60 to be removed from the substrate W. The removal of the IPA liquid film will hereinafter be described in detail.

It is noted that whether or not the hot plate 30 is raised slightly from the organic solvent heating step (step S8) to the organic solvent removing step (step S9), the positional relationship between the multiple guiding members 60 and the substrate W in the organic solvent removing step (S9) is set such that the multiple guiding members 60 are at higher positions than that of the substrate W being supported by the multiple fixed pins 16.

Next, a second substrate transferring step (step S10 in FIG. 30) is performed to move the substrate W from the second substrate holding unit 29 to the first substrate holding unit 15.

Specifically, the controller 3 controls the rotational angle of the support ring 23 and the height of the hot plate 30 to move the chuck opening/closing unit 25 and the movable pins 19 to a position at which the chuck opening/closing unit 25 can drive the movable pins 19. Since the chuck opening/closing unit 25 is a constantly-closing unit, the movable pins 19 are at the closed position. Hence, the controller 3 controls the chuck opening/closing unit 25 to move the movable pins 19 from the closed position to the open position. The controller 3 controls the plate raising/lowering unit 37 to lower the hot plate 30 in this state. This causes the multiple fixed pins 16 to come into contact with the lower surface of the substrate W and the hot plate 30 to be set away from the lower surface of the substrate W.

Next, an inner chamber opening step (step S11 in FIG. 30) is performed to open the inner chamber 7 and a carry-out step (step S12 in FIG. 30) is performed to carry the substrate W out of the outer chamber 4.

Specifically, the controller 3 controls the lid raising/lowering unit 14 to move the top lid 11 from the lower position to the upper position. During this time, the hot plate 30 is located at a position at which the chuck opening/closing unit 25 can drive the movable pins 19, while set away from the substrate W. The chuck opening/closing unit sets the movable pins 19 at the open position. The controller 3 causes the hand H of the delivery robot CR to enter the outer chamber 4 with the top lid 11 being retracted to the upper position and the cup 38 being at the lower position. The controller 3 then causes the hand H of the delivery robot CR to support the substrate W that is supported by the multiple fixed pins 16. The controller 3 then retracts the hand H of the delivery robot CR from inside the outer chamber 4. The processed substrate W is thus carried out of the outer chamber 4.

Next will be described in detail the raising of the IPA liquid film in the organic solvent heating step (step S8 in FIG. 30).

The substrate W, the entire upper surface of which is covered with the IPA liquid film, is heated uniformly at the liquid film raising temperature in the organic solvent heating step (step S8 in FIG. 30) and kept at the liquid film raising temperature. Further, the IPA liquid film on the substrate W is heated with the substrate W not rotating but remaining at rest. The liquid film raising temperature is higher than the boiling point of IPA (82.4° C.) by a predetermined temperature (10 to 50° C., for example). The liquid film raising temperature is a temperature at which the raised IPA liquid film cannot come to the boil.

Since the temperature of the substrate W is higher than the boiling point of IPA, the IPA liquid in every portion of the upper surface of the substrate W is vaporized into IPA vapor. Further, as the temperature of the IPA liquid increases, a small amount of gas contained in the IPA liquid expands. As a result, air bubbles occur in the vicinity of the upper surface of the substrate W (the upper surface of the base material and the surface of the pattern).

As shown in FIG. 14A, the interior of the pattern 101 (the space between two adjacent structures or the interior space of a cylindrical structure) is filled with the IPA liquid. When IPA vapor is generated, the interior of the pattern 101 is filled with the gas. That is, as shown in FIG. 14B, the IPA liquid within the pattern 101 is discharged instantaneously from inside the pattern 101 when the substrate W is heated. Further, the IPA liquid film 111 on the substrate W is raised gradually with the generation of the IPA vapor and separated from the pattern 101. That is, a gaseous phase 112 containing the IPA vapor exists between the upper surface of the pattern 101 (the upper end face 102A of each structure 102) and the IPA liquid film 111, so that the IPA liquid film 111 is supported by the substrate W with the gaseous phase 112 therebetween.

Figure 14D:
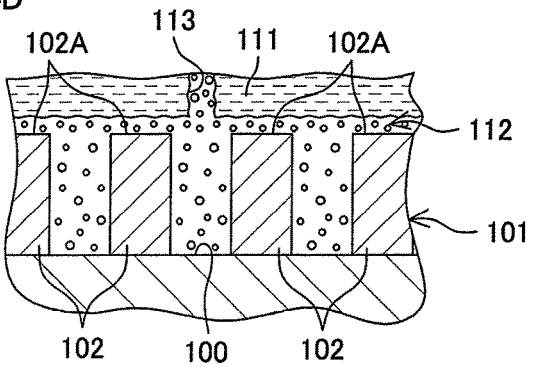
FIG. 14D is a schematic cross-sectional view for illustrating the condition of the upper surface of the substrate in the first example of processing shown in FIG. 12.

As shown in FIG. 14D, a crack and/or a break (hereinafter referred to collectively as "crack 113") could occur in the IPA liquid film 111 raised over the upper surface of the substrate W. After drying, a defect such as a watermark could also occur at the crack 113. It is therefore necessary to suppress or prevent the occurrence of such a crack 113 in the raised IPA liquid film 111 during the organic solvent heating step (step S8 in FIG. 30).

The following two factors may cause the occurrence of such a crack 113 in the raised IPA liquid film 111.

The first factor is the generation of a larger amount of IPA vapor and/or the boiling of the IPA liquid film 111 due to prolonged heating of the substrate W. The generation of a larger amount of IPA vapor and/or the boiling of the IPA liquid film 111 would result in that the IPA vapor cuts through the IPA liquid film 111 located over the IPA vapor and spouts upward through the IPA liquid film 111. As a result, a crack 113 could occur in the IPA liquid film 111. The first factor is addressed by adjusting the liquid film raising temperature and/or the time for heating the liquid film.

The second factor is the split of the IPA liquid film 111 caused by a centrifugal force due to the rotation of the substrate W. The second factor is addressed by stopping the rotation of the substrate W. That is, the rotation of the substrate W is stopped during the organic solvent heating step (step S8 in FIG. 30). This can prevent the IPA liquid film 111 from being split due to a centrifugal force. It is therefore possible to prevent such a crack 113.

In addition, if the pattern has a high aspect ratio, the contact area between the surface of the pattern and the IPA liquid increases and the efficiency of heat transfer from the substrate W to the IPA liquid also increases, resulting in that the temperature of the substrate W can easily decrease. Further, if the pattern has a high aspect ratio, the amount of IPA liquid existing within the pattern increases, so that it is necessary to provide a larger amount of heat to the substrate W to remove the IPA liquid within the pattern in a short time. Hence, the temperature of the hot plate 30 may be adjusted according to the aspect ratio of the pattern.

Next will be described in detail the removal of the IPA liquid film in the organic solvent removing step (step S9 in FIG. 30).

When the gaseous phase exists between the IPA liquid film and the upper surface of the substrate W, only a small frictional resistance, which may be considered zero, acts on the IPA liquid film on the substrate W. As a result, if a force in a direction in parallel with the upper surface of the substrate W acts on the raised IPA liquid film, the IPA liquid film moves easily.

Figure 30:
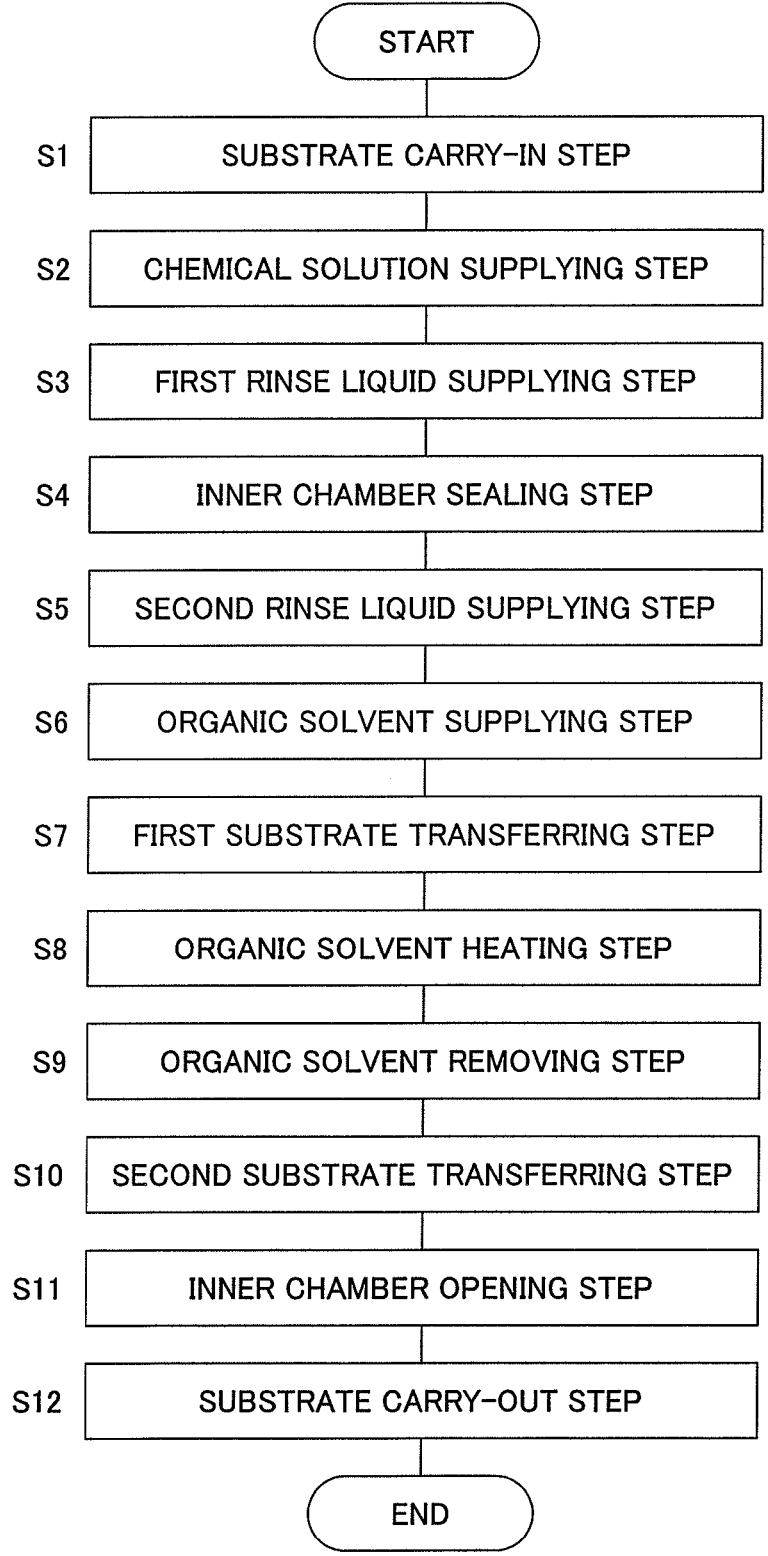
FIG. 30 is a process chart for illustrating an example of processing to be performed on the substrate in the processing unit.
Figure 31:
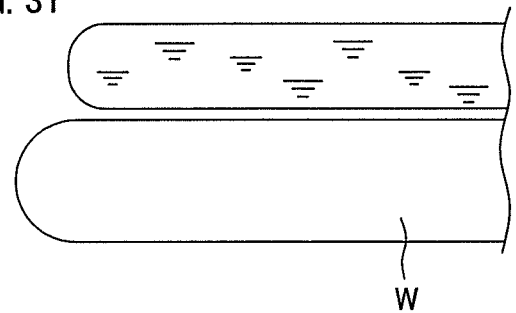
FIG. 31 is a schematic view showing a state where a film of IPA liquid is raised over the upper surface of the substrate.
Figure 32:
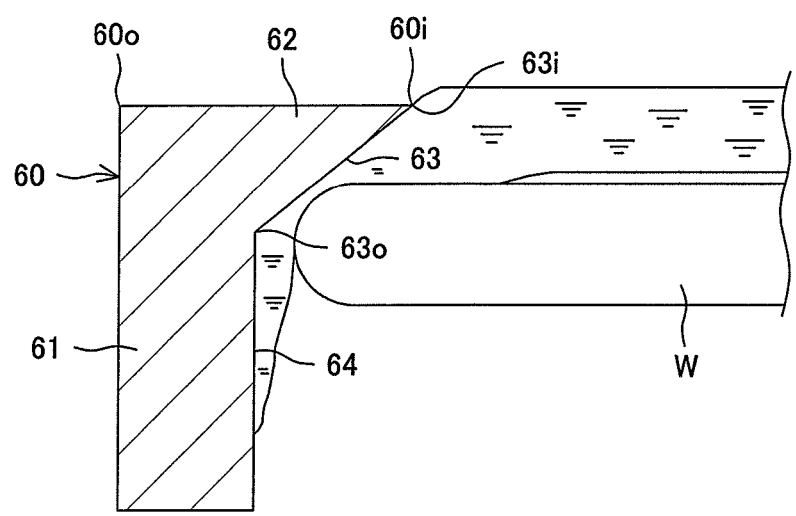
FIG. 32 is a schematic view showing a state where the film of IPA liquid on the substrate is guided by the guiding member.

In the organic solvent removing step (step S9 in FIG. 30), the guiding members 60 come into contact with the peripheral portion of the IPA liquid film being raised over the upper surface of the substrate W (in the state shown in FIG. 31). As shown in FIG. 32, when the guiding member 60 comes into contact with the peripheral portion of the IPA liquid film, the IPA liquid film (IPA liquid) is partially transferred from the substrate W to the outward guiding surface 63 of the guiding member 60 to flow outward along the outward guiding surface 63 of the guiding member 60. Further, the IPA, which is guided outward by the outward guiding surface 63 of the guiding member 60, is guided downward by the downward guiding surface 64 of the guiding member 60. Thus, the IPA liquid is discharged from the outer peripheral portion of the upper surface of the substrate W.

When the IPA liquid on the substrate W is discharged along the guiding member 60, an outward flow is formed in the IPA liquid film. That is, a force having a component in a direction in parallel with the upper surface of the substrate W acts on the raised IPA liquid film. As a result, the IPA liquid on the substrate W moves continuously outward on the substrate W to be discharged from the substrate W along the guiding member 60 or through between two circumferentially adjacent guiding members 60 (see FIG. 26). This causes the IPA liquid film to be removed from the substrate W along the peripheral portion of the substrate W directly as a single continued mass without being distributed on the upper surface of the substrate W.

The IPA liquid film is removed from the substrate W by being raised over the upper surface of the substrate W, that is, the interior of the pattern 101 being not filled with liquid. After the IPA liquid film is removed from the substrate W, no liquid remains on the substrate W and the substrate W is dried. Even if the IPA liquid might remain, the amount would be very small so as not to cause destruction of the pattern 101 and/or occurrence of a watermark and vaporized immediately. Thus, the substrate W is dried with the interior of the pattern 101 being not filled with liquid. If the substrate W is dried with the interior of the pattern 101 being filled with liquid, a force brought about by a surface tension is applied from the liquid to the pattern 101, which may result in destruction of the pattern 101. On the other hand, in the second preferred embodiment, since the liquid within the pattern 101 is removed, it is possible to suppress or prevent the pattern 101 from being collapsed.

As described heretofore, in the second preferred embodiment, the outward guiding surfaces 63 of the guiding members 60 come into contact with the peripheral portion of the IPA liquid film on the substrate W with the gaseous phase existing between the IPA liquid film and the upper surface of the substrate W. The IPA liquid coming into contact with the outward guiding surfaces 63 is discharged to around the substrate W along the guiding members 60. With this contact between the guiding members 60 and the liquid film, an outward flow toward the peripheral portion of the substrate W is formed in the IPA liquid film, so that the film of the IPA liquid film on the substrate W is removed from the substrate directly as a mass without being split into a number of small droplets. This allows the IPA liquid film to be removed quickly from the substrate in a short time.

Also, in the second preferred embodiment, the multiple guiding members 60 are provided in the processing unit 2. When the outward guiding surfaces 63 of the guiding members 60 come into contact with the IPA liquid film on the substrate W, a force guiding outward the IPA liquid on the substrate W acts on the IPA liquid film on the substrate W. The multiple outward guiding surfaces 63, which are arranged in an equally spaced manner in the circumferential direction of the substrate W, come into contact with the IPA liquid film on the substrate W at multiple positions separated in an equally spaced manner in the circumferential direction of the substrate W. Thus, the IPA liquid film on the substrate W is guided uniformly outward by the multiple outward guiding surfaces 63. It is therefore possible to uniformly remove the IPA liquid film from the substrate W.

Further, in the second preferred embodiment, the gaseous phase is formed between the IPA liquid film and the upper surface of the substrate W with the substrate W being supported only by the hot plate 30 and the peripheral portion of the substrate W being not in contact with the fixed pins 16 or the movable pins 19. The IPA liquid film raised over the upper surface of the substrate W is easily movable along the upper surface of the substrate W. Since the fixed pins 16 and the movable pins 19 are set away from the peripheral portion of the substrate W when the IPA liquid film is raised, it is possible to prevent the IPA liquid film from being removed unintentionally from the substrate W through contact with the fixed pins 16 or the movable pins 19.

Furthermore, in the second preferred embodiment, the substrate W is dried with the IPA liquid, an example of the low-surface-tension liquid, being positioned on the substrate W. Since the liquid on the substrate W before drying has a low surface tension, even if a liquid surface across two adjacent structures may be formed temporarily, only a low surface tension is applied on the pattern 101. It is therefore possible to reduce the occurrence of pattern collapse. Further, since the volatile liquid (IPA liquid) is supplied onto the substrate W, it is possible to form a gaseous phase between the IPA liquid film and the upper surface of the substrate W while avoiding a rise in the temperature of the heaters 33.

Also, in the second preferred embodiment, the inner chamber 7 to house the first substrate holding unit 15 and the second substrate holding unit 29 therein is disposed within the outer chamber 4. Since the inner chamber 7 is openable/closable, the interior of the inner chamber 7 can be isolated from the interior of the outer chamber 4 excluding the inner chamber 7 as needed. It is therefore possible to form a space with a high degree of sealing with a double enclosure provided by the inner chamber 7 and the outer chamber 4 as needed. It is thus possible to perform processing such as heating of the substrate W within the space of such a high degree of sealing. Further, since only by opening the inner chamber 7, a nozzle arranged to discharge gas or liquid therethrough can be transferred between the inside and outside of the inner chamber 7, there is no need to dispose such a nozzle within the inner chamber 7. It is therefore possible to suppress or prevent the inner chamber 7 from growing in size.

Further, in the second preferred embodiment, since inert gas can be supplied into the inner chamber 7 housing the first substrate holding unit 15 and the second substrate holding unit 29, the air inside the inner chamber 7 can be replaced with the inert gas and the concentration of oxygen within the inner chamber 7 can be lowered. It is therefore possible to prevent the occurrence of problems caused by oxygen, such as watermarks.

While the second preferred embodiment of the present invention has heretofore been described, the present invention is not limited to the disclosure of the second preferred embodiment, but may be modified variously within the scope of the present invention.

Although the second preferred embodiment has been described based, for example, on the case where the outward guiding surface 63 and the downward guiding surface 64 are provided on each guiding member 60, the first portion 61 including the downward guiding surface 64 may be omitted.

Figure 33:
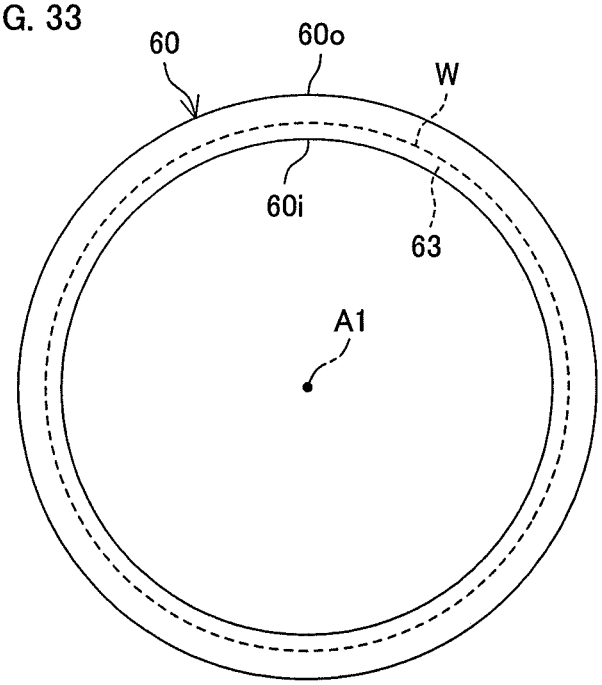
FIG. 33 is a plan view of a guiding member according to a third preferred embodiment of the present invention.

Also, as shown in FIG. 33, the guiding member 60 may have an annular shape extending along the peripheral portion of the substrate W and continued over the entire circumference. Alternatively, the guiding member 60 may have an arc shape extending along the peripheral portion of the substrate W.

In accordance with the arrangement above, since the outward guiding surface 63 extends along the peripheral portion of the substrate W, it is possible to increase the contact area between the outward guiding surface 63 and the liquid film. This can increase the force guiding outward the IPA liquid on the substrate W. Further, if the guiding member 60 has an annular shape, the annular outward guiding surface 63 comes into contact with the entire circumference of the peripheral portion of the liquid film, so that the IPA liquid film on the substrate W is guided uniformly outward by the annular outward guiding surface 63. It is therefore possible to uniformly remove the IPA liquid film from the substrate W.

The raising/lowering operation of the hot plate 30 in the case of using the arc-shaped guiding member 60 is the same as in the second preferred embodiment. That is, in the first substrate transferring step (step S7 in FIG. 30), the hot plate 30 is raised to a position short of where the IPA liquid film on the substrate W comes into contact with the outward guiding surface 63 and the downward guiding surface 64 of the guiding member 60. Also, in the organic solvent removing step (step S9 in FIG. 30), the hot plate 30 is raised to a height at which the IPA liquid film on the substrate W can come into contact with the outward guiding surface 63 of the guiding member 60. However, if the guiding member 60 has been in contact with the IPA liquid film already in the organic solvent heating step (step S8 in FIG. 30), it is not necessary to raise the substrate W in the organic solvent removing step (step S9).

Figure 34:
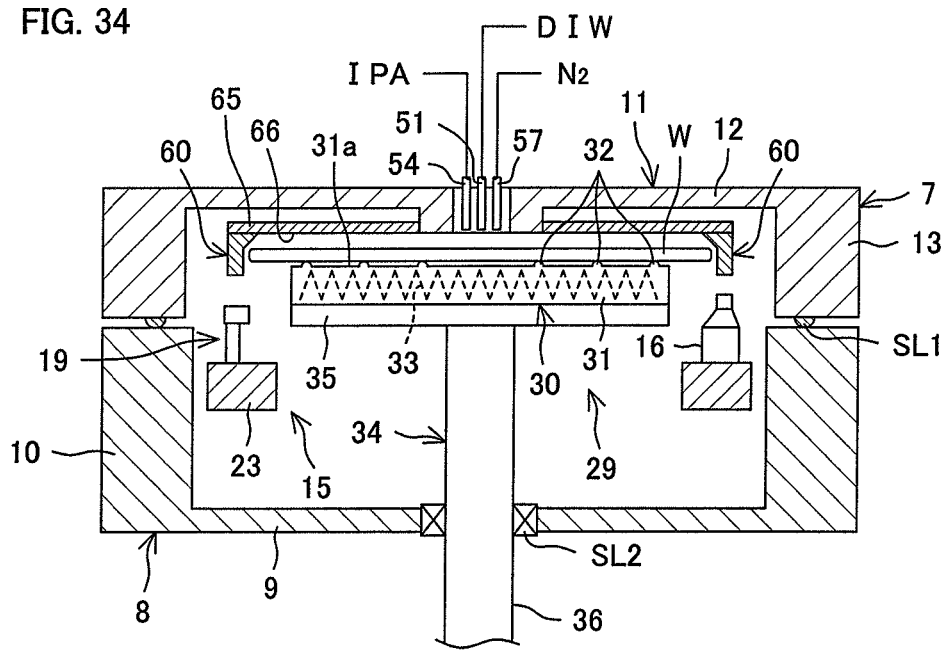
FIG. 34 is a partial schematic view of a processing unit according to a fourth preferred embodiment of the present invention.

Further, as shown in FIG. 34, the processing unit 2 may further include an opposing member 65 having an opposing surface 66 opposed to the upper surface of the substrate W held on the second substrate holding unit 29. The opposing member 65 is held on the top lid 11 and arranged to be vertically raised/lowered together with the top lid 11. The opposing surface 66 is, for example, a flat surface in parallel with the upper surface of the substrate W. The opposing surface 66 has an outer diameter greater than that of the substrate W. The opposing surface 66 is located at the same height as the lower end of the through hole vertically penetrating the central portion of the top lid 11. The guiding member 60 protrudes downward from a peripheral portion of the opposing surface 66.

In accordance with the arrangement above, the upper surface of the substrate W is covered with the opposing surface 66 of the opposing member 65. In this state, the IPA liquid film on the substrate W is guided outward by the guiding member 60. It is therefore possible to remove the IPA liquid film from the substrate W while protecting the exposed portion of the upper surface of the substrate W with the opposing member 65.

The raising/lowering operation of the hot plate 30 in the case of using the guiding member 60 attached to the opposing member 65 is the same as in the second preferred embodiment. That is, in the first substrate transferring step (step S7 in FIG. 30), the hot plate 30 is raised to a position short of where the IPA liquid film on the substrate W comes into contact with the outward guiding surface 63 and the downward guiding surface 64 of the guiding member 60. Also, in the organic solvent removing step (step S9 in FIG. 30), the hot plate 30 is raised to a height at which the IPA liquid film on the substrate W can come into contact with the outward guiding surface 63 of the guiding member 60 (and cannot come into contact with the opposing surface 66). However, if the guiding member 60 has been in contact with the IPA liquid film already in the organic solvent heating step (step S8 in FIG. 30), it is not necessary to raise the substrate W in the organic solvent removing step (step S9).

Figure 35A:
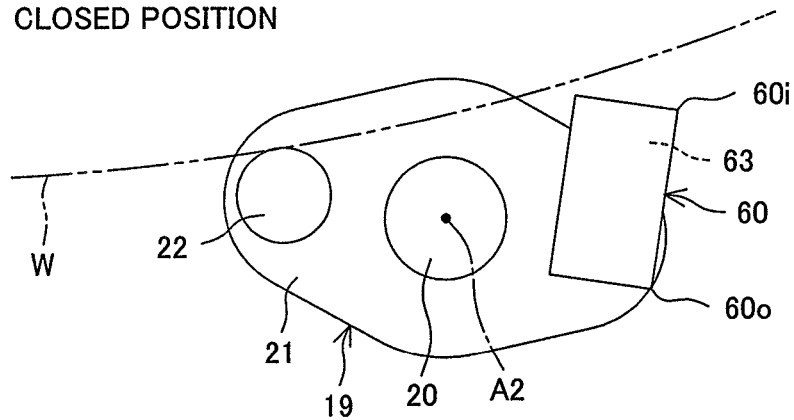
FIG. 35A is a plan view of a guiding member and a movable pin according to a fifth preferred embodiment of the present invention, showing a state where the movable pin is at a closed position.
Figure 35B:
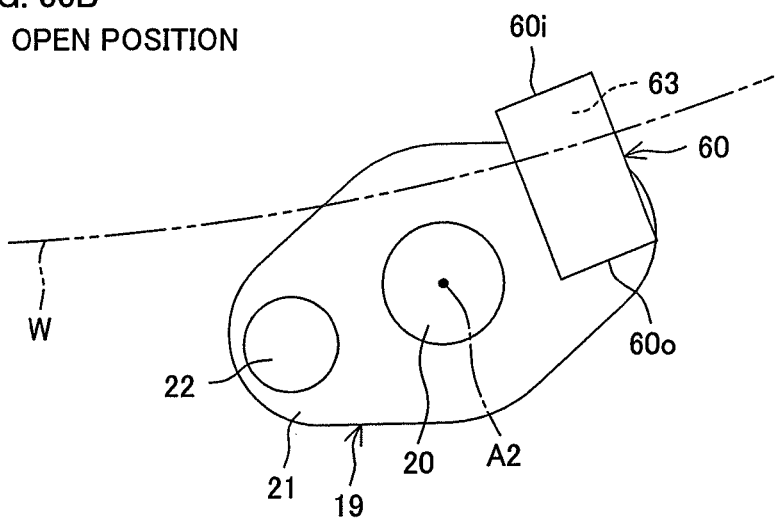
FIG. 35B is a plan view of the guiding member and the movable pin according to the fifth preferred embodiment of the present invention, showing a state where the movable pin is at an open position.

Also, as shown in FIGS. 35A and 35B, the guiding member 60 may be provided on the movable pin 19. The guiding member 60 extends upward from the base portion 21 of the movable pin 19. The chuck opening/closing unit 25 is arranged to move the movable pin 19 among a closed position at which the movable gripping portion 22 of the movable pin 19 is pressed against the peripheral portion of the substrate W and the outward guiding surface 63 of the guiding member 60 is set away from the IPA liquid film on the substrate W, a middle position at which the movable gripping portion 22 is set away from the peripheral portion of the substrate W and the outward guiding surface 63 is set away from the IPA liquid film on the substrate W, and an open position at which the movable gripping portion 22 is set away from the peripheral portion of the substrate W and the outward guiding surface 63 is in contact with the IPA liquid film on the substrate W.

In accordance with the arrangement above, the movable gripping portion 22 and the outward guiding surface 63 are provided on the movable pin 19. The movable gripping portion 22 and the outward guiding surface 63 are disposed at different positions of the movable pin 19. It is therefore possible to selectively use the movable gripping portion 22 and the outward guiding surface 63 by changing the position of the movable pin 19. Further, since the movable gripping portion 22 and the outward guiding surface 63 are provided on the common member, it is possible to reduce the number of parts. In addition, it is possible to commonalize the unit to move the movable gripping portion 22 and the unit to move the outward guiding surface 63.

The operation of the movable pin 19 and the raising/lowering operation of the hot plate 30 in the case of using the guiding member 60 shown in FIGS. 35A and 35B are as follows. The movable pin 19 is at the closed position to grip the substrate W until the first substrate transferring step (step S7 in FIG. 30). The hot plate 30 is at the lower position.

When the first substrate transferring step (step S7 in FIG. 30) is performed, the movable pin 19 is moved to the middle position. This causes the movable gripping portion 22 of the movable pin 19 to be set away from the peripheral portion of the substrate W, so that the substrate W is supported only by the fixed pins 16. Thereafter, the hot plate 30 is raised and the substrate W is transferred from the fixed pins 16 to the hot plate 30. The organic solvent heating step (step S8 in FIG. 30) is then performed in this state, so that the IPA liquid film on the substrate W is raised.

When the following organic solvent removing step (step S9 in FIG. 30) is performed, the movable pin 19 is moved to the open position. This causes the outward guiding surface 63 of the guiding member 60 to come into contact with the IPA liquid film on the substrate W, so that the IPA liquid film is removed from the upper surface of the substrate W.

In the second preferred embodiment, it is necessary to raise the substrate W slightly, during the transition from the organic solvent heating step (step S8) to the organic solvent removing step (step S9), to bring the guiding member 60 into contact with the IPA liquid film. On the other hand, in the case of using the guiding member 60 shown in FIGS. 35A and 35B, since it is possible to move the guiding member 60 between a position at which the guiding member 60 is in contact with the IPA liquid film and a position at which the guiding member 60 is not in contact with the IPA liquid film by moving the gripping/guiding member integrated with the movable pin 19 and the guiding member 60, it is not necessary to raise the substrate W slightly during the transition from the organic solvent heating step (step S8) to the organic solvent removing step (step S9).

It is noted that if the guiding member 60 is brought into contact with the IPA liquid film in the organic solvent heating step (step S8 in FIG. 30), the movable pin 19 may have been moved to the open position already in the first substrate transferring step (step S7 in FIG. 30).

Figure 36:
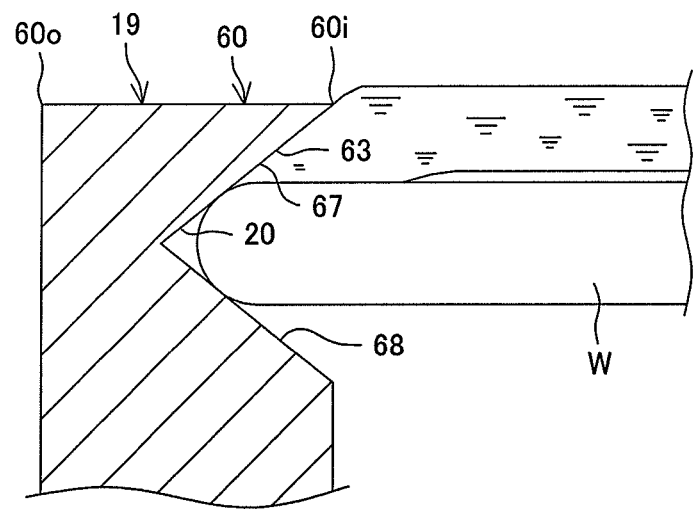
FIG. 36 is a vertical cross-sectional view of a guiding member and a movable pin according to a sixth preferred embodiment of the present invention, showing a state where the movable pin is at a closed position.

Further, as shown in FIG. 36, the movable gripping portion 22 of the movable pin 19 may include two oblique surfaces (upper oblique surface 67 and lower oblique surface 68) that constitute an accommodation groove having an inward-opened V-shaped vertical cross section. The outward guiding surface 63 of the guiding member 60 is provided on the upper oblique surface 67.

As shown in FIG. 36, when the movable pin 19 is located at the closed position (as shown in FIG. 36), the peripheral portion of the substrate W is accommodated in the accommodation groove, and the upper oblique surface 67 and the lower oblique surface 68 of the movable pin 19 are pressed against the peripheral portion of the substrate W. When the movable pin 19 is located at the closed position with the IPA liquid film being raised over the upper surface of the substrate W, the outward guiding surface 63 comes into contact with the IPA liquid film on the substrate W. On the other hand, when the movable pin 19 is located at the open position, the upper oblique surface 67 and the lower oblique surface 68 are set away from the peripheral portion of the substrate W and the outward guiding surface 63 is set away from the IPA liquid film on the substrate W.

In accordance with the arrangement above, the outward guiding surface 63 constitutes a portion of the movable gripping portion 22. When the movable pin 19 is located at the closed position, the movable gripping portion 22 is pressed against the peripheral portion of the substrate W and the outward guiding surface 63 comes into contact with the IPA liquid film on the substrate W. There is thus no need to provide a guide position at which the outward guiding surface 63 is in contact with the IPA liquid film on the substrate W separately from the closed position. It is therefore possible to simplify the structure of the movable pin 19 and the unit to move the movable pin 19 (chuck opening/closing unit 25).

Figure 37:
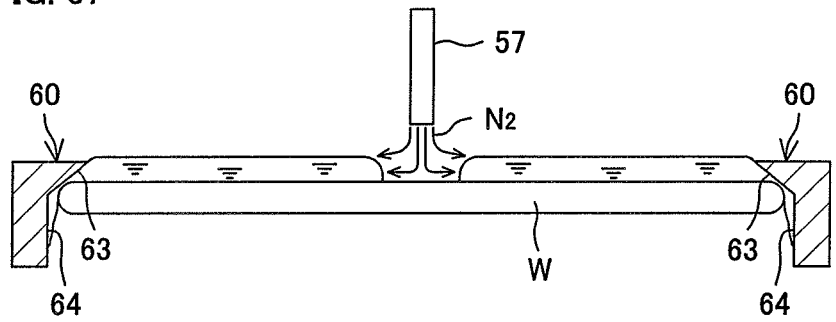
FIG. 37 is a schematic view showing an organic solvent removing step according to a seventh preferred embodiment of the present invention.

Further, as shown in FIG. 37, the controller 3 may open the upper gas valve 59 to cause the upper gas nozzle 57 to discharge nitrogen gas therethrough in the organic solvent removing step (step S9 in FIG. 30). The IPA liquid film moves with respect to the substrate W to be removed from the substrate W through the contact between the guiding member 60 and the liquid film and the supply of nitrogen gas onto the upper surface of the substrate W.

Specifically, the controller 3 brings the outward guiding surfaces 63 of the multiple guiding members 60 into contact with the peripheral portion of the IPA liquid film with the IPA liquid film being raised over the upper surface of the substrate W. Further, the controller 3 opens the upper gas valve 59 to cause the upper gas nozzle 57 to discharge nitrogen gas therethrough.

The discharge of nitrogen gas through the upper gas nozzle 57 may be started before or after the guiding member 60 comes into contact with the IPA liquid film, or alternatively at the same time as the guiding member 60 comes into contact with the IPA liquid film. The discharge of nitrogen gas may also be continued until the IPA liquid film goes off the substrate W or may be stopped before the IPA liquid film goes off the substrate W. The nitrogen gas may have a room temperature or a temperature equal to or higher than the boiling point of IPA (preferably equal to or higher than the temperature of the hot plate 30) to reduce temperature loss of the substrate W and the liquid film. If the temperature of the nitrogen gas is equal to or higher than the boiling point of IPA, it is possible to reduce temperature loss of the IPA liquid film or to heat the IPA liquid film.

As shown in FIG. 37, in the organic solvent removing step (step S9 in FIG. 30), the nitrogen gas discharged through the upper gas nozzle 57 is blown to a central portion (blow position) of the upper surface of the substrate W, with a gaseous phase being formed between the IPA liquid film and the upper surface of the substrate W. When the nitrogen gas is thus supplied, the IPA liquid at the blow position is displaced to the periphery. This causes a dried region to be formed at the blow position. Further, the IPA liquid moves from the blow position to the periphery, and thus an outward flow toward the peripheral portion of the substrate W is formed in the IPA liquid film.

Further, in the organic solvent removing step (step S9 in FIG. 30), the guiding member 60 comes into contact with the peripheral portion of the IPA liquid film with the IPA liquid film being raised over the upper surface of the substrate W (as shown in FIG. 31). As shown in FIG. 32, when the guiding member 60 comes into contact with the peripheral portion of the IPA liquid film, the IPA liquid film (IPA liquid) is partially transferred from the substrate W to the outward guiding surface 63 of the guiding member 60 to flow outward along the outward guiding surface 63 of the guiding member 60. Further, the IPA, which is guided outward by the outward guiding surface 63 of the guiding member 60, is guided downward by the downward guiding surface 64 of the guiding member 60. Thus, the IPA liquid is discharged from the outer peripheral portion of the upper surface of the substrate W. When the IPA liquid on the substrate W is discharged along the guiding member 60, an outward flow is formed in the IPA liquid film. That is, a force having a component in a direction in parallel with the upper surface of the substrate W acts on the raised IPA liquid film. As a result, the IPA liquid on the substrate W moves continuously outward on the substrate W to be discharged from the substrate W along the guiding member 60 or through between two circumferentially adjacent guiding members 60 (see FIG. 26).

In accordance with the above-described arrangement, the upper gas nozzle 57 discharges nitrogen gas therethrough toward the central portion (blow position) of the upper surface of the substrate W, with the gaseous phase being formed between the IPA liquid film and the upper surface of the substrate W. When the nitrogen gas is thus supplied, the IPA liquid at the blow position is displaced to the periphery. This causes a dried region to be formed at the blow position. Further, the IPA liquid pushed by the nitrogen gas moves from the blow position to the periphery and, with this supply of nitrogen gas, an outward flow toward the peripheral portion of the substrate W is formed in the IPA liquid film, so that the IPA liquid film on the substrate W is removed from the substrate W directly as a single continued mass without being split into a number of small droplets. It is therefore possible to remove the IPA liquid film quickly from the substrate W in a short time by utilizing both the supply of nitrogen gas and the guiding member 60.

Further, in accordance with the arrangement above, nitrogen gas is discharged toward the central portion of the upper surface of the substrate W covered with the IPA liquid film. This causes the IPA liquid to be removed from the central portion of the upper surface of the substrate W and a hole to be formed in a central portion of the liquid film. That is, the position at which the dried region is first formed from which the IPA liquid is removed is in the central portion of the upper surface of the substrate W. When the nitrogen gas is thus supplied, the IPA liquid moves from the central portion of the upper surface of the substrate W to the periphery, which causes a radial flow toward the peripheral portion of the liquid film to form in the IPA liquid film. It is therefore possible to remove the IPA liquid film uniformly from the substrate W. It is further possible to remove the IPA liquid film in a shorter amount of time than in the case where the position at which the dried region is first formed is in the peripheral portion of the upper surface of the substrate W.

Figure 38A:
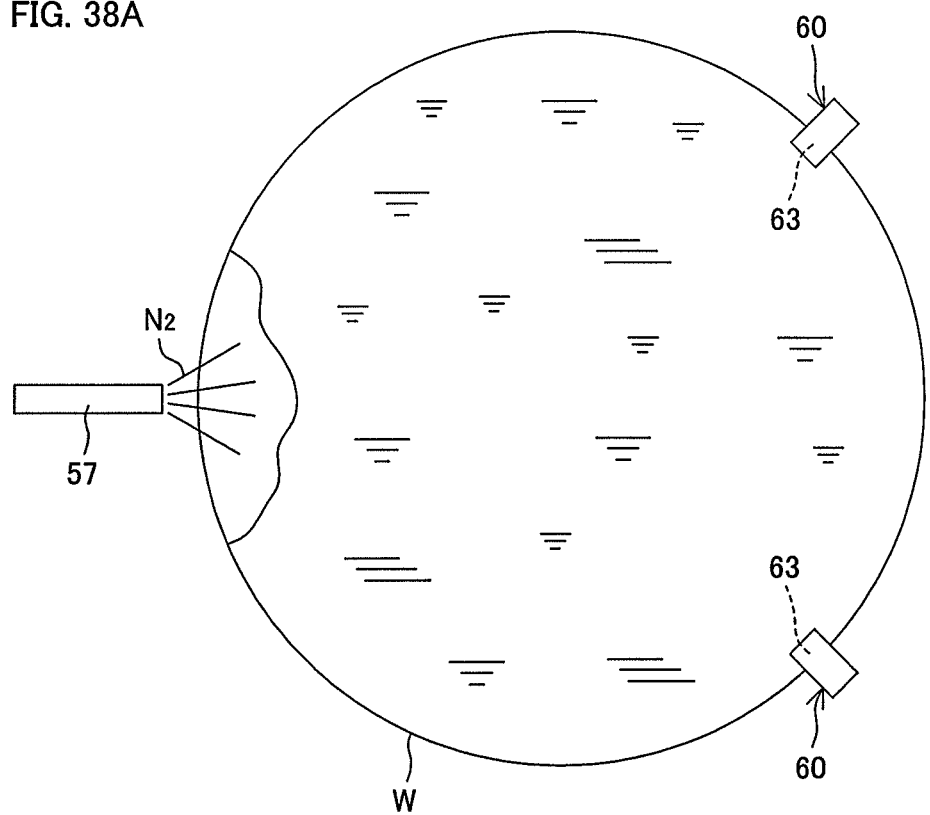
FIG. 38A is a plan view showing an organic solvent removing step according to an eighth preferred embodiment of the present invention.
Figure 38B:
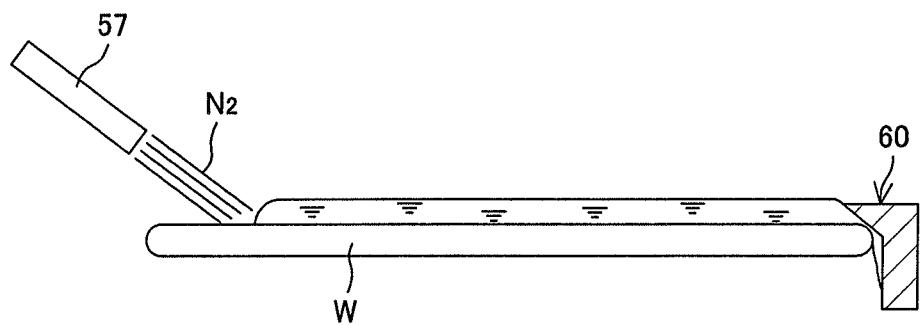
FIG. 38B is a schematic view of the substrate shown in FIG. 38A when viewed horizontally.

Also, as shown in FIGS. 38A and 38B, the upper gas nozzle 57 may be held on the top lid 11 (see FIG. 22) such that nitrogen gas is discharged inward through the upper gas nozzle 57 toward the peripheral portion (blow position) of the upper surface of the substrate W in a direction tilted with respect to the upper surface of the substrate W.

In accordance with the arrangement above, nitrogen gas is discharged toward the peripheral portion of the upper surface of the substrate W. This causes the IPA liquid in the peripheral portion of the upper surface of the substrate W to be removed and a dried region to be formed in the peripheral portion of the upper surface of the substrate W. As a result, a flow toward the guiding member 60 is formed in the IPA liquid film. Further, since the nitrogen gas flows toward the guiding member 60 along the upper surface of the substrate W, the flow of the IPA liquid toward the guiding member 60 is facilitated by the flow of gas flowing toward the guiding member 60 along the upper surface of the substrate W. It is therefore possible to remove the IPA liquid film on the substrate W efficiently. Therefore, the time required for the removal of the liquid film is reduced.

Although the case where the guiding members 60 are provided in the processing unit 2 has been described with reference to FIGS. 37, 38A, and 38B, the processing unit 2 may not include guiding member 60. That is, in the organic solvent removing step (step S9 in FIG. 30), the raised IPA liquid film may be removed from the upper surface of the substrate W only by supplying gas.

Figure 39A:
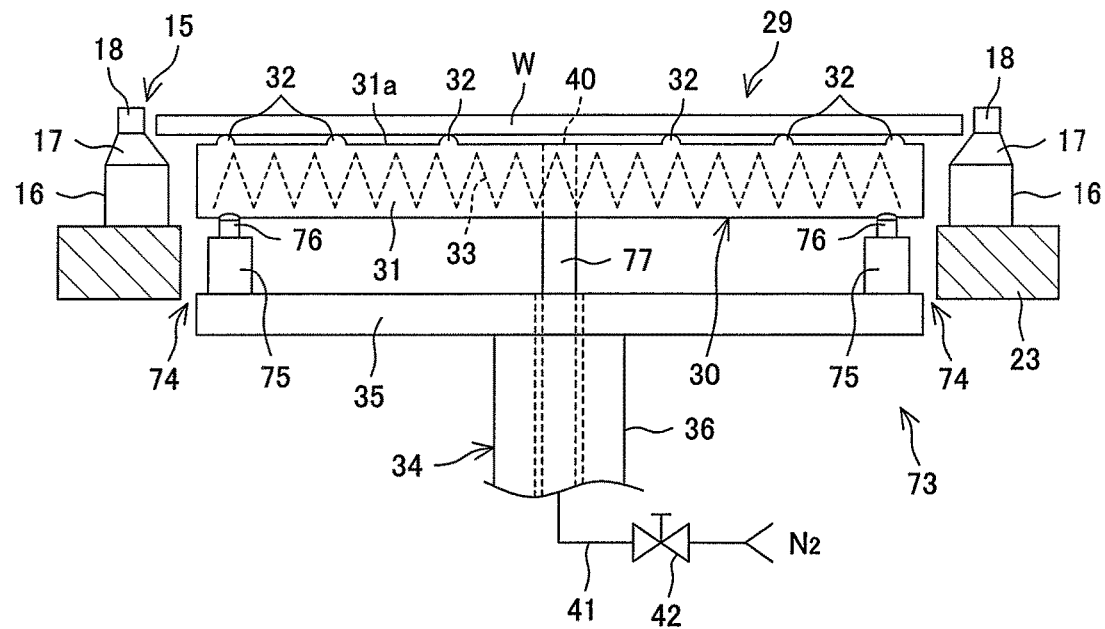
FIG. 39A is a schematic view of an attitude changing unit according to a ninth preferred embodiment of the present invention when viewed horizontally.
Figure 39B:
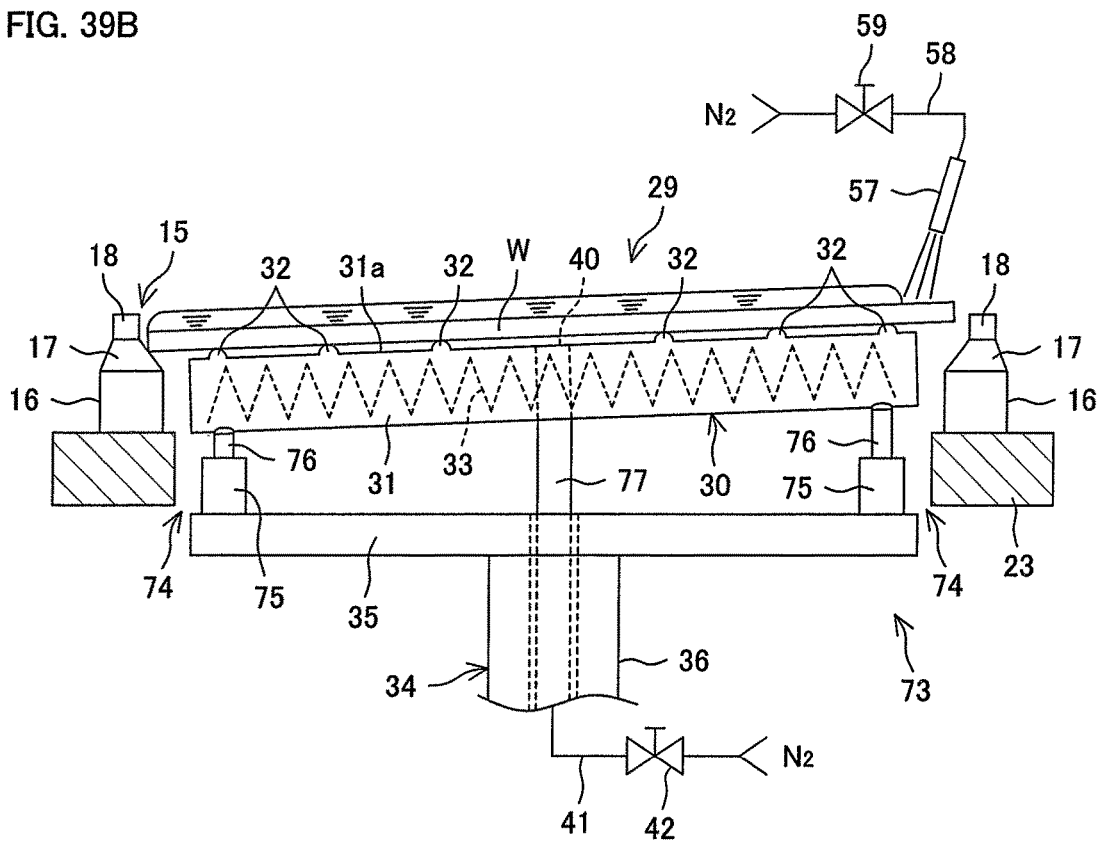
FIG. 39B is a schematic view showing a state where the substrate and a hot plate are tilted by the attitude changing unit according to the ninth preferred embodiment of the present invention.

As shown in FIGS. 39A and 39B, if the guiding member 60 is not provided in the processing unit 2, the processing unit 2 may further include an attitude changing unit 73 arranged to cause the substrate W and the hot plate 30 to undergo an attitude change between a horizontal attitude in which the upper surface of the substrate W is horizontal and a tilted attitude in which the upper surface of the substrate W is tilted with respect to the horizontal surface, while keeping constant the space between the lower surface of the substrate W and upper surface of the hot plate 30 (the upper surface 31a of the plate main body 31).

The attitude changing unit 73 includes multiple (three or more) extensible units 74 disposed between the hot plate 30 and the support table 34. The multiple extensible units 74 are disposed on the table portion 35 of the support table 34. The multiple extensible units 74 are arranged in an equally spaced manner in the circumferential direction in a peripheral portion of the upper surface of the table portion 35. Each of the extensible units 74 is, for example, an air cylinder. The extensible unit 74 is not limited to an air cylinder, but may be a unit including an actuator such as an electric motor and a transmitting unit (ball screw mechanism, for example) arranged to transmit power from the actuator to the hot plate 30.

The extensible unit 74 includes a cylinder main body 75 fixed to the table portion 35 of the support table 34 and a rod 76 vertically movable with respect to the cylinder main body 75. The cylinder main body 75 is disposed between the hot plate 30 and the support table 34. The rod 76 protrudes upward from the cylinder main body 75. The hot plate 30 is supported by the multiple extensible units 74 through contact between each rod 76 and the lower surface of the hot plate 30. The upward discharge port 40 opened in the central portion of the upper surface of the hot plate 30 is connected to an elastically deformable lower pipe 77 extending downward from a central portion of the hot plate 30. The lower pipe 77 is inserted in a passage provided inside the shaft portion 36 of the support table 34 and connected to the lower gas pipe 41.

The amount of protrusion of the rod 76 from the cylinder main body 75 is set by the controller 3 for each extensible unit 74. The controller 3 adjusts the amount of protrusion of each rod 76 to change the attitude of the substrate W and the hot plate 30 between the horizontal attitude and the tilted attitude. The tilt angle (with respect to the horizontal surface) of the upper surface of the hot plate 30 at the tilted attitude is as small as about 1 degree, for example. The substrate W is therefore held by a frictional force acting between the lower surface of the substrate W and the hot plate 30. Even if the substrate W may slide with respect to the hot plate 30, the movement of the substrate W with respect to the hot plate 30 can be restricted if stoppers such as the fixed pins 16 and/or the movable pins 19 are positioned around the substrate W.

As shown in FIG. 39B, the controller 3 changes the attitude of the substrate W and the hot plate 30 to the tilted attitude in the organic solvent removing step (step S9 in FIG. 30). Further, the controller 3 opens the upper gas valve 59 to cause the upper gas nozzle 57 to discharge nitrogen gas therethrough toward the upper end portion of the upper surface of the tilted substrate W. The discharge of nitrogen gas through the upper gas nozzle 57 may be started before or after the substrate W is tilted, or alternatively at the same time as the substrate W is tilted.

In accordance with the arrangement shown in FIGS. 39A and 39B, nitrogen gas is discharged toward the upper end portion of the upper surface of the tilted substrate W with a gaseous phase being formed between the IPA liquid film and the upper surface of the substrate W. Since the substrate W is thus tilted, the IPA liquid film on the substrate W flows downward along the upper surface of the substrate W. The downward flow of the IPA liquid is further facilitated by the supply of nitrogen gas. It is therefore possible to remove the IPA liquid film quickly from the substrate W in a short time. In addition, since the space between the heaters 33 and the substrate W in a direction perpendicular to the upper surface of the substrate W is kept constant, uneven heating is less likely to occur compared to the case where only the substrate W is tilted, whereby it is possible to continuously heat the substrate W stably.

Figure 40:
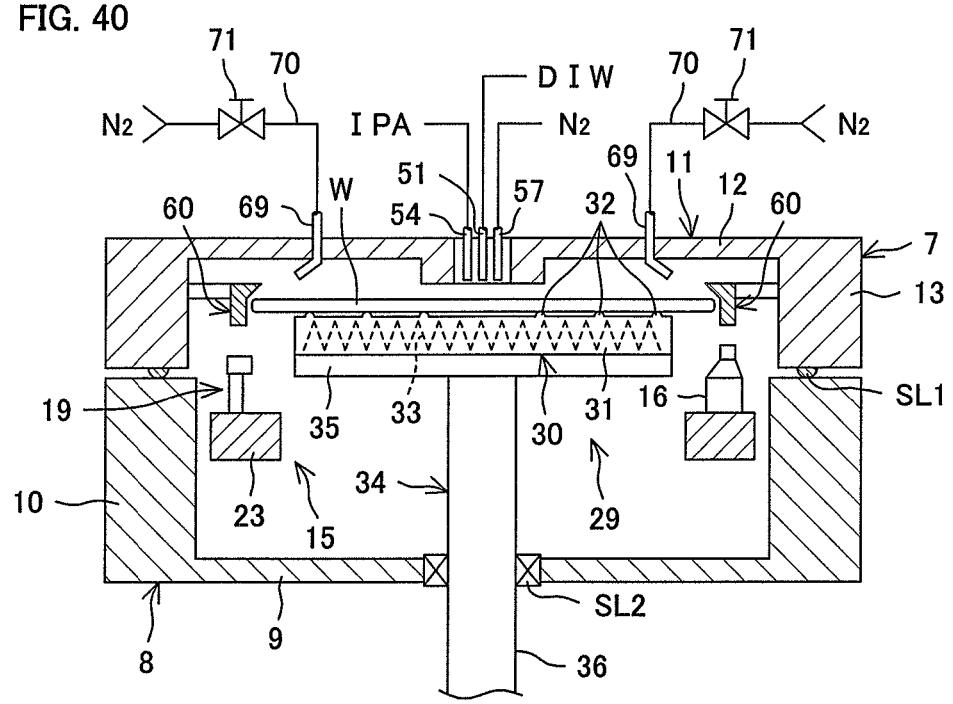
FIG. 40 is a partial schematic view of a processing unit according to a tenth preferred embodiment of the present invention.
Figure 41:
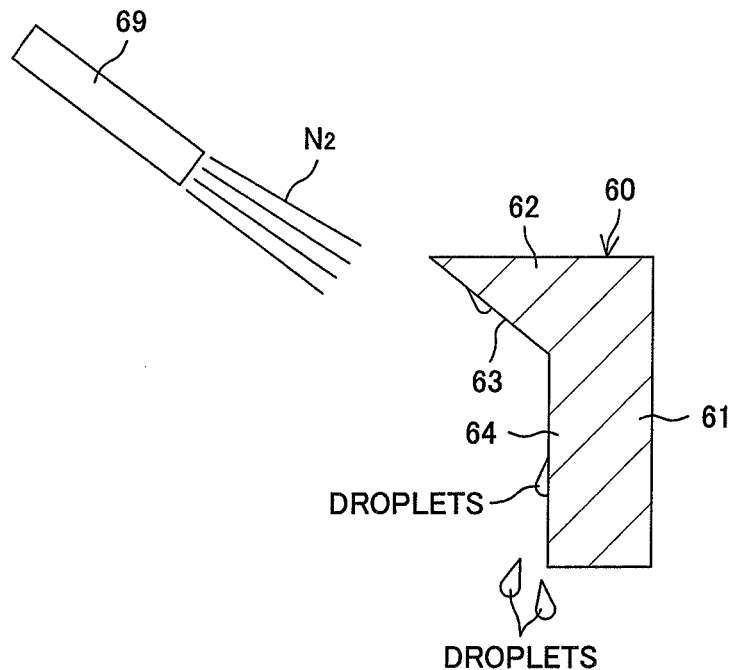
FIG. 41 is a vertical cross-sectional view showing a state where droplets remaining on a guiding member are removed with gas.

Further, as shown in FIGS. 40 and 41, the processing unit 2 may further include multiple outer gas nozzles 69 corresponding, respectively, to the multiple guiding members 60. The outer gas nozzles 69 are held on the top lid 11 and arranged to be vertically raised/lowered together with the top lid 11. The upper gas nozzle 57 is connected to an outer gas pipe 70 with an outer gas valve 71 installed therein. The outer gas nozzles 69 are arranged to discharge gas (nitrogen gas, for example) therethrough toward the outward guiding surfaces 63 and the downward guiding surfaces 64 of the guiding members 60.

For example, after the processed substrate W is carried out of the outer chamber 4, the controller 3 opens the outer gas valve 71 to cause each of the outer gas nozzles 69 to discharge gas therethrough. As shown in FIG. 41, liquid adhering to the guiding member 60 is blown off by the gas discharged through the outer gas nozzle 69. It is therefore possible to reduce the occurrence of particles caused by the liquid adhering to the guiding member 60.

Figure 42A:
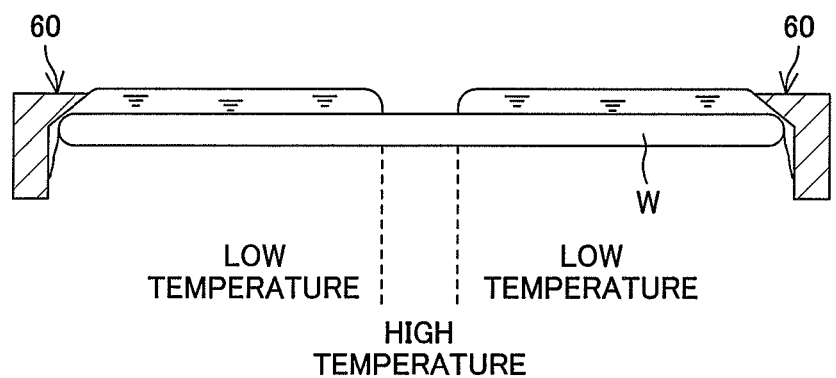
FIG. 42A is a schematic view showing an organic solvent removing step according to an eleventh preferred embodiment of the present invention, showing a state where a low-temperature region and a high-temperature region are formed in the upper surface of a substrate.
Figure 42B:
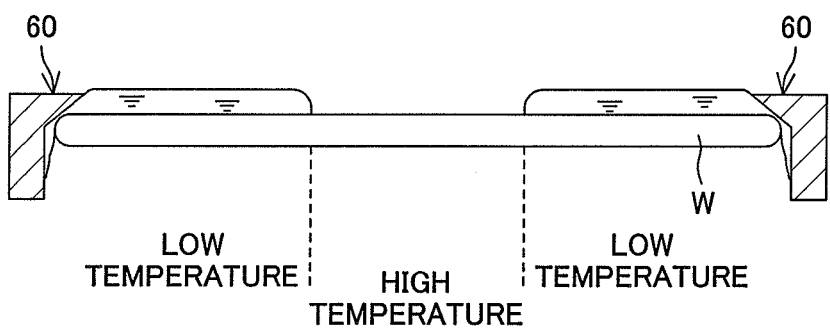
FIG. 42B is a schematic view showing a state where the high-temperature region is enlarged outward in the organic solvent removing step according to the eleventh preferred embodiment of the present invention.

Also, as shown in FIGS. 42A and 42B, the controller 3 may control the preset temperature for the multiple heaters 33 to heat the substrate W uniformly at a temperature equal to or higher than the boiling point of IPA in the organic solvent heating step (step S8 in FIG. 30) and to form, in the upper surface of the substrate W, a low-temperature region with a temperature equal to or higher than the boiling point of IPA and a high-temperature region with a temperature higher than that of the low-temperature region in the organic solvent removing step (step S9 in FIG. 30). The IPA liquid film moves with respect to the substrate W to be removed from the substrate W through contact between the guiding members 60 and the liquid film and the generation of a temperature difference in the substrate W.

Specifically, the controller 3 brings the outward guiding surfaces 63 of the multiple guiding members 60 into contact with the peripheral portion of the IPA liquid film with the IPA liquid film being raised over the upper surface of the substrate W. Further, the controller 3 controls the preset temperature for the multiple heaters 33 to form a low-temperature region with a temperature equal to or higher than the boiling point of IPA and a high-temperature region with a temperature higher than that of the low-temperature region in the upper surface of the substrate W.

The formation of the high-temperature region and the low-temperature region may be started before or after the guiding member 60 comes into contact with the IPA liquid film, or alternatively at the same time as the guiding member 60 comes into contact with the IPA liquid film. The formation of the high-temperature region and the low-temperature region may also be continued until the IPA liquid film goes off the substrate W or may be stopped before the IPA liquid film goes off the substrate W.

As shown in FIG. 42A, in the organic solvent removing step (step S9 in FIG. 30), when the high-temperature region and the low-temperature region are thus formed, the central portion of the IPA liquid film covering the central portion of the upper surface of the substrate W has a temperature higher than that of the portion surrounding the central portion. The IPA liquid in the liquid film tends to move toward the lower temperature. Accordingly, a radial flow toward the peripheral portion of the liquid film is formed in the IPA liquid film. As a result, a hole is formed in the central portion of the IPA liquid film, as shown in FIG. 42A. That is, a gas-liquid interface is formed at the center of the IPA liquid film. The outer diameter of the hole in the IPA liquid film increases concentrically.

Also, as shown in FIG. 42B, after forming the high-temperature region in the central portion of the upper surface of the substrate W and the low-temperature region surrounding the high-temperature region, the controller 3 may move the annular boundary between the low-temperature region and the high-temperature region toward the low-temperature region. That is, the controller 3 may increase the diameter of the boundary between the low-temperature region and the high-temperature region. In this case, the controller 3 controls the heaters 33 such that the boundary between the high-temperature region and the low-temperature region of the heaters 33 corresponds to the position of the IPA gas-liquid interface. The controller 3 also moves the boundary between the high-temperature region and the low-temperature region of the heaters 33 from the center of the substrate W toward the periphery in association with the movement of the IPA gas-liquid interface. As shown in FIG. 42B, when the boundary between the low-temperature region and the high-temperature region is moved toward the low-temperature region, the flow toward the lower temperature is facilitated in the liquid film.

Further, in the organic solvent removing step (step S9 in FIG. 30), the guiding member 60 comes into contact with the peripheral portion of the IPA liquid film with the IPA liquid film being raised over the upper surface of the substrate W (as shown in FIG. 31). As shown in FIG. 32, when the guiding member 60 comes into contact with the peripheral portion of the IPA liquid film, the IPA liquid film (IPA liquid) is partially transferred from the substrate W to the outward guiding surface 63 of the guiding member 60 to flow outward along the outward guiding surface 63 of the guiding member 60. Further, the IPA, which is guided outward by the outward guiding surface 63 of the guiding member 60, is guided downward by the downward guiding surface 64 of the guiding member 60. Thus, the IPA liquid is discharged from the outer peripheral portion of the upper surface of the substrate W. When the IPA liquid on the substrate W is discharged along the guiding member 60, an outward flow is formed in the IPA liquid film. That is, a force having a component in a direction in parallel with the upper surface of the substrate W acts on the raised IPA liquid film. As a result, the IPA liquid on the substrate W moves continuously outward on the substrate W to be discharged from the substrate W along the guiding member 60 or through between two circumferentially adjacent guiding members 60 (see FIG. 26).

In accordance with the above-described arrangement, the controller 3 performs the organic solvent heating step (step S8 in FIG. 30) including a uniform heating step and the organic solvent removing step (step S9 in FIG. 30) including a temperature difference generating step. In the uniform heating step, the substrate W is heated uniformly at a temperature equal to or higher than the boiling point of IPA. This causes a gaseous phase to be formed between the IPA liquid film and the upper surface of the substrate W. In the temperature difference generating step, a high-temperature region and a low-temperature region having their respective different temperatures are formed in the upper surface of the substrate W. This generates a temperature difference in the IPA liquid film, and a flow toward the lower temperature is formed in the IPA liquid film. With this generation of temperature difference, an outward flow toward the peripheral portion of the substrate W is formed in the IPA liquid film, so that the IPA liquid film on the substrate W is removed from the substrate W directly as a single continued mass without being split into a number of small droplets. This allows the IPA liquid film to be removed quickly from the substrate W in a short time.

Also, in accordance with the arrangement above, the controller 3 first forms the high-temperature region in the central portion of the upper surface of the substrate W. Accordingly, the central portion of the IPA liquid film covering the central portion of the upper surface of the substrate W has a temperature higher than that of the portion surrounding the central portion. The IPA liquid in the liquid film tends to move toward the lower temperature. Accordingly, a radial flow toward the peripheral portion of the liquid film is formed in the IPA liquid film. As a result, a hole is formed in the central portion of the IPA liquid film, as shown in FIGS. 42A and 42B, and the outer diameter of the hole increases concentrically. It is therefore possible to remove the IPA liquid film quickly from the substrate W in a short time by utilizing both the generation of temperature difference and the guiding member 60. Further, when the boundary between the low-temperature region and the high-temperature region is moved toward the low-temperature region, the flow toward the lower temperature is facilitated in the liquid film. This allows the IPA liquid film on the substrate W to be removed efficiently.

Figure 43A:
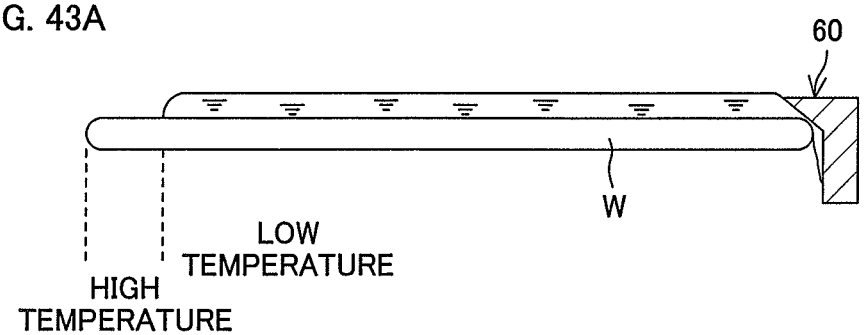
FIG. 43A is a schematic view showing an organic solvent removing step according to a twelfth preferred embodiment of the present invention, showing a state where a low-temperature region and a high-temperature region are formed in the upper surface of a substrate.
Figure 43B:
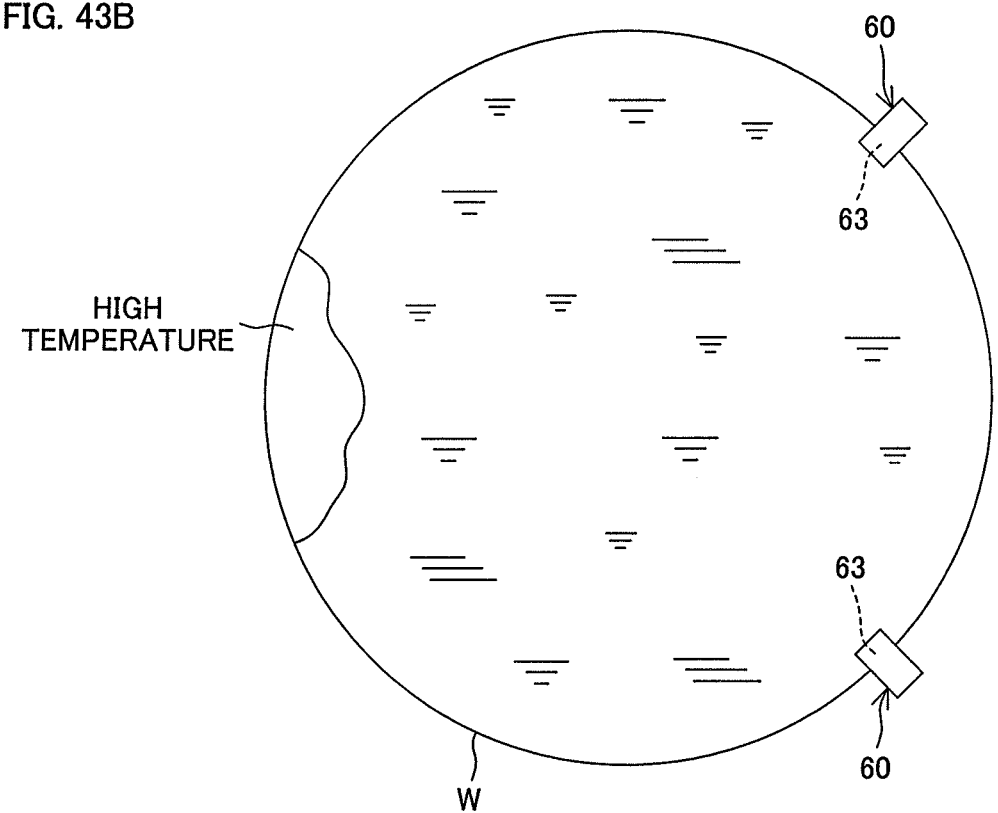
FIG. 43B is a schematic view of the substrate shown in FIG. 43A when viewed from above.

Further, as shown in FIGS. 43A and 43B, the controller 3 may form the high-temperature region in a peripheral portion of the upper surface of the substrate W and the low-temperature region in another portion of the upper surface of the substrate W in the organic solvent removing step (step S9 in FIG. 30). The controller 3 may then move the boundary between the low-temperature region and the high-temperature region toward the low-temperature region.

In the case above, the peripheral portion of the IPA liquid film covering the peripheral portion of the upper surface of the substrate W has a temperature higher than that of the other portion of the liquid film. Accordingly, a flow toward the guiding member 60 is formed in the IPA liquid film. As a result, as shown in FIGS. 43A and 43B, the IPA liquid goes off the peripheral portion of the upper surface of the substrate W, and the area of the portion from which the IPA liquid is removed increases. It is therefore possible to remove the IPA liquid film quickly from the substrate W in a short time by utilizing both the generation of temperature difference and the guiding member 60. Further, when the boundary between the low-temperature region and the high-temperature region is moved toward the low-temperature region, the flow toward the lower temperature is facilitated in the liquid film. This allows the IPA liquid film on the substrate W to be removed efficiently.

Figure 44:
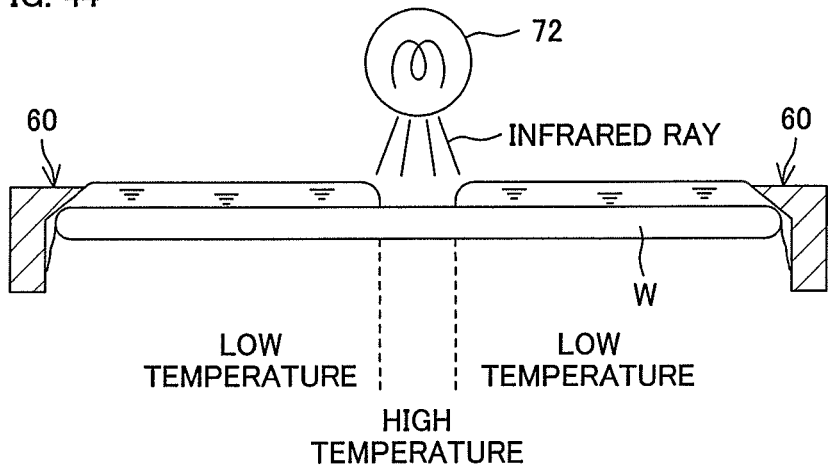
FIG. 44 is a schematic view showing an organic solvent removing step according to a thirteenth preferred embodiment of the present invention, showing a state where a central portion of a film of IPA liquid is heated by an upper heater disposed over a substrate.

Further, as shown in FIG. 44, the processing unit 2 may further include an infrared heater 72 as an example of an upper heater disposed over the substrate W in the inner chamber 7. In this case, the controller 3 controls the infrared heater 72 over the substrate W to heat a portion of the IPA liquid film while heating the substrate W with the hot plate 30. Further, the controller 3 sets the infrared heater 72 to have a temperature at which the central portion of the upper surface of the substrate W cannot be exposed through vaporization of the IPA. Since the central portion of the IPA liquid film is heated by the infrared heater 72, a temperature difference is generated in the IPA liquid film. Accordingly, a radial flow toward the peripheral portion of the liquid film is formed in the IPA liquid film.

In the organic solvent removing step (step S9 in FIG. 30), the controller 3 may also open the lower gas valve 42, while heating the substrate W with the hot plate 30, to discharge high-temperature nitrogen gas with a temperature equal to or higher than the boiling point of IPA (preferably equal to or higher than the temperature of the hot plate 30) through the upward discharge port 40 opened in the central portion of the upper surface of the hot plate 30 toward the central portion of the lower surface of the substrate W. During this time, the controller 3 may cause the infrared heater 72 shown in FIG. 44 to heat the central portion of the IPA liquid film.

In the organic solvent removing step (step S9 in FIG. 30), when high-temperature nitrogen gas is thus blown to the central portion of the lower surface of the substrate W, the temperature of the central portion of the upper surface of the substrate W further increases and thereby the central portion of the IPA liquid film is further heated. This causes a temperature difference in the IPA liquid film, and a radial flow toward the peripheral portion of the liquid film is formed in the IPA liquid film. Further, when the heating with the high-temperature nitrogen gas and the heating with the infrared heater 72 are performed at the same time, it is possible to generate a temperature difference in the IPA liquid film in a short time.

Although the case where the guiding members 60 are provided in the processing unit 2 has been described with reference to FIGS. 42A to 44, the processing unit 2 may not include guiding member 60. That is, in the organic solvent removing step (step S9 in FIG. 30), the raised IPA liquid film may be removed from the upper surface of the substrate W only by generating a temperature difference.

Figure 45A:
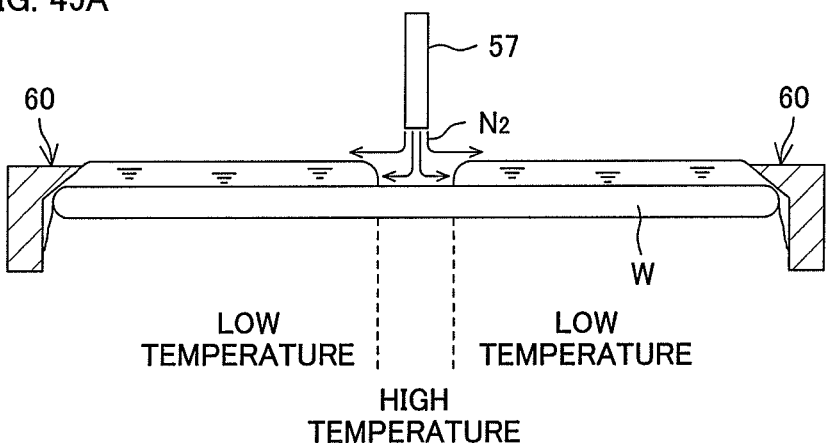
FIG. 45A is a schematic view showing an organic solvent removing step according to a fourteenth preferred embodiment of the present invention.
Figure 45B:
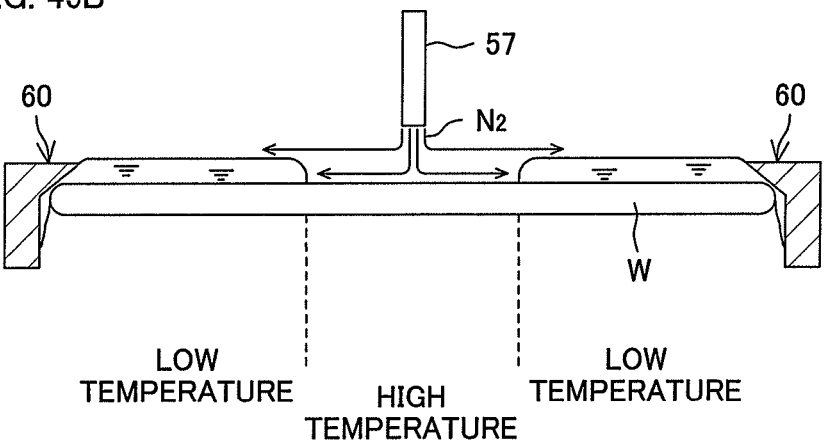
FIG. 45B is a schematic view showing a state where a high-temperature region is enlarged outward in an organic solvent removing step according to a fifteenth preferred embodiment of the present invention.

Further, as shown in FIGS. 45A and 45B, the controller 3 may control the preset temperature for the multiple heaters 33 to heat the substrate W uniformly at a temperature equal to or higher than the boiling point of IPA in the organic solvent heating step (step S8 in FIG. 30) and to form, in the upper surface of the substrate W, a low-temperature region with a temperature equal to or higher than the boiling point of IPA and a high-temperature region with a temperature higher than that of the low-temperature region in the organic solvent removing step (step S9 in FIG. 30). If the position at which the high-temperature region is first formed is in the central portion of the upper surface of the substrate W, the controller 3 may open the upper gas valve 59 to cause the upper gas nozzle 57 to discharge nitrogen gas therethrough in the organic solvent removing step (step S9 in FIG. 30).

In the case above, the nitrogen gas may have a room temperature or a temperature equal to or higher than the boiling point of IPA (preferably equal to or higher than the temperature of the hot plate 30). If the temperature of the nitrogen gas is equal to or higher than the boiling point of IPA, it is possible to reduce temperature loss of the IPA liquid film or to heat the IPA liquid film. The discharge of nitrogen gas may also be continued until the IPA liquid film goes off the substrate W or may be stopped before the IPA liquid film goes off the substrate W.

In accordance with the arrangement above, the central portion of the IPA liquid film covering the central portion of the upper surface of the substrate W has a temperature higher than that of the portion surrounding the central portion. The IPA liquid in the liquid film tends to move toward the lower temperature. Accordingly, a radial flow toward the peripheral portion of the liquid film is formed in the IPA liquid film. As a result, a hole is formed in the central portion of the IPA liquid film, as shown in FIGS. 45A and 45B, and the outer diameter of the hole increases concentrically.

Also, in accordance with the arrangement above, the nitrogen gas is blown to the central portion (blow position) of the upper surface of the substrate W, with a gaseous phase being formed between the IPA liquid film and the upper surface of the substrate W. When the nitrogen gas is thus supplied, the IPA liquid at the blow position is displaced to the periphery. This causes a dried region to be formed at the blow position. Further, the IPA liquid moves from the blow position to the periphery, and thus an outward flow toward the peripheral portion of the substrate W is formed in the IPA liquid film. It is therefore possible to remove the IPA liquid film quickly from the substrate W in a short time by utilizing both the generation of temperature difference in the substrate W and the supply of nitrogen gas.

With an expansion of the dried region, the controller 3 may also expand the boundary between the high-temperature region and the low-temperature region of the heaters 33 from the center toward the peripheral portion of the substrate W, as shown in FIG. 45B. That is, the controller 3 controls the heaters 33 such that the boundary between the high-temperature region and the low-temperature region of the heaters 33 corresponds to the position of the IPA gas-liquid interface formed on the upper surface of the substrate W. The controller 3 also moves the boundary between the high-temperature region and the low-temperature region of the heaters 33 from the center toward the peripheral portion of the substrate W in association with the movement of the IPA gas-liquid interface. When the boundary between the low-temperature region and the high-temperature region is moved toward the low-temperature region, the flow toward the lower temperature is facilitated in the liquid film. This allows the IPA liquid film on the substrate W to be removed efficiently.

Figure 46A:
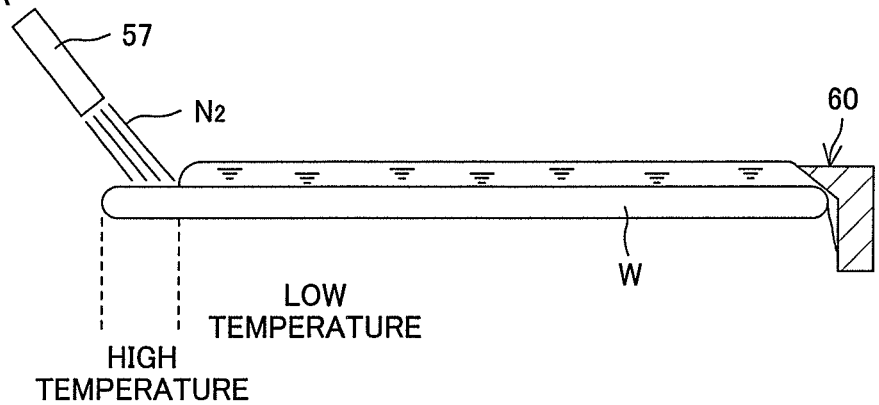
FIG. 46A is a schematic view showing an organic solvent removing step according to a sixteenth preferred embodiment of the present invention.
Figure 46B:
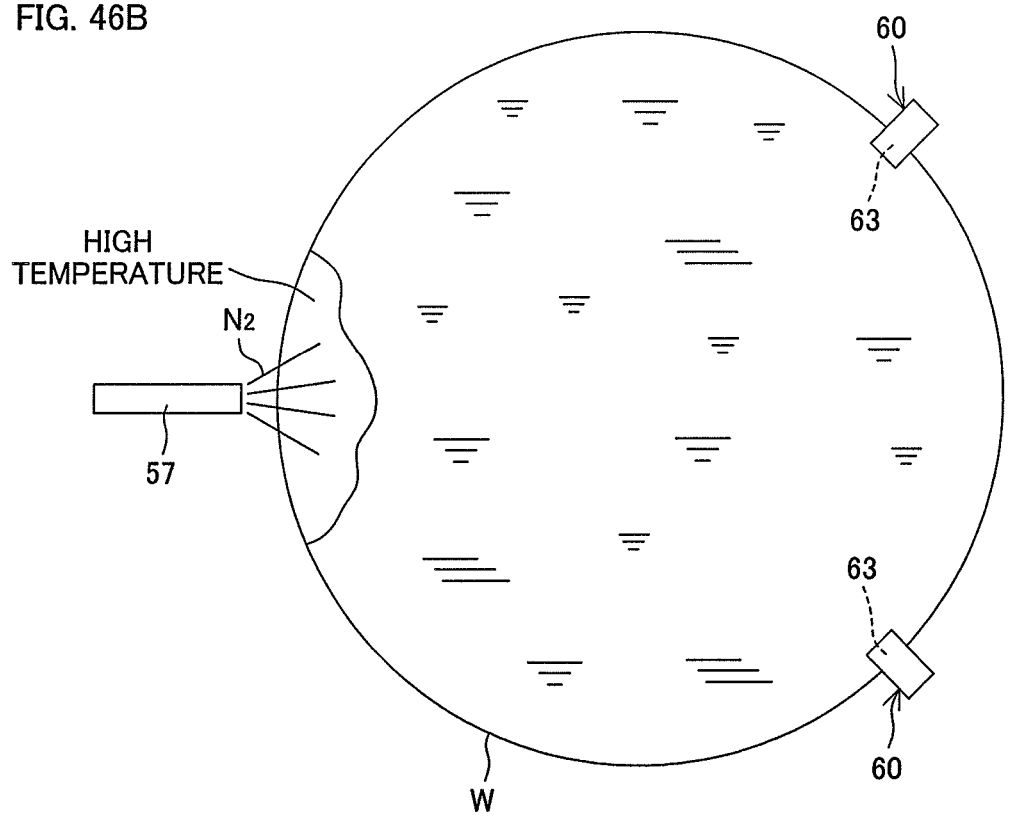
FIG. 46B is a schematic view of the substrate shown in FIG. 46A when viewed horizontally.
Figure 47:
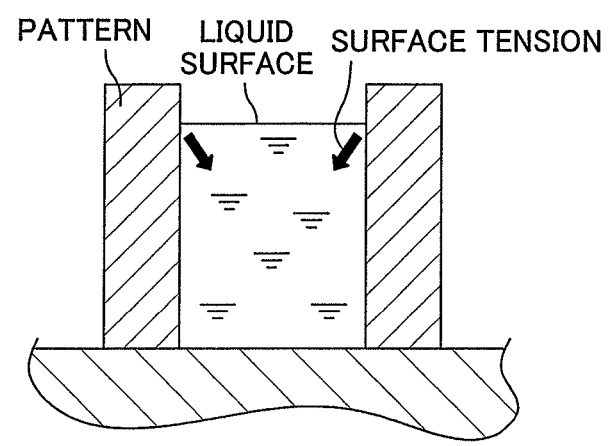
FIG. 47 is a cross-sectional view of a substrate, showing a liquid surface formed within a pattern in a spin drying step.

Further, as shown in FIGS. 46A and 46B, the controller 3 may form the high-temperature region in a peripheral portion of the upper surface of the substrate W and the low-temperature region in another portion of the upper surface of the substrate W in the organic solvent removing step (step S9 in FIG. 30). If the position at which the high-temperature region is first formed is in the peripheral portion of the upper surface of the substrate W, the upper gas nozzle 57 may be held on the top lid 11 (see FIG. 22) such that nitrogen gas is discharged inward through the upper gas nozzle 57 toward the peripheral portion (blow position) of the upper surface of the substrate W in a direction tilted with respect to the upper surface of the substrate W. Also in this arrangement, the controller 3 may move the boundary between the high-temperature region and the low-temperature region of the heaters 33 in association with the movement of the IPA gas-liquid interface.

In accordance with the arrangement above, the peripheral portion of the IPA liquid film covering the peripheral portion of the upper surface of the substrate W has a temperature higher than that of the other portion of the liquid film. Accordingly, a flow toward the guiding member 60 is formed in the IPA liquid film. As a result, as shown in FIGS. 46A and 46B, the IPA liquid goes off the peripheral portion of the upper surface of the substrate W, and the area of the portion from which the IPA liquid is removed increases. This causes the IPA liquid to be removed through the peripheral portion of the upper surface of the substrate W and a dried region is formed in the peripheral portion of the upper surface of the substrate W. As a result, a flow toward the guiding member 60 is formed in the IPA liquid film.

Also, in accordance with the arrangement above, nitrogen gas is discharged toward the peripheral portion of the upper surface of the substrate W. Since the nitrogen gas thus flows toward the guiding member 60 along the upper surface of the substrate W, the flow of the IPA liquid toward the guiding member 60 is facilitated by the flow of gas flowing toward the guiding member 60 along the upper surface of the substrate W. It is therefore possible to remove the IPA liquid film on the substrate W efficiently by utilizing both the generation of temperature difference and the supply of nitrogen gas, and thereby to reduce the time required for the removal of the liquid film. Further, when the boundary between the low-temperature region and the high-temperature region is moved toward the low-temperature region, the flow toward the lower temperature is facilitated in the liquid film. This allows the IPA liquid film on the substrate W to be removed efficiently.

Although the case where the guiding members 60 are provided in the processing unit 2 has been described with reference to FIGS. 45A to 46B, the guiding members 60 may be omitted in the arrangements shown in these figures.

Although in the second to sixteenth preferred embodiments, the case where the IPA liquid film is raised in the organic solvent heating step (step S8 in FIG. 30) has been described, a film liquid other than IPA may be raised. For example, a liquid film of pure water may be raised in a liquid film heating step corresponding to the organic solvent heating step, and the liquid film of pure water may be removed in a liquid film removing step corresponding to the organic solvent removing step.

Further, in the organic solvent heating step (step S8 in FIG. 30), IPA liquid may be added appropriately to the upper surface of the substrate W to prevent the upper surface of the substrate W from being exposed partially.

In the second to sixteenth preferred embodiments, the hot plate 30 is brought into contact with the rear surface of the substrate W to heat the substrate W (the organic solvent heating step (step S8 in FIG. 30)). However, the organic solvent heating step (step S8 in FIG. 30) may be performed with the hot plate 30 being spaced from the substrate W. In this case, there is no need to transfer the substrate W between the fixed pins 16 and the hot plate 30. There is also no need to release the gripping state of the substrate W by the movable pins 19 temporarily in the course of the substrate processing.

Although the case where the substrate processing apparatus is arranged to process disk-shaped substrates has been described, the substrate processing apparatus may be arranged to process polygonal substrates.

Features of two or more of the various preferred embodiments described above may be combined.

This application corresponds to Japanese Patent Application No. 2014-037293 filed in the Japan Patent Office on Feb. 27, 2014, Japanese Patent Application No. 2014-063694 filed in the Japan Patent Office on Mar. 26, 2014, Japanese Patent Application No. 2014-063695 filed in the Japan Patent Office on Mar. 26, 2014, and Japanese Patent Application No. 2014-063696 filed in the Japan Patent Office on Mar. 26, 2014, the disclosures of which are incorporated herein by reference in its entirety.

While the present invention has been described in detail by way of the embodiments thereof, it should be understood that embodiments are merely illustrative of the technical principles of the present invention but not limitative of the invention. The spirit and scope of the present invention are to be limited only by the appended claims.

What is claimed is:

1. A substrate processing apparatus comprising:
a processing liquid supplying unit arranged to supply processing liquid onto an upper surface of a substrate to form a liquid film of the processing liquid;
a substrate heating unit arranged to heat the substrate from below the substrate to heat the liquid film on the substrate and arranged to be in contact with a lower surface of the substrate to support the substrate thereon; and
an attitude changing unit arranged to cause the substrate and the substrate heating unit to undergo an attitude change between a horizontal attitude in which the upper surface of the substrate is horizontal so that the liquid film of the processing liquid is held on the substrate, and a tilted attitude in which the upper surface of the substrate is tilted so that the liquid film of the processing liquid heated by the substrate heating unit is removed from the substrate, while keeping constant a relative attitude between the substrate and the substrate heating unit, wherein the attitude changing unit is arranged to cause the substrate heating unit, which is supporting the substrate thereon, to undergo the attitude change between the horizontal attitude and the tilted attitude, and the substrate processing apparatus further comprises a sliding preventing member arranged to come into contact with a lower portion of a peripheral portion of the substrate tilted at the tilted attitude to prevent the substrate from sliding off the substrate heating unit.

2. The substrate processing apparatus according to claim 1, wherein the attitude changing unit includes:

a support member including a horizontal support surface;

a plurality of rods that are vertically movable, disposed above the support surface of the support member and support pheripheral portions of the substrate heating unit thereon; and an actuator arranged to vertically move at least one of the plurality of rods so that the at least one rod is disposed at a height different from heights of remaining rods.

3. The substrate processing apparatus according to claim 1, further comprising a substrate holding unit including a support pin arranged to come into contact with the peripheral portion of the substrate to support the substrate, the substrate holding unit being arranged to receive the substrate on the substrate heating unit by the support pin and to put the substrate supported by the support pin on the substrate heating unit, wherein the support pin serves as the sliding preventing member.

4. The substrate processing apparatus according to claim 1, wherein the substrate heating unit includes:

a substrate opposing surface opposed to the lower surface of the substrate; and a plurality of embosses provided on the substrate opposing surface, wherein the plurality of embosses are in contact with the lower surface of the substrate to support the substrate thereon with the lower surface of the substrate and the substrate opposing surface being spaced and opposed to each other.

5. The substrate processing apparatus according to claim 4, wherein the plurality of embosses serve as the sliding preventing member.

6. The substrate processing apparatus according to claim 4, wherein the plurality of embosses are disposed in a manner distributed across the substrate opposing surface.

7. The substrate processing apparatus according to claim 4, wherein the plurality of embosses are disposed only in a peripheral portion of the substrate opposing surface.

8. The substrate processing apparatus according to claim 1, wherein the attitude changing unit is arranged to tilt the substrate and the substrate heating unit from the horizontal attitude to the tilted attitude, after a gaseous phase of the processing liquid is formed in a space over the upper surface of the substrate due to heating of the substrate by the substrate heating unit.

9. The substrate processing apparatus according to claim 1, wherein the substrate heating unit is a unit that forms a gaseous phase of the processing liquid in a space over the upper surface of the substrate by heating the liquid film of the processing liquid to evaporate the processing liquid, and the substrate processing apparatus further comprises a gas discharging unit arranged to discharge gas toward the upper surface of the substrate, with a gaseous phase of the processing liquid being formed between the liquid film of the processing liquid and the upper surface of the substrate, to form a dried region from which the processing liquid is removed in a region of the upper surface of the substrate.

10. The substrate processing apparatus according to claim 9, wherein a position to start supplying the gas from the gas discharging unit to the substrate is in a central portion of the upper surface of the substrate.

11. The substrate processing apparatus according to claim 9, wherein a position to start supplying the gas from the gas discharging unit to the substrate is in a peripheral portion of the upper surface of the substrate.

12. The substrate processing apparatus according to claim 9, wherein the gas discharging unit is arranged to discharge the gas toward an upper end portion of the upper surface of the substrate tilted by the attitude changing unit with a gaseous phase of the processing liquid being formed between the liquid film of the processing liquid and the upper surface of the substrate.

13. The substrate processing apparatus according to claim 9, wherein the gas discharged from the gas discharging unit has a temperature equal to or higher than a boiling point of the processing liquid.

14. The substrate processing apparatus according to claim 1, further comprising:

a substrate heating unit including a plurality of heaters arranged to heat an entire upper surface of the substrate, the substrate heating unit arranged to heat the substrate at a temperature equal to or higher than a boiling point of the processing liquid, with the entire upper surface of the substrate being covered with the liquid film of the processing liquid, to vaporize the processing liquid and form a gaseous phase of the processing liquid between the liquid film of the processing liquid and the upper surface of the substrate; and a controller arranged to control the substrate heating unit, wherein the controller is arranged to perform:

a uniform heating step of uniformly heating the substrate at a temperature equal to or higher than the boiling point of the processing liquid, with the entire upper surface of the substrate being covered with the liquid film of the processing liquid, to vaporize the processing liquid and form the gaseous phase between the liquid film of the processing liquid and the upper surface of the substrate; and a temperature difference generating step of, after the uniform heating step, forming a low-temperature region with a temperature equal to or higher than the boiling point of the processing liquid and a high-temperature region with a temperature higher than that of the low-temperature region in the upper surface of the substrate with the gaseous phase being formed between the liquid film of the processing liquid and the upper surface of the substrate.

15. The substrate processing apparatus according to claim 14, wherein the controller is arranged to form the high-temperature region in a central portion of the upper surface of the substrate in the temperature difference generating step.

16. The substrate processing apparatus according to claim 14, wherein the controller is arranged to form the high-temperature region in a peripheral portion of the upper surface of the substrate in the temperature difference generating step.

17. The substrate processing apparatus according to claim 14, wherein the controller is arranged to further perform a boundary moving step of, after the temperature difference generating step, moving a boundary between the low-temperature region and the high-temperature region toward the low-temperature region.

18. The substrate processing apparatus according to claim 14, further comprising a gas discharging unit arranged to discharge gas toward the high-temperature region with the gaseous phase being formed between the liquid film of the processing liquid and the upper surface of the substrate.

19. A substrate processing apparatus comprising:
a processing liquid supplying unit arranged to supply processing liquid onto an upper surface of a substrate to form a liquid film of the processing liquid;
a substrate heating unit arranged to heat the substrate from below the substrate to heat the liquid film on the substrate; and
an attitude changing unit arranged to cause the substrate and the substrate heating unit to undergo an attitude change between a horizontal attitude in which the upper surface of the substrate is horizontal so that the liquid film of the processing liquid is held on the substrate, and a tilted attitude in which the upper surface of the substrate is tilted so that the liquid film of the processing liquid heated by the substrate heating unit is removed from the substrate, while keeping constant a relative attitude between the substrate and the substrate heating unit, wherein
the substrate heating unit is a unit that forms a gaseous phase of the processing liquid in a space over the upper surface of the substrate by heating the liquid film of the processing liquid to evaporate the processing liquid,
the substrate processing apparatus further comprises a guiding member including an outward guiding surface arranged to come into contact with a peripheral portion of the liquid film of the processing liquid on the substrate with a gaseous phase of the processing liquid existing between the liquid film of the processing liquid and the upper surface of the substrate, the guiding member arranged to guide the processing liquid from the upper surface of the substrate to around the substrate through contact between the outward guiding surface and the liquid film of the processing liquid,
the substrate processing apparatus further comprises a substrate holding unit arranged to hold the substrate horizontally,
the substrate holding unit includes a movable pin including a movable gripping portion to be pressed against a peripheral portion of the substrate and a chuck opening/closing unit arranged to move the movable pin between a closed position at which the movable gripping portion is pressed against the peripheral portion of the substrate and an open position at which the movable gripping portion is set away from the peripheral portion of the substrate, and
the substrate processing apparatus further comprises a controller arranged to control the chuck opening/closing unit and the substrate heating unit such that a gaseous phase of the processing liquid is formed between the liquid film of the processing liquid and the upper surface of the substrate with the movable pin being at the open position.

20. The substrate processing apparatus according to claim 19, wherein the guiding member includes a plurality of the outward guiding surfaces arranged in an equally spaced manner in a circumferential direction of the substrate.

21. The substrate processing apparatus according to claim 19, wherein the outward guiding surface is annular or arc-shape extending along a peripheral portion of the substrate.

22. The substrate processing apparatus according to claim 21, wherein the outward guiding surface is annular continuing over an entire circumference of the substrate.

23. The substrate processing apparatus according to claim 19, further comprising an opposing member including an opposing surface opposed to the upper surface of the substrate, wherein
the guiding member protrudes downward from the opposing surface.

24. The substrate processing apparatus according to claim 19, wherein
the guiding member is provided on the movable pin, and wherein
the chuck opening/closing unit is arranged to move the movable pin between a closed position at which the movable gripping portion is pressed against the peripheral portion of the substrate and the outward guiding surface is set away from the liquid film of the processing liquid on the substrate and an open position at which the movable gripping portion is set away from the peripheral portion of the substrate and the outward guiding surface is in contact with the liquid film of the processing liquid on the substrate.

25. The substrate processing apparatus according to claim 19, wherein
the outward guiding surface is provided on the movable gripping portion, and wherein
the chuck opening/closing unit is arranged to move the movable pin between a closed position at which the movable gripping portion is pressed against the peripheral portion of the substrate and the outward guiding surface is in contact with the liquid film of the processing liquid on the substrate and an open position at which the movable gripping portion is set away from the peripheral portion of the substrate and the outward guiding surface is set away from the liquid film of the processing liquid on the substrate.

26. The substrate processing apparatus according to claim 19, further comprising a gas discharging unit arranged to discharge gas toward the upper surface of the substrate, with a gaseous phase of the processing liquid being formed between the liquid film of the processing liquid and the upper surface of the substrate, to form a dried region from which the processing liquid is removed in a region of the upper surface of the substrate, wherein
the gas discharging unit is arranged to form a flow of gas flowing toward the guiding member along the upper surface of the substrate held on the substrate holding unit.

27. The substrate processing apparatus according to claim 19, further comprising a liquid residue preventing unit arranged to discharge gas toward the guiding member.

28. The substrate processing apparatus according to claim 1, wherein the processing liquid to be supplied by the processing liquid supplying unit onto the substrate has a surface tension lower than that of water and a boiling point lower than that of water.

29. The substrate processing apparatus according to claim 1, further comprising a substrate holding unit arranged to hold the substrate horizontally, an openable/closable inner chamber to house the substrate holding unit therein, and an outer chamber to house the inner chamber therein.

30. The substrate processing apparatus according to claim 29, further comprising an inert gas supplying unit arranged to supply inert gas into the inner chamber.

* * * * *